United States Patent
Kang et al.

(10) Patent No.: US 12,453,125 B2
(45) Date of Patent: Oct. 21, 2025

(54) SEMICONDUCTOR DEVICE

(71) Applicant: SAMSUNG ELECTRONICS CO., LTD., Suwon-si (KR)

(72) Inventors: Myung Gil Kang, Suwon-si (KR); Keun Hwi Cho, Seoul (KR); Sangdeok Kwon, Seoul (KR); Dongwon Kim, Seongnam-si (KR); Hyun-Seung Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 789 days.

(21) Appl. No.: 17/457,661

(22) Filed: Dec. 5, 2021

(65) Prior Publication Data

US 2022/0199798 A1  Jun. 23, 2022

(30) Foreign Application Priority Data

Dec. 21, 2020  (KR) .................. 10-2020-0179249

(51) Int. Cl.
*H01L 23/522* (2006.01)
*H10D 30/67* (2025.01)
*H10D 84/83* (2025.01)

(52) U.S. Cl.
CPC ..... *H10D 30/6735* (2025.01); *H01L 23/5226* (2013.01); *H10D 30/6757* (2025.01); *H10D 84/83* (2025.01)

(58) Field of Classification Search
CPC ......... H01L 29/42392; H01L 29/78696; H01L 29/775; H01L 29/0673; H01L 29/66439;

(Continued)

(56) References Cited

U.S. PATENT DOCUMENTS 8,323,078 B2   12/2012  Marble et al.
10,079,267 B1*  9/2018  Yeh ............... H10N 70/011
(Continued)

FOREIGN PATENT DOCUMENTS

KR  10-2019-0024625 A   3/2019
TW     202029461 A       8/2020
TW     202032793 A       9/2020

OTHER PUBLICATIONS

Search Report dated Dec. 17, 2024, in corresponding Taiwanese Patent Application 110129018, 2 pages/.

*Primary Examiner* — Teresa M. Arroyo
(74) *Attorney, Agent, or Firm* — Morgan, Lewis & Bockius LLP

(57) ABSTRACT

A semiconductor device includes a substrate that includes a peripheral region, a first active pattern on the peripheral region, a first source/drain pattern on the first active pattern, a first channel pattern formed on the first active pattern and connected to the first source/drain pattern, wherein the first channel pattern includes semiconductor patterns that are stacked and spaced apart from each other, a first gate electrode that extends in a first direction and crosses the first channel pattern, a gate insulating layer interposed between the first gate electrode and the first channel pattern, a first gate contact disposed on the first gate electrode and that extends in the first direction, and a first dielectric layer interposed between the first gate electrode and the first gate contact. The first dielectric layer is interposed between the first gate contact and the first gate electrode and extends in the first direction.

20 Claims, 53 Drawing Sheets

(58) Field of Classification Search
CPC . H01L 23/5226; H01L 23/481; H01L 27/088; H01L 27/092; H01L 21/823475; H01L 21/823864; H01L 21/823412; H01L 21/823425; H01L 21/823437; H01L 21/823462; B82Y 10/00

See application file for complete search history.

(56) References Cited

U.S. PATENT DOCUMENTS

| | | | |
|---|---|---|---|
| 10,177,227 B1* | 1/2019 | Yoshida | H01L 21/67742 |
| 10,297,508 B2 | 5/2019 | Cheng et al. | |
| 10,403,738 B1* | 9/2019 | Sung | H10D 30/6741 |
| 10,448,659 B2 | 10/2019 | Bentley et al. | |
| 10,515,859 B2 | 12/2019 | Doris et al. | |
| 10,600,892 B2 | 3/2020 | Ando et al. | |
| 10,622,051 B2 | 4/2020 | Muller et al. | |
| 10,741,678 B2 | 8/2020 | Lu et al. | |
| 11,031,397 B2 | 6/2021 | Liaw | |
| 11,411,090 B2 | 8/2022 | Liaw | |
| 2010/0327396 A1 | 12/2010 | Park et al. | |
| 2014/0264531 A1* | 9/2014 | Goyo | H01L 29/66825 |
| | | | 257/316 |
| 2016/0005749 A1 | 1/2016 | Li et al. | |
| 2018/0301559 A1* | 10/2018 | Liaw | H01L 29/66795 |
| 2019/0067122 A1 | 2/2019 | Cheng et al. | |
| 2019/0385917 A1* | 12/2019 | Lee | H01L 21/823878 |
| 2020/0006131 A1* | 1/2020 | Shimabukuro | H01L 21/76814 |
| 2020/0013871 A1 | 1/2020 | An et al. | |
| 2020/0044091 A1 | 2/2020 | Tsai et al. | |
| 2020/0357739 A1 | 11/2020 | Liaw | |
| 2021/0074697 A1* | 3/2021 | Baek | H01L 29/0649 |
| 2021/0126102 A1* | 4/2021 | Nakjin | H01L 29/42376 |
| 2021/0249517 A1* | 8/2021 | Cheng | H01L 21/28061 |
| 2022/0045051 A1* | 2/2022 | You | H01L 21/823437 |

* cited by examiner

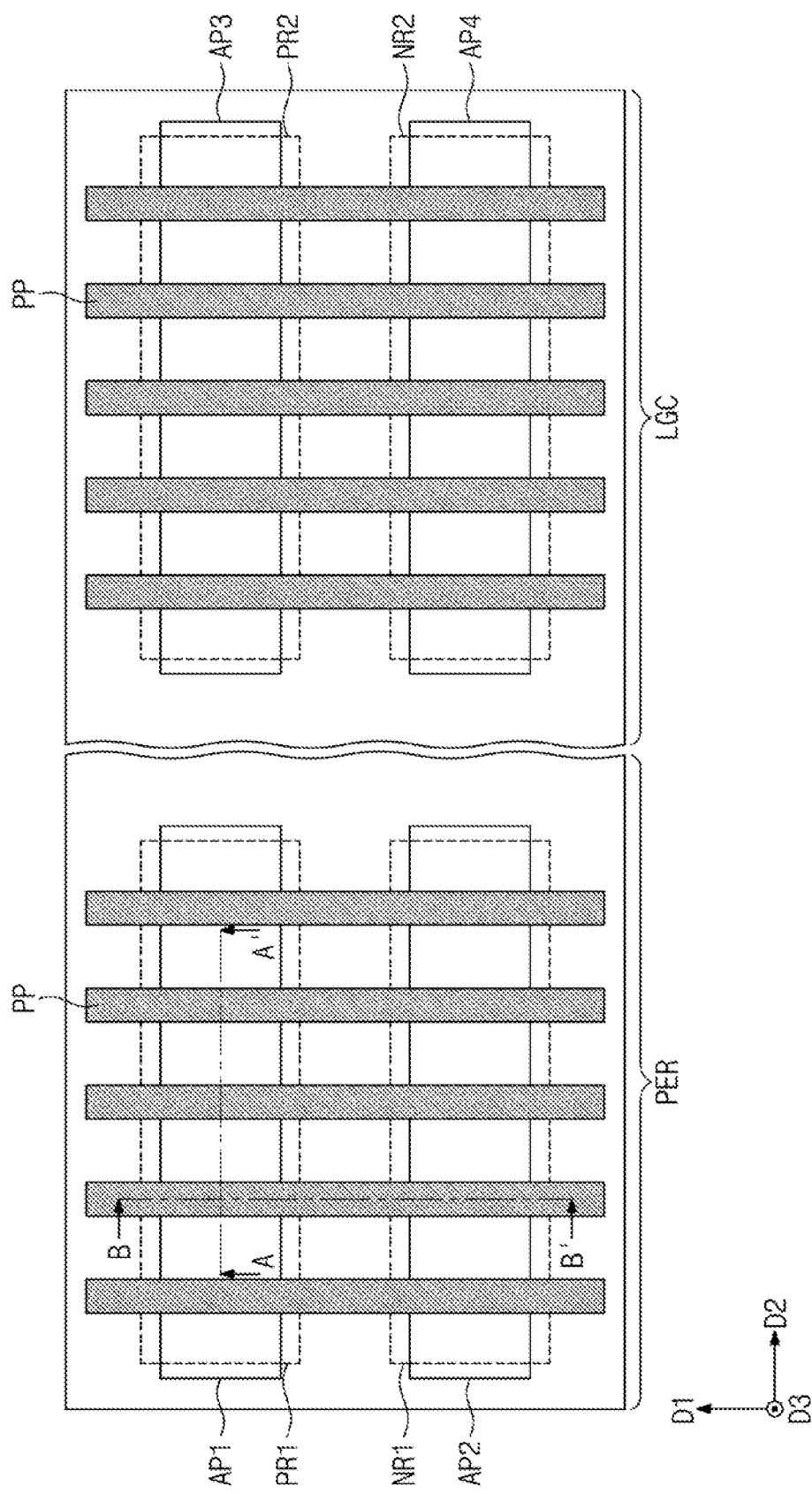

SEMICONDUCTOR DEVICE

CROSS-REFERENCE TO RELATED APPLICATIONS

This U.S. non-provisional patent application claims priority under 35 U.S.C. § 119 from Korean Patent Application No. 10-2020-0179249, filed on Dec. 21, 2020 in the Korean Intellectual Property Office, the contents of which are herein incorporated by reference in their entirety.

BACKGROUND

Technical Field

Embodiments of the present disclosure are directed to a semiconductor device, and in particular, to a semiconductor device that includes a field effect transistor.

Discussion of the Related Art

A semiconductor device includes an integrated circuit that is made of metal-oxide-semiconductor field-effect transistors (MOS-FETs). To meet an increasing demand for a semiconductor device with a small pattern size and a reduced design rule, MOS-FETs are being aggressively scaled down. The scale-down of the MOS-FETs can cause deterioration in operational properties of a semiconductor device.

SUMMARY

An embodiment of the inventive concept provides a semiconductor device with improved electric and reliability characteristics.

According to an embodiment of the inventive concept, a semiconductor device includes a substrate that includes a peripheral region, a first active pattern disposed on the peripheral region, a first source/drain pattern disposed on the first active pattern, a first channel pattern formed on the first active pattern and connected to the first source/drain pattern, where the first channel pattern includes semiconductor patterns that are stacked and spaced apart from each other, a first gate electrode that extends in a first direction and crosses the first channel pattern, a gate insulating layer interposed between the first gate electrode and the first channel pattern, a first gate contact disposed on the first gate electrode and that extends in the first direction, and a first dielectric layer interposed between the first gate electrode and the first gate contact. The first dielectric layer is interposed between a bottom surface of the first gate contact and a top surface of the first gate electrode and extends in the first direction.

According to an embodiment of the inventive concept, a semiconductor device includes a substrate that includes a peripheral region and a logic cell region, a first active pattern and a second active pattern disposed on the peripheral region and the logic cell region, respectively, a first source/drain pattern and a second source/drain pattern disposed on the first and second active patterns, respectively, a first channel pattern and a second channel pattern formed on the first and second active patterns, respectively, and that are connected to the first and second source/drain patterns, respectively, where each of the first and second channel patterns includes semiconductor patterns that are stacked and spaced apart from each other, a first gate electrode and a second gate electrode that extend in a first direction and cross the first and second channel patterns, respectively, a first gate contact disposed on the first gate electrode, and a second gate contact electrically connected to the second gate electrode, and a dielectric layer between the first gate contact and the first gate electrode. A width of the first gate contact in the first direction is greater than a width of the first channel pattern in the first direction.

According to an embodiment of the inventive concept, a semiconductor device includes a substrate that includes a peripheral region and a logic cell region, a first active pattern and a second active pattern disposed on the peripheral region, are spaced apart from each other in a first direction, and are extended in a second direction crossing the first direction, a device isolation layer disposed on the substrate and that separates the first and second active patterns, a first source/drain pattern and a second source/drain pattern disposed on the first and second active patterns, respectively, a first channel pattern and a second channel pattern that are formed on the first and second active patterns, respectively, and that are connected to the first and second source/drain patterns, respectively, each of the first and second channel patterns including semiconductor patterns, which are stacked to be spaced apart from each other, the semiconductor patterns including a first semiconductor pattern at its lowermost level, a second semiconductor pattern on the first semiconductor pattern, and a third semiconductor pattern on the second semiconductor pattern, a first gate electrode that extends in a first direction and crosses the first and second channel patterns and extending in the first direction, the first gate electrode including a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern, a first gate insulating layer interposed between the first gate electrode and the first channel pattern and between the first gate electrode and the second channel pattern, the first gate insulating layer including a high-k dielectric layer and an insulating layer on the high-k dielectric layer, a pair of gate spacers provided at both sides of the first gate electrode, respectively, a gate capping pattern disposed on the first gate electrode, a first interlayer insulating layer disposed on the gate capping pattern, an active contact that penetrates the first interlayer insulating layer and electrically connected to at least one of the first and second source/drain patterns, a first gate contact disposed on the first gate electrode and that penetrates the first interlayer insulating layer and the gate capping pattern, a first dielectric layer interposed between the first gate contact and the first gate electrode, a second interlayer insulating layer disposed on the first interlayer insulating layer, and a first metal layer formed in the second interlayer insulating layer and on the first gate contact and electrically connected to the active contact. The first gate contact may extends in the first direction. The first dielectric layer may be disposed between a bottom surface of the first gate contact and a top surface of the first gate electrode and extends in the first direction.

BRIEF DESCRIPTION OF THE DRAWINGS

FIGS. 3, 5, 7, 9, 11, and 13 are plan views that illustrate a method of fabricating a semiconductor device, according to an embodiment of the inventive concept.

DETAILED DESCRIPTION

Figure 1:
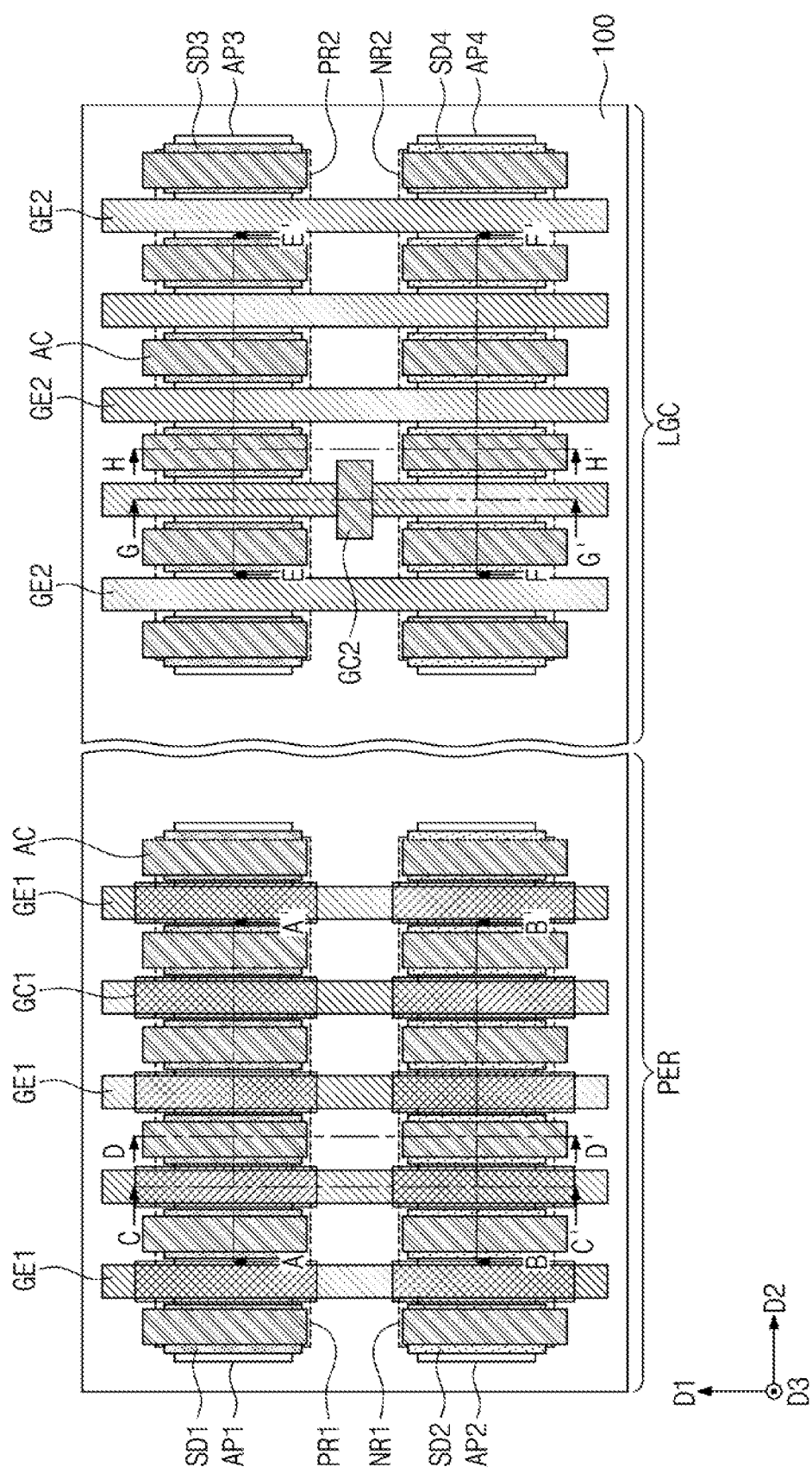
FIG. 1 is a plan view of a semiconductor device according to an embodiment of the inventive concept.
Figure 2A:
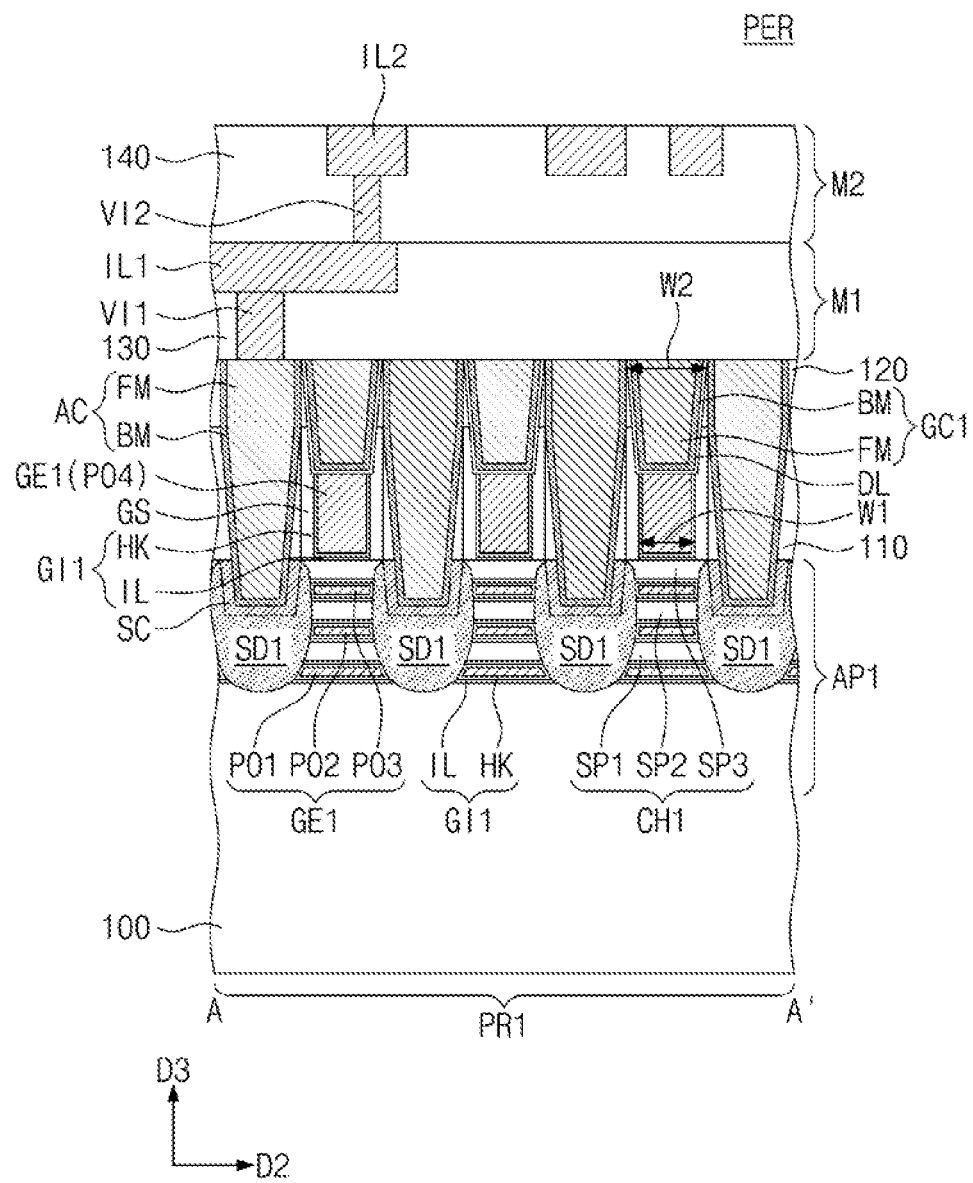
FIGS. 2A to 2H are sectional views taken along lines A-A', B-B', C-C', D-D', E-E', F-F', G-G', and H-H' of FIG. 1, respectively.
Figure 2B:
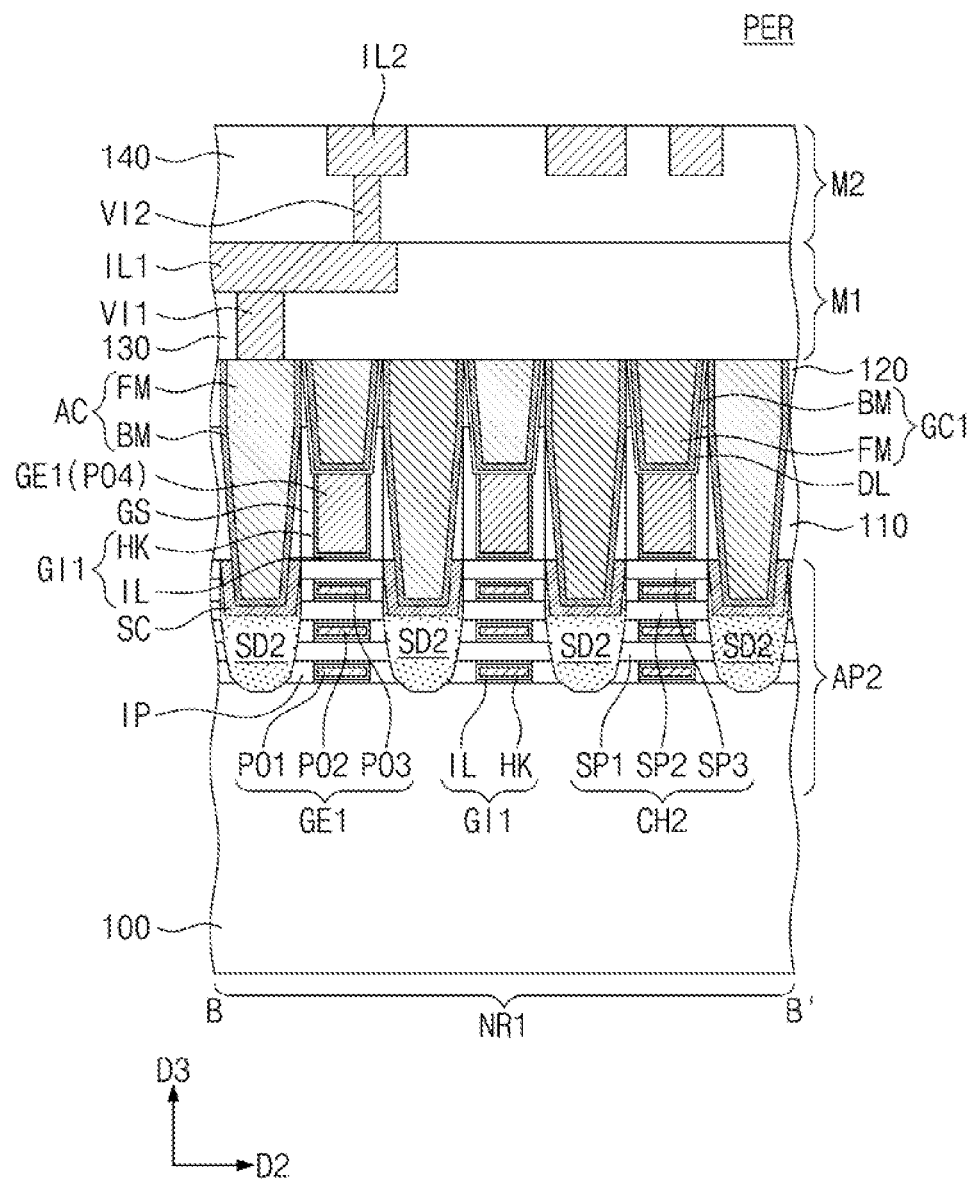
Figure 2C:
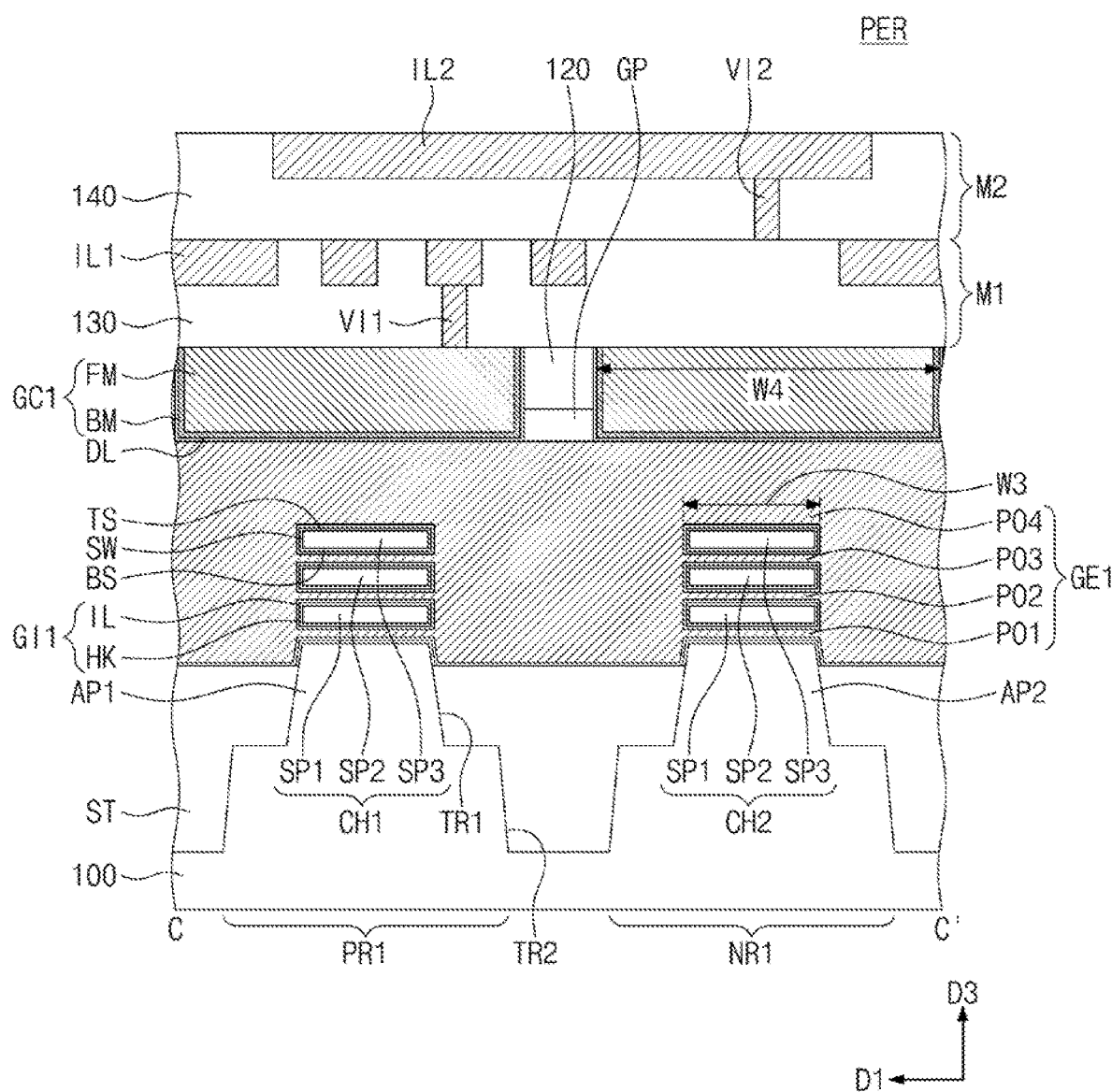
Figure 2D:
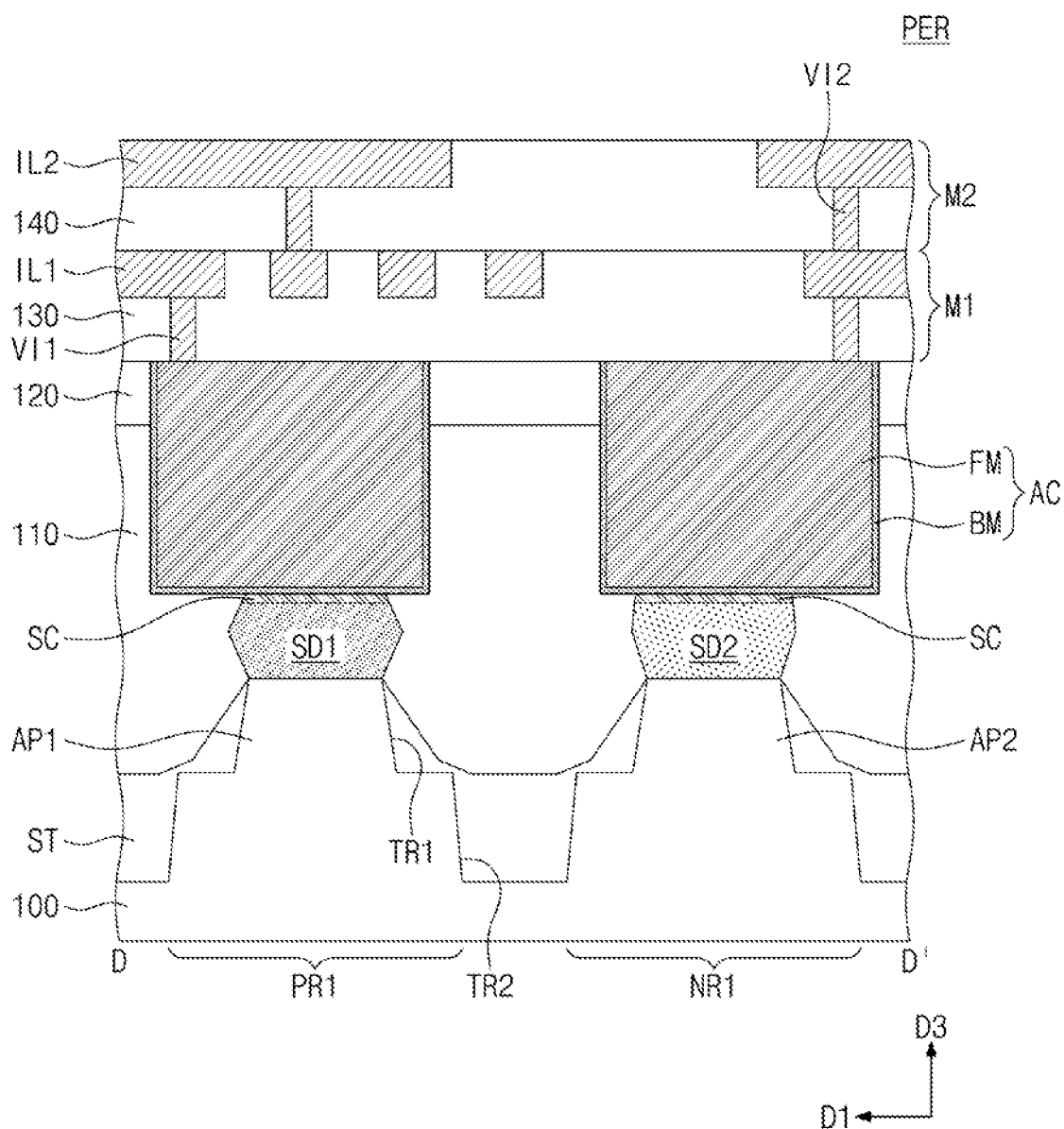
Figure 2E:
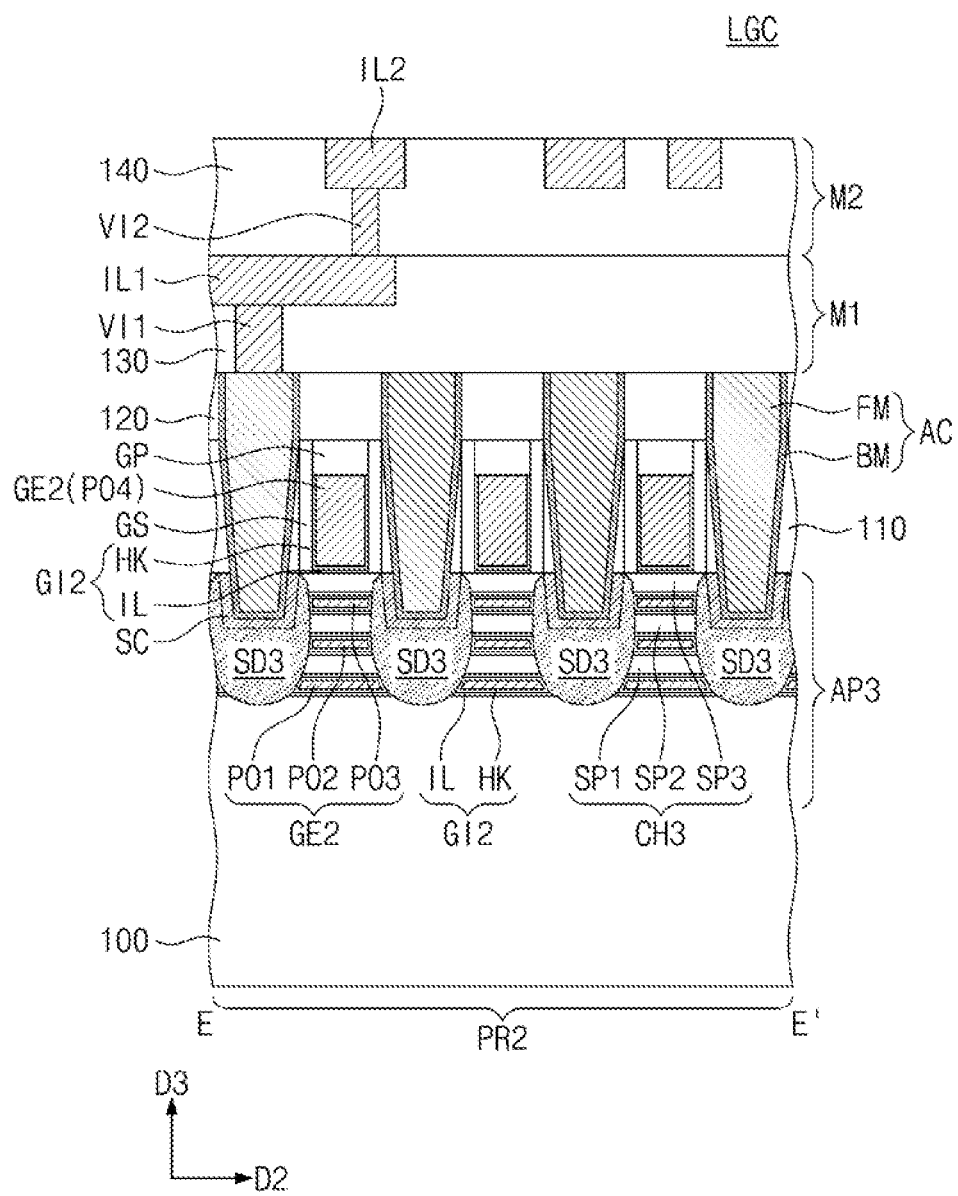
Figure 2F:
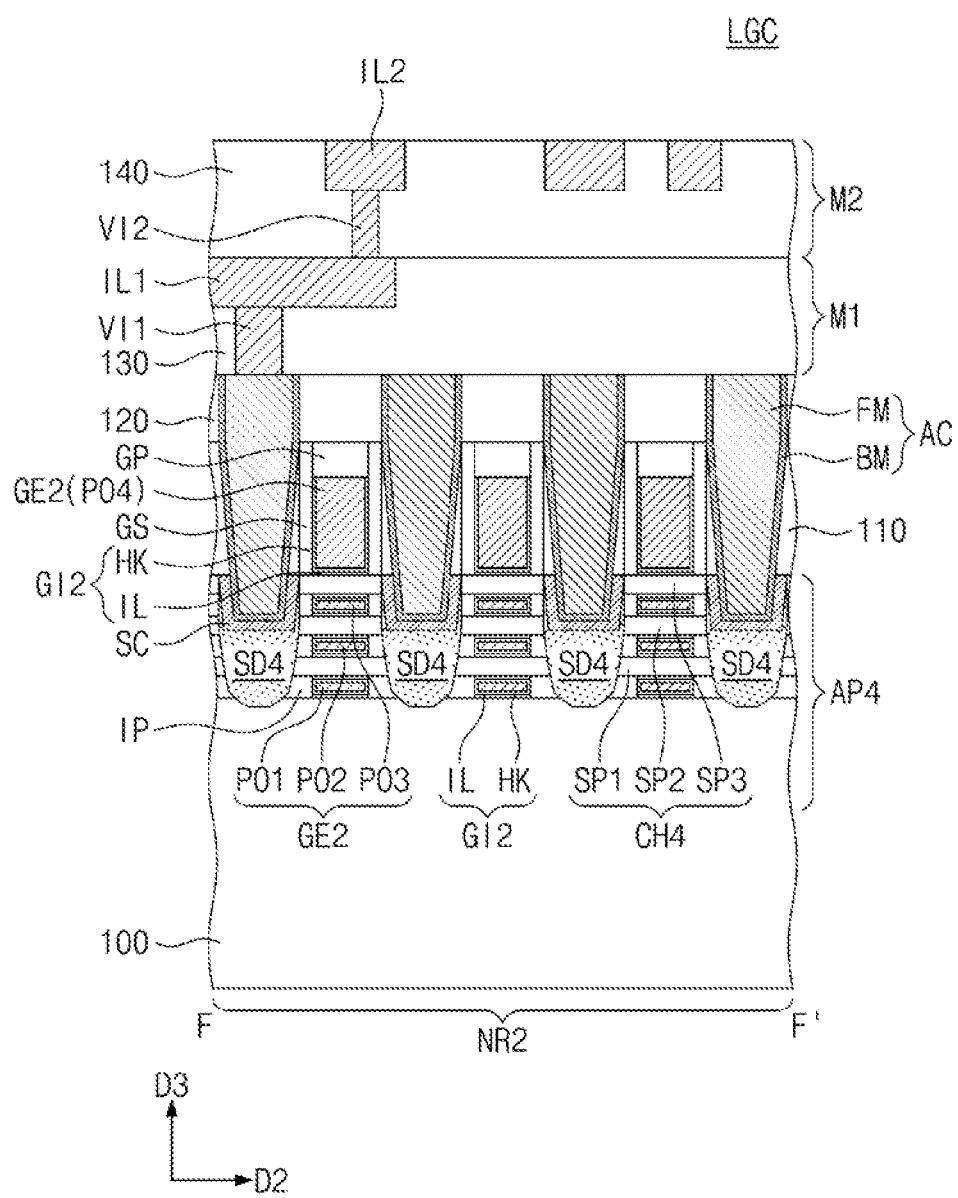
Figure 2G:
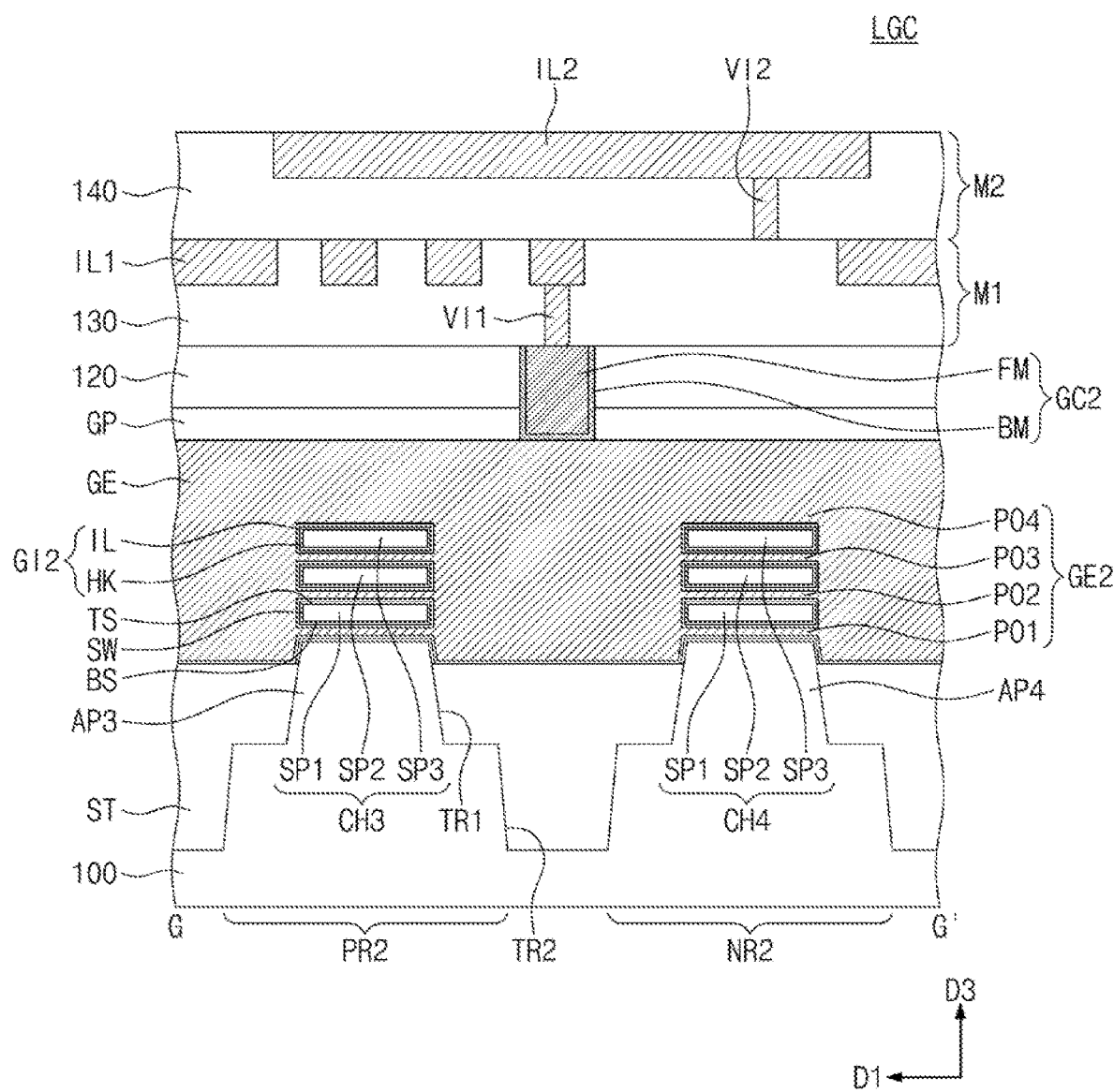
Figure 2H:
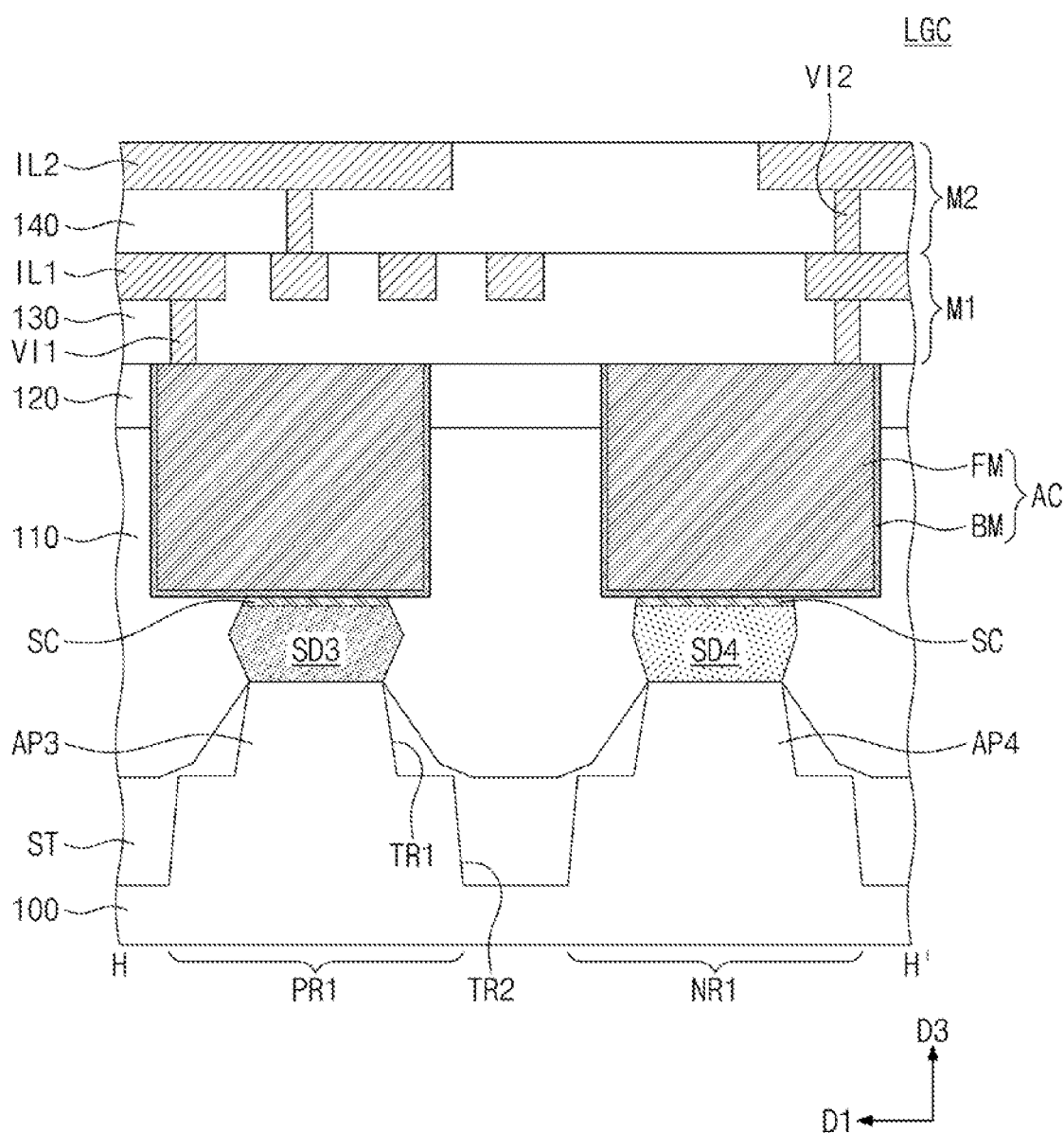
Figure 3:
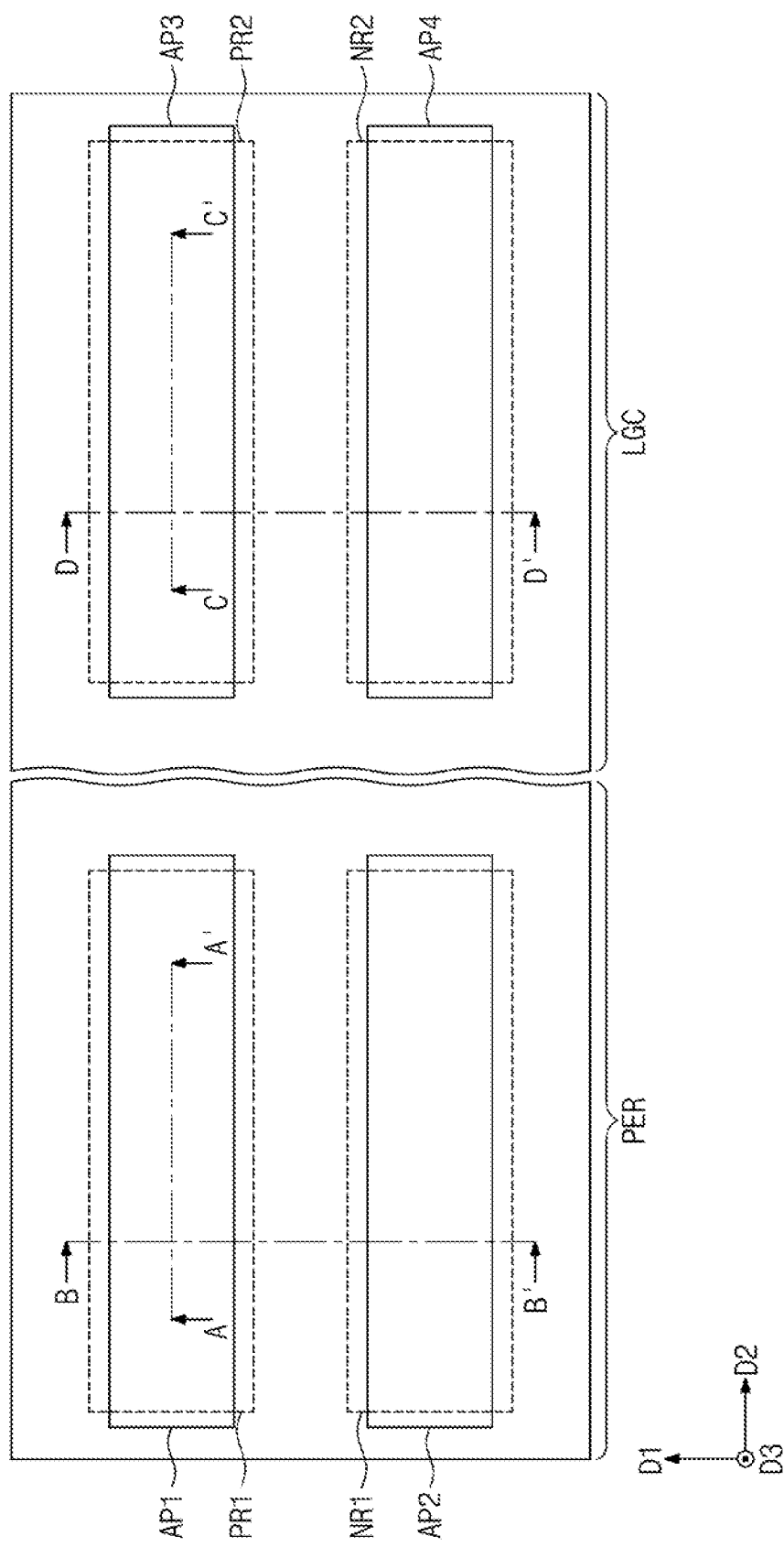
Figure 4A:
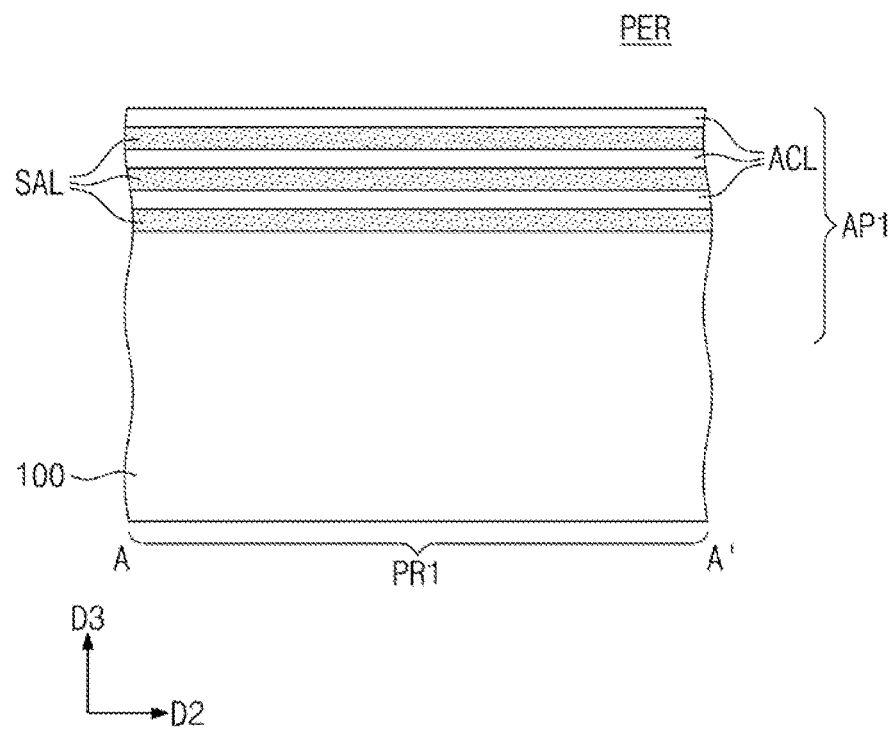
FIGS. 4A, 6A, 8A, 10A, 12A, and 14A are sectional views taken along lines A-A' of FIGS. 3, 5, 7, 9, 11, and 13, respectively.
Figure 4B:
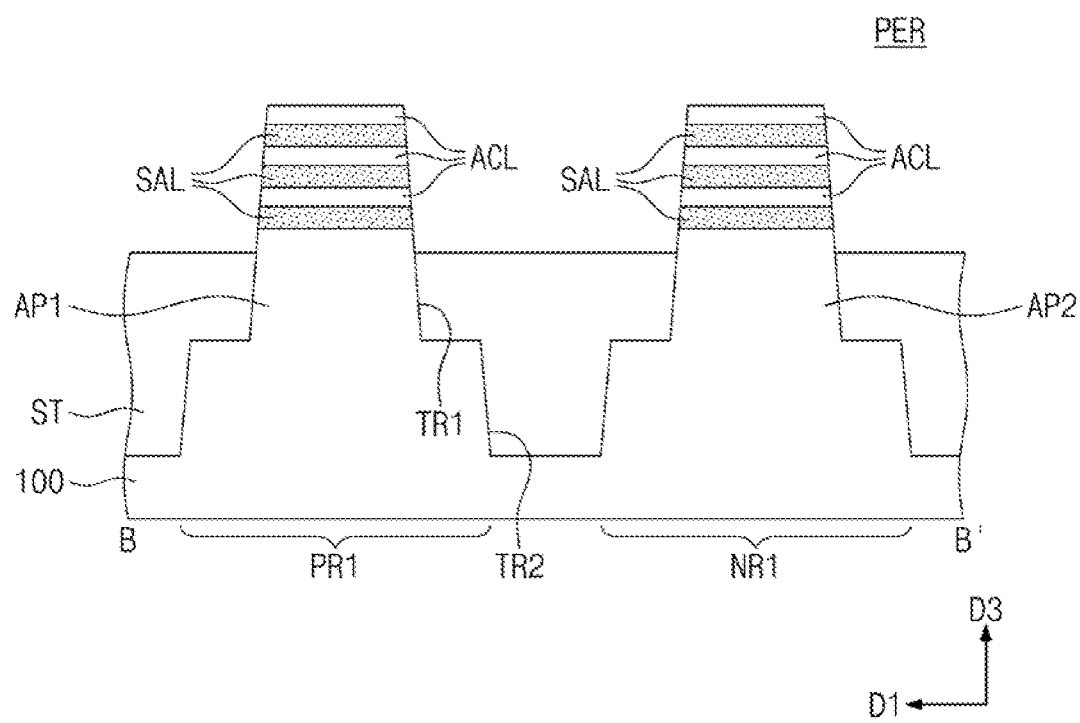
FIGS. 4B, 6B, 8B, 10B, 12B, and 14B are sectional views taken along lines B-B' of FIGS. 3, 5, 7, 9, 11, and 13, respectively.
Figure 4C:
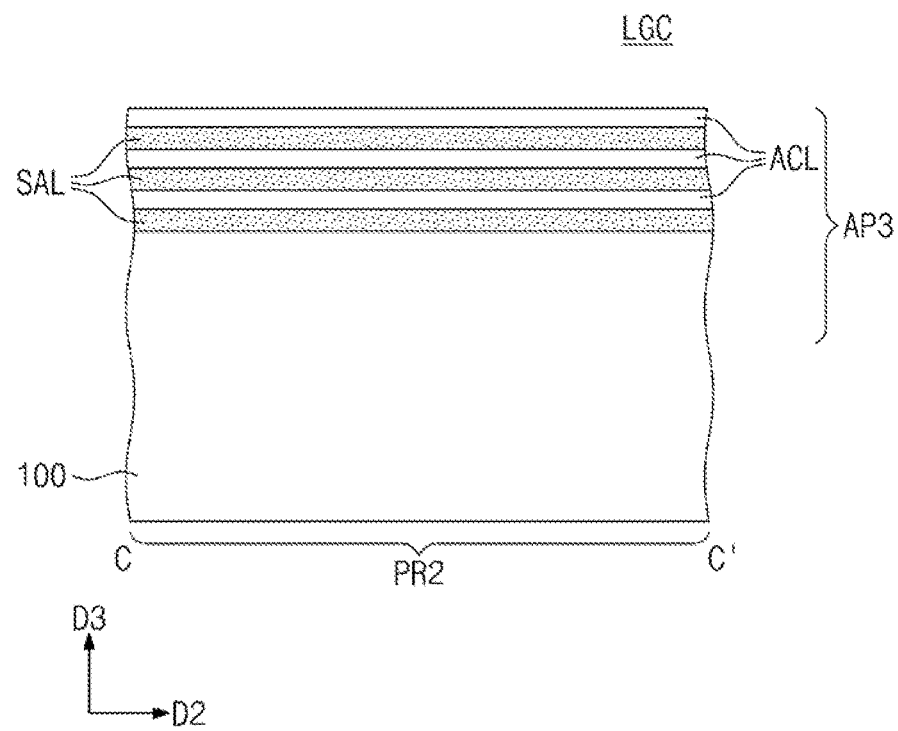
FIGS. 4C, 8C, 10C, 12C, and 14C are sectional views taken along lines C-C' of FIGS. 3, 7, 9, 11, and 13, respectively.
Figure 4D:
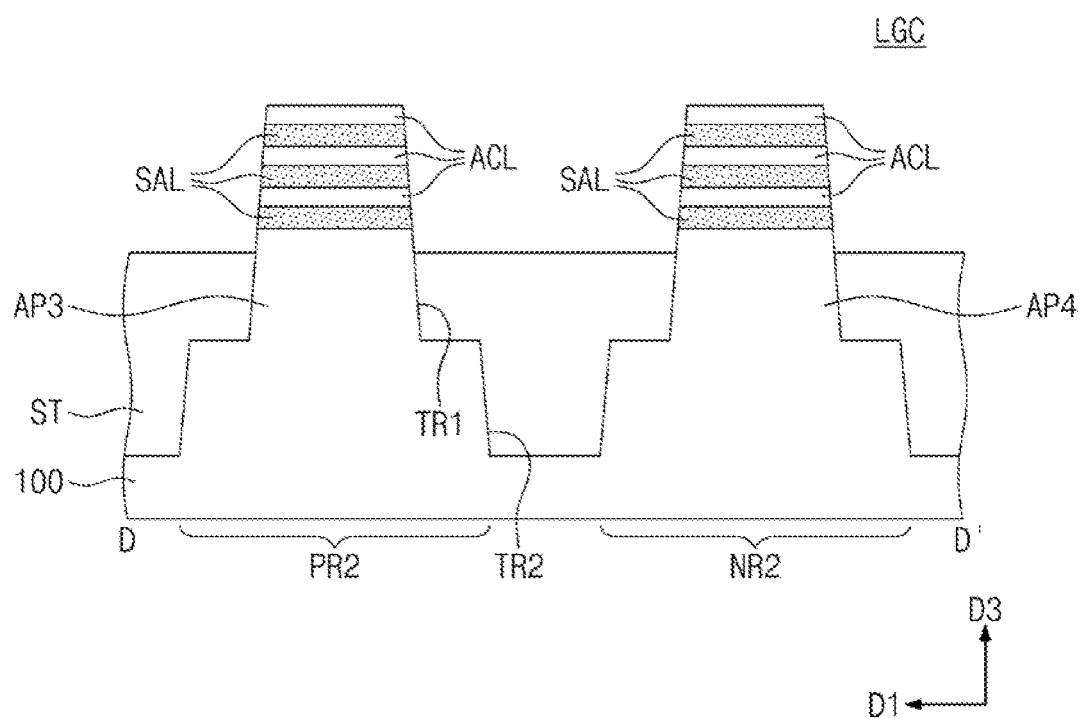
FIGS. 4D, 8D, 10D, 12D, and 14D are sectional views taken along lines D-D' of FIGS. 3, 7, 9, 11, and 13, respectively.

FIG. 1 is a plan view of a semiconductor device according to an embodiment of the inventive concept. FIGS. 2A to 2H are sectional views taken along lines A-A', B-B', C-C', D-D', E-E', F-F', G-G', and H-H' of FIG. 1, respectively.

Referring to FIG. 1, according to an embodiment, a substrate 100 is provided that includes a peripheral region PER and a logic cell region LGC. The substrate 100 is a semiconductor substrate that is formed of or includes silicon, germanium, silicon-germanium, or a compound semiconductor material, etc. In an embodiment, the substrate 100 is a silicon substrate. The peripheral region PER is where transistors that constitute a processor core or I/O terminals are disposed. The logic cell region LGC is where a standard cell that constitutes a logic circuit is disposed. The transistor in the peripheral region PER is operated under a high power condition, compared with the transistor in the logic cell region LGC. Hereinafter, the transistor in the peripheral region PER will be described in more detail with reference to FIGS. 1 and 2A to 2D.

In an embodiment, the peripheral region PER includes a first PMOSFET region PR1 and a first NMOSFET region NR1. The first PMOSFET region PR1 and the first NMOSFET region NR1 are separated by a second trench TR2 that is formed in an upper portion of the substrate 100. In other words, the second trench TR2 is located between the first PMOSFET region PR1 and the first NMOSFET region NR1.

The first PMOSFET region PR1 and the first NMOSFET region NR1 are spaced apart from each other in a first direction D1 with the second trench TR2 interposed therebetween.

In an embodiment, a first active pattern AP1 and a second active pattern AP2 are separated by a first trench TR1 that is formed in an upper portion of the substrate 100. The first active pattern AP1 and the second active pattern AP2 are formed on the first PMOSFET region PR1 and the first NMOSFET region NR1, respectively. The first trench TR1 is shallower than the second trench TR2. The first trench TR1 is formed above the second trench TR2, and is wider than the second trench TR2. The first and second active patterns AP1 and AP2 extend in a second direction D2 that crosses the first direction D1. The first and second active patterns AP1 and AP2 vertically protrude portions of the substrate 100.

In an embodiment, a device isolation layer ST fills the first and second trenches TR1 and TR2. The device isolation layer ST is formed of or includes silicon oxide. Upper portions of the first and second active patterns AP1 and AP2 vertically protrude above the device isolation layer ST (see, e.g., FIG. 2C). The device isolation layer ST does not cover the upper portions of the first and second active patterns AP1 and AP2. The device isolation layer ST may cover lower side surfaces of the first and second active patterns AP1 and AP2.

In an embodiment, the first active pattern AP1 includes a first channel pattern CH1 formed on an upper portion thereof. The second active pattern AP2 includes a second channel pattern CH2 formed on an upper portion thereof. Each of the first and second channel patterns CH1 and CH2 includes a first semiconductor pattern SP1, a second semiconductor pattern SP2, and a third semiconductor pattern SP3 that are sequentially stacked. The first to third semiconductor patterns SP1, SP2, and SP3 are spaced apart from each other in a vertical direction, i.e., a third direction D3, that is normal to a plane defined by the first direction D1 and the second direction D2.

In an embodiment, each of the first to third semiconductor patterns SP1, SP2, and SP3 is formed of or includes at least one of silicon (Si), germanium (Ge), or silicon-germanium (SiGe). In an embodiment, each of the first to third semiconductor patterns SP1, SP2, and SP3 is formed of or includes crystalline silicon.

In an embodiment, a pair of first source/drain patterns SD1 are disposed on the upper portion of the first active pattern AP1. The first source/drain patterns SD1 are first conductivity type (e.g., p-type) impurity regions. The first to third semiconductor patterns SP1, SP2, and SP3 of the first channel pattern CH1 are interposed between the pair of first source/drain patterns SD1. In other words, the first to third semiconductor patterns SP1, SP2, and SP3 of the first channel pattern CH1 connect the pair of first source/drain patterns SD1 to each other.

In an embodiment, a pair of second source/drain patterns SD2 are disposed in the upper portion of the second active pattern AP2. The second source/drain patterns SD2 are second conductivity type (e.g., n-type) impurity regions. The first to third semiconductor patterns SP1, SP2, and SP3 of the second channel pattern CH2 are interposed between the pair of second source/drain patterns SD2. In other words, the first to third semiconductor patterns SP1, SP2, and SP3 of the second channel pattern CH2 connect the pair of second source/drain patterns SD2 to each other.

In an embodiment, the first and second source/drain patterns SD1 and SD2 are epitaxial patterns that are formed by a selective epitaxial growth process. In an embodiment, each of the first and second source/drain patterns SD1 and SD2 has a top surface that is substantially coplanar with a top surface of the third semiconductor pattern SP3. In an embodiment, a top surface of at least one of the first and second source/drain patterns SD1 and SD2 is located higher than a top surface of the third semiconductor pattern SP3 adjacent thereto.

In an embodiment, the first source/drain patterns SD1 include a semiconductor material, e.g., SiGe, that has a lattice constant greater than that of the substrate 100. In this case, the first source/drain patterns SD1 exert a compressive stress on the first channel pattern CH1. The second source/drain patterns SD2 is formed of or includes the same semiconductor material, e.g., Si, as the substrate 100.

In an embodiment, a first gate electrode GE1 is disposed that extends in the first direction D1 and crosses the first and second active patterns AP1 and AP2. The first gate electrode GE1 extends from the first PMOSFET region PR1 to the first NMOSFET region NR1. The first gate electrode GE1 vertically overlaps the first and second channel patterns CH1 and CH2.

In an embodiment, the first gate electrode GE1 includes a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 disposed on the third semiconductor pattern SP3.

Referring back to FIG. 2C, in an embodiment, the first gate electrode GE1 surrounds a top surface TS, a bottom surface BS, and opposite side surfaces SW of each of the first to third semiconductor patterns SP1, SP2, and SP3. That is, a transistor in the peripheral region PER according to a present embodiment is a three-dimensional field effect transistor, such as a multi-bridge channel field effect transistor (MBCFET) or a Gate-All-Around FET (GAAFET)) in which a gate electrode three-dimensionally surrounds the channel pattern.

Referring back to FIGS. 1 and 2A to 2D, in an embodiment, a pair of gate spacers GS are disposed on opposite side surfaces of the first gate electrode GE1. The gate spacers GS extend along the first gate electrode GE1 or in the first direction D1. The gate spacers GS have top surfaces that are higher than the top surface of the first gate electrode GE1. The top surfaces of the gate spacers GS are coplanar with a top surface of a first interlayer insulating layer 110, which will be described below. The gate spacers GS are formed of or include at least one of SiCN, SiCON, or SiN. In an embodiment, the gate spacers GS have a multi-layered structure that includes at least two layers, each of which being made of SiCN, SiCON, or SiN.

In an embodiment, a gate capping pattern GP is disposed on the first gate electrode GE1. The gate capping pattern GP extends along the first gate electrode GE1 in the first direction D1. The gate capping pattern GP is formed of or includes a material that has an etch selectivity with respect to first and second interlayer insulating layers 110 and 120, which will be described below. For example, the gate capping patterns GP is formed of or includes at least one of SiON, SiCN, SiCON, or SiN.

In an embodiment, a first gate insulating layer GI1 is interposed between the first gate electrode GE1 and the first channel pattern CH1 and between the first gate electrode GE1 and the second channel pattern CH2. The first gate insulating layer GI1 directly surrounds the top surface TS, the bottom surface BS and the opposite side surfaces SW of each of the first to third semiconductor patterns SP1, SP2, and SP3 (see, e.g., FIG. 2C). The first gate insulating layer GI1 extends along a bottom surface of the first gate electrode GE1 thereon. The first gate insulating layer GI1 covers a top surface of the device isolation layer ST, which is located below the first gate electrode GE1.

In an embodiment, the first gate insulating layer GI1 includes a high-k dielectric layer HK that directly covers a top surface and opposite side surfaces of each of the first and second channel patterns CH1 and CH2. The first gate insulating layer GI1 further includes an insulating layer IL on the high-k dielectric layer HK. The first gate electrode GE1 and the first gate insulating layer GI1 fill spaces between the vertically adjacent first to third semiconductor patterns SP1, SP2, and SP3.

In an embodiment, the high-k dielectric layer HK is thicker than the insulating layer IL. The insulating layer IL includes a silicon oxide layer or a silicon oxynitride layer. The high-k dielectric layer HK is formed of or includes a high-k dielectric material whose dielectric constant is higher than that of silicon oxide. For example, the high-k dielectric material includes at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device includes a negative capacitance (NC) FET that uses a negative capacitor. For example, the first gate insulating layer GI1 includes a ferroelectric layer and a paraelectric layer.

In an embodiment, the ferroelectric layer has a negative capacitance, and the paraelectric layer has a positive capacitance. When two or more capacitors are connected in series and each capacitor has a positive capacitance, a total capacitance is less than a capacitance of each of the capacitors. By contrast, when at least one of the serially-connected capacitors has a negative capacitance, a total capacitance of the serially-connected capacitors is positive and may be greater than an absolute value of each capacitance.

In an embodiment, when a ferroelectric layer that has a negative capacitance and a paraelectric layer that has a positive capacitance are connected in series, a total capacitance of the serially-connected ferroelectric and paraelectric layers is increased. Due to the increase of the total capacitance, a transistor that includes a ferroelectric layer has a subthreshold swing (SS) that is less than 60 mV/decade at room temperature.

In an embodiment, the ferroelectric layer is formed of or includes at least one of, for example, hafnium oxide, hafnium zirconium oxide, barium strontium titanium oxide, barium titanium oxide, and/or lead zirconium titanium oxide. Here, the hafnium zirconium oxide is hafnium oxide that is doped with zirconium (Zr). Alternatively, the hafnium zirconium oxide is one of a compound composed of hafnium (Hf), zirconium (Zr), and/or oxygen (O).

In an embodiment, the ferroelectric layer further include dopants. For example, the dopants include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer varies depending on the ferroelectric material in the ferroelectric layer.

In an embodiment, when the ferroelectric layer includes hafnium oxide, the dopants in the ferroelectric layer include at least one of, for example, gadolinium (Gd), silicon (Si), zirconium (Zr), aluminum (Al), and/or yttrium (Y).

In an embodiment, when the dopants are aluminum (Al), a content of aluminum in the ferroelectric layer ranges from 3 to 8 at % (atomic percentage). Here, the content of the aluminum dopants is a ratio of the number of aluminum atoms to the total number of hafnium and aluminum atoms.

When the dopants are silicon (Si), a content of silicon in the ferroelectric layer ranges from 2 at % to 10 at %. When the dopants are yttrium (Y), a content of yttrium in the ferroelectric layer ranges from 2 at % to 10 at %. When the dopants are gadolinium (Gd), a content of gadolinium in the ferroelectric layer ranges from 1 at % to 7 at %. When the dopants are zirconium (Zr), a content of zirconium in the ferroelectric layer ranges from 50 at % to 80 at %.

In an embodiment, the paraelectric layer is formed of or includes at least one of, for example, silicon oxide and/or high-k metal oxides. The metal oxides that can be used as the paraelectric layer include at least one of, for example, hafnium oxide, zirconium oxide, and/or aluminum oxide, but embodiments of the inventive concept are not limited to these examples.

In an embodiment, the ferroelectric layer and the paraelectric layer include the same material. The ferroelectric layer is by definition ferroelectric, but the paraelectric layer is not ferroelectric. For example, when the ferroelectric and paraelectric layers each contain hafnium oxide, a crystal structure of the hafnium oxide in the ferroelectric layer differs from a crystal structure of the hafnium oxide in the paraelectric layer.

In an embodiment, the ferroelectric layer is ferroelectric only when its thickness is in a specific range. In an embodiment, the thickness of the ferroelectric layer ranges from 0.5 to 10 nm, but embodiments of the inventive concept are not limited to this range. Since a critical thickness associated with ferroelectricity varies depending on the kind of ferroelectric material, the thickness of the ferroelectric layer varies depending on the kind of the ferroelectric material.

For example, in an embodiment, the first gate insulating layer GI1 includes a single ferroelectric layer. For example, in an embodiment, the first gate insulating layer GI1 includes a plurality of ferroelectric layers spaced apart from each other. The first gate insulating layer GI1 has a multi-layered structure, in which a plurality of ferroelectric layers and a plurality of paraelectric layers are alternately stacked.

In an embodiment, the first gate electrode GE1 includes a first metal pattern and a second metal pattern on the first metal pattern. The first metal pattern is disposed on the first gate insulating layer GI1 adjacent to the first and second channel patterns CH1 and CH2. The first metal pattern includes a work function metal that can be used to adjust a threshold voltage of the transistor. By adjusting a thickness and composition of the first metal pattern, a transistor having a desired threshold voltage can be realized.

In an embodiment, the first metal pattern includes a metal nitride layer. For example, the first metal pattern includes at least one metal selected from titanium (Ti), tantalum (Ta), aluminum (Al), tungsten (W) and molybdenum (Mo), or nitrogen (N). In an embodiment, the first metal pattern further includes carbon (C). The first metal pattern may include a plurality of stacked work function metal layers.

In an embodiment, the second metal pattern includes a metal whose resistance is lower than that of the first metal pattern. For example, the second metal pattern includes at least one metal selected from tungsten (W), aluminum (Al), titanium (Ti), or tantalum (Ta).

Referring back to FIG. 2B, in an embodiment, inner spacers IP are disposed on the first NMOSFET region NR1. The inner spacers IP are respectively interposed between the first to third portions PO1, PO2, and PO3 of the first gate electrode GE1 and the second source/drain pattern SD2. The inner spacers IP directly contact the second source/drain pattern SD2. Each of the first to third portions PO1, PO2, and PO3 of the first gate electrode GE1 is spaced apart from the second source/drain pattern SD2 by the inner spacer IP.

In an embodiment, the inner spacer IP is formed of or includes at least one low-k dielectric material. The low-k dielectric material includes silicon oxide or a dielectric material whose dielectric constant is lower than that of silicon oxide. For example, the low-k dielectric material includes silicon oxide, fluorine- or carbon-doped silicon oxide, porous silicon oxide, or an organic polymeric dielectric material.

In an embodiment, a first interlayer insulating layer 110 is disposed on the substrate 100. The first interlayer insulating layer 110 covers the gate spacers GS and the first and second source/drain patterns SD1 and SD2. The first interlayer insulating layer 110 has a top surface that is substantially coplanar with the top surface of the gate capping pattern GP and the top surfaces of the gate spacers GS. A second interlayer insulating layer 120 that covers the gate capping pattern GP is disposed on the first interlayer insulating layer 110. In an embodiment, at least one of the first and second interlayer insulating layers 110 and 120 includes a silicon oxide layer.

In an embodiment, active contacts AC are provided that penetrate the first and second interlayer insulating layers 110 and 120 and are electrically connected to the first and second source/drain patterns SD1 and SD2, respectively. A pair of the active contacts AC are respectively provided at both sides of the first gate electrode GE1. When viewed in a plan view, the active contact AC has a bar-shaped pattern that extends in the first direction D1.

In an embodiment, the active contact AC includes a conductive pattern FM and a barrier pattern BM that surrounds the conductive pattern FM. The conductive pattern FM is formed of or includes at least one metal, such as aluminum, copper, tungsten, molybdenum, or cobalt. The barrier pattern BM covers side and bottom surfaces of the conductive pattern FM. In an embodiment, the barrier pattern BM includes a metal layer and a metal nitride layer. The metal layer is formed of or includes at least one of titanium, tantalum, tungsten, nickel, cobalt, or platinum. The metal nitride layer is formed of or includes at least one of titanium nitride (TiN), tantalum nitride (TaN), tungsten nitride (WN), nickel nitride (NiN), cobalt nitride (CoN), or platinum nitride (PtN).

In an embodiment, the active contact AC is a self-aligned contact. For example, the active contact AC is formed by a self-alignment process that uses the gate capping pattern GP and the gate spacer GS. For example, the active contact AC covers at least a portion of the side surface of the gate spacer GS. In addition, the active contact AC covers a portion of the top surface of the gate capping pattern GP.

In an embodiment, a silicide pattern SC is interposed between the active contact AC and the first source/drain pattern SD1 and between the active contact AC and the second source/drain pattern SD2. The active contact AC is electrically connected to the source/drain pattern SD1 or SD2 through the silicide pattern SC. The silicide pattern SC is formed of or includes at least one metal silicide material, such as titanium silicide, tantalum silicide, tungsten silicide, nickel silicide, or cobalt silicide.

In an embodiment, first gate contacts GC1 are disposed on the first gate electrode GE1 and penetrate the second interlayer insulating layer 120 and the gate capping pattern GP. The first gate contact GC1 includes the conductive pattern FM and the barrier pattern BM that encloses the conductive pattern FM, similar to the active contact AC. The first gate contact GC1 has a longitudinal axis parallel to the first direction D1. That is, the first gate contact GC1 extends along the first gate electrode GE1 and in the first direction D1. For example, the first gate contact GC1 may be disposed on the first PMOSFET region PR1 or the first NMOSFET region NR1. The first gate contact GC1 may vertically overlap the first channel pattern CH1 or the second channel pattern CH2.

In an embodiment, a dielectric layer DL is interposed between the first gate contact GC1 and the first gate electrode GE1. In detail, the dielectric layer DL is interposed between the first gate contact GC1 and the fourth portion PO4 of the first gate electrode GE1. The first gate contact GC1 is spaced apart from the first gate electrode GE1 by the dielectric layer DL. The dielectric layer DL is positioned between a bottom surface of the first gate contact GC1 and the top surface of the first gate electrode GE1 and extends in the first direction D1. For example, the dielectric layer DL covers the bottom and side surfaces of the first gate contact GC1. Specifically, the dielectric layer DL covers the bottom and side surfaces of the barrier pattern BM of the first gate contact GC1.

In an embodiment, the dielectric layer DL is formed of or includes a high-k dielectric material whose dielectric constant is higher than that of silicon oxide. For example, the dielectric layer DL is formed of or includes at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

For a three-dimensional field effect transistor, a thickness of a gate insulating layer might not be increased. According to an embodiment of the inventive concept, since the dielectric layer DL is provided between the first gate contact GC1 and the first gate electrode GE1, a voltage applied between the first gate electrode GE1 and the substrate 100 can be reduced. In other words, reliability issues with regard to a high-power transistor formed on the peripheral region PER can be prevented. As a result, electrical and reliability characteristics of a semiconductor device can be improved.

In an embodiment, let a first width W1 be the smallest width of the first gate electrode GE1 in the second direction D2, and let a second width W2 be the largest width of the dielectric layer DL in the second direction D2. For example, the second width W2 is greater than the first width W1.

In an embodiment, let a third width W3 be a width of the channel pattern CH1 and/or CH2 in the first direction D1, and let a fourth width W4 be a width of the first gate contact GC1 in the first direction D1. For example, the fourth width W4 is greater than the third width W3. In an embodiment, to reduce or maintain a voltage applied to a transistor, widths of the first gate contact GC1 and the dielectric layer DL can be adjusted in proportion to the width of the channel pattern.

A thickness of the dielectric layer DL can be adjusted to apply a voltage of a desired magnitude to the transistor.

In an embodiment, a third interlayer insulating layer 130 is disposed on the second interlayer insulating layer 120. A first metal layer M1 is formed in the third interlayer insulating layer 130. The first metal layer M1 includes first interconnection lines IL1 and first vias VI1. The first vias VI1 are formed below the first interconnection lines IL1. The first interconnection lines IL1 extend in the first direction D1. Each of the first interconnection lines IL1 has a line- or bar-shaped pattern that extends in the second direction D2.

In an embodiment, the first vias VI1 are formed below the first interconnection lines IL1 of the first metal layer M1. The first vias VI1 are interposed between the active contacts AC and the first interconnection lines IL1. The first vias VI1 are interposed between the first gate contacts GC1 and the first interconnection lines IL1.

In an embodiment, the first interconnection line IL1 and the first via VI1 thereunder are formed by separate processes. In other words, each of the first interconnection line IL1 and the first via VI1 is formed by a single damascene process. A semiconductor device according to a present embodiment can be fabricated using a sub-20 nm process.

In an embodiment, a fourth interlayer insulating layer 140 is disposed on the third interlayer insulating layer 130. A second metal layer M2 is formed in the fourth interlayer insulating layer 140. The second metal layer M2 includes second interconnection lines IL2. Each of the second interconnection lines IL2 is a line- or bar-shaped pattern that extends in the first direction D1. For example, the second interconnection lines IL2 extend in the first direction D1 parallel to each other.

In an embodiment, the second metal layer M2 further includes second vias VI2. The second vias VI2 are formed below the second interconnection lines IL2. The second vias VI2 are interposed between the first interconnection lines IL1 and the second interconnection lines IL2.

In an embodiment, the second interconnection line IL2 and the second via VI2 thereunder are formed by the same process, and, in this case, constitute a single object. For example, the second interconnection line IL2 and the second via VI2 of the second metal layer M2 are formed together by a dual damascene process.

In an embodiment, the first interconnection lines IL1 of the first metal layer M1 and the second interconnection lines IL2 of the second metal layer M2 may be formed of or include the same conductive material or different conductive materials. For example, the first interconnection lines IL1 and the second interconnection lines IL2 can be formed of or include at least one metal, such as copper (Cu), ruthenium (Ru), cobalt (Co), tungsten (W), aluminum (Al), and/or molybdenum (Mo).

In an embodiment, additional metal layers may be further stacked on the fourth interlayer insulating layer 140. Each of the stacked metal layers includes routing lines.

Hereinafter, a transistor in the logic cell region LGC will be described in more detail with reference to FIGS. 1 and 2E to 2H. Descriptions of features in the transistor in the peripheral region PER described with reference to FIGS. 1 and 2A to 2D may be omitted in the following description, for the sake of brevity.

In an embodiment, the logic cell region LGC includes a second PMOSFET region PR2 and a second NMOSFET region NR2. The second PMOSFET region PR2 and the second NMOSFET region NR2 are separated by a second trench TR2 that is formed in an upper portion of the substrate 100. A third active pattern AP3 and a fourth active pattern AP4 are separated by a first trench TR1 that is formed in an upper portion of the substrate 100. The third active pattern AP3 and the fourth active pattern AP4 are disposed on the second PMOSFET region PR2 and the second NMOSFET region NR2, respectively.

In an embodiment, the third active pattern AP3 includes a third channel pattern CH3 formed on its upper portion, and the fourth active pattern AP4 includes a fourth channel pattern CH4 formed on its upper portion. Each of the third and fourth channel patterns CH3 and CH4 includes the first to third semiconductor patterns SP1, SP2, and SP3 that are sequentially stacked.

In an embodiment, third source/drain patterns SD3 are disposed in an upper portion of the third active pattern AP3. Fourth source/drain patterns SD4 are disposed in an upper portion of the fourth active pattern AP4. The first to third semiconductor patterns SP1, SP2, and SP3 of the third channel pattern CH3 are interposed between a pair of the third source/drain patterns SD3. The first to third semiconductor patterns SP1, SP2, and SP3 of the fourth channel pattern CH4 are interposed between a pair of the fourth source/drain patterns SD4.

In an embodiment, each of the third source/drain patterns SD3 is an epitaxial pattern that includes first conductivity type (e.g., p-type) impurities. Each of the fourth source/drain patterns SD4 is an epitaxial pattern that includes second conductivity type (e.g., n-type) impurities.

In an embodiment, second gate electrodes GE2 are disposed that extend in the first direction D1 and cross the third and fourth channel patterns CH3 and CH4. The second gate electrode GE2 extend from the second PMOSFET region PR2 to the second NMOSFET region NR2. The second gate electrode GE2 vertically overlaps the third and fourth channel patterns CH3 and CH4. A pair of the gate spacers GS are disposed on opposite side surfaces of the second gate electrode GE2. The gate capping pattern GP is disposed on the second gate electrode GE2.

In an embodiment, the second gate electrode GE2 includes the first portion PO1 interposed between the substrate 100 and the first semiconductor pattern SP1, the second portion PO2 interposed between the first semiconductor pattern SP1 and the second semiconductor pattern SP2, the third portion PO3 interposed between the second semiconductor pattern SP2 and the third semiconductor pattern SP3, and the fourth portion PO4 disposed on the third semiconductor pattern SP3.

Referring back to FIG. 2G, in an embodiment, the second gate electrode GE2 surrounds the top surface TS, the bottom surface BS, and the opposite side surfaces SW of each of the first to third semiconductor patterns SP1, SP2, and SP3. That is, a transistor in the logic cell region LGC according to a present embodiment is a three-dimensional field effect transistor, such as an MBCFET or a GAAFET, in which a gate electrode three-dimensionally surrounds the channel pattern.

Referring back to FIGS. 1 and 2E to 2H, in an embodiment, a second gate insulating layer GI2 is interposed between the second gate electrode GE2 and the third channel pattern CH3 and between the second gate electrode GE2 and the fourth channel pattern CH4. The second gate insulating layer GI2 includes the high-k dielectric layer HK that directly covers a top surface and opposite side surfaces of each of the third and fourth channel patterns CH3 and CH4. The second gate insulating layer GI2 further includes the insulating layer IL disposed on the high-k dielectric layer HK. The second gate electrode GE2 and the second gate insulating layer GI2 fill spaces between the vertically adjacent first to third semiconductor patterns SP1, SP2, and SP3.

In an embodiment, the inner spacers IP are disposed on the second NMOSFET region NR2. The inner spacers IP are respectively interposed between the first to third portions PO1, PO2, and PO3 of the second gate electrode GE2 and the fourth source/drain pattern SD4. However, the inner spacers IP are omitted from the second PMOSFET region PR2.

In an embodiment, the first interlayer insulating layer 110 and the second interlayer insulating layer 120 are disposed on the substrate 100. The active contacts AC penetrate the first and second interlayer insulating layers 110 and 120 and are electrically connected to the third and fourth source/drain patterns SD3 and SD4, respectively.

In an embodiment, a second gate contact GC2 is provided that penetrates the second interlayer insulating layer 120 and the gate capping pattern GP and is electrically connected to the second gate electrode GE2. That is, the dielectric layer DL is omitted from the logic cell region LGC. The second gate contact GC2 is disposed on the device isolation layer ST between the second PMOSFET region PR2 and the second NMOSFET region NR2. When viewed in a plan view, the second gate contact GC2 is a bar-shaped pattern that extends in the second direction D2. The second gate contact GC2 includes the conductive pattern FM and the barrier pattern BM that encloses the conductive pattern FM, similar to the active contact AC.

In an embodiment, the first metal layer M1 and the second metal layer M2 are disposed on the second interlayer insulating layer 120. The active contact AC, the first metal layer M1, and the second metal layer M2 have substantially the same features as those described with reference to FIGS. 1 and 2A to 2D.

Figure 8A:
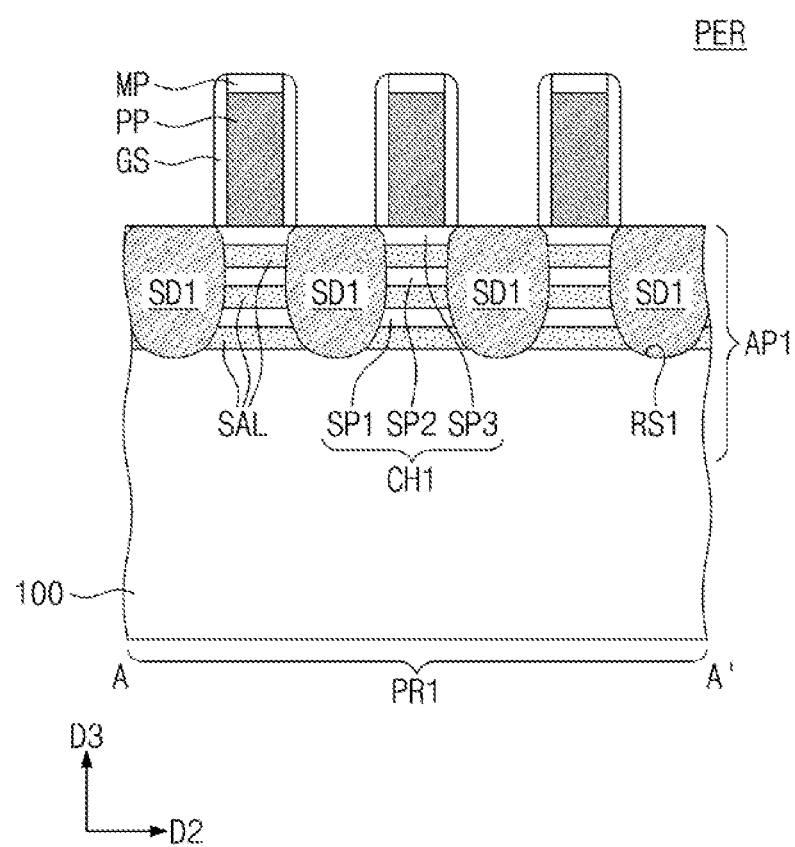
Figure 8B:
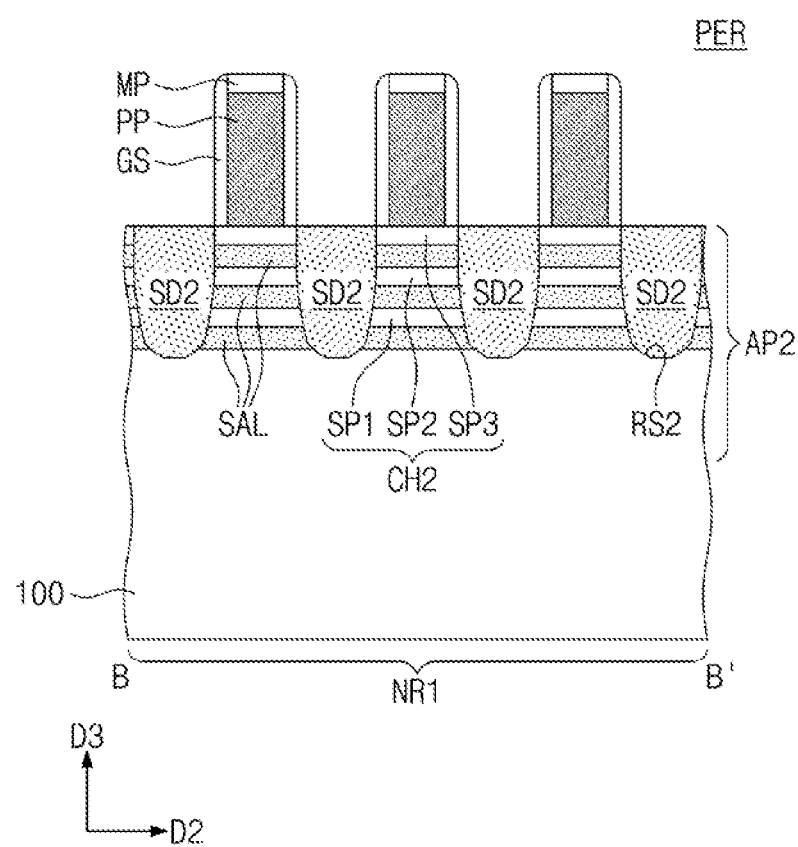
Figure 8C:
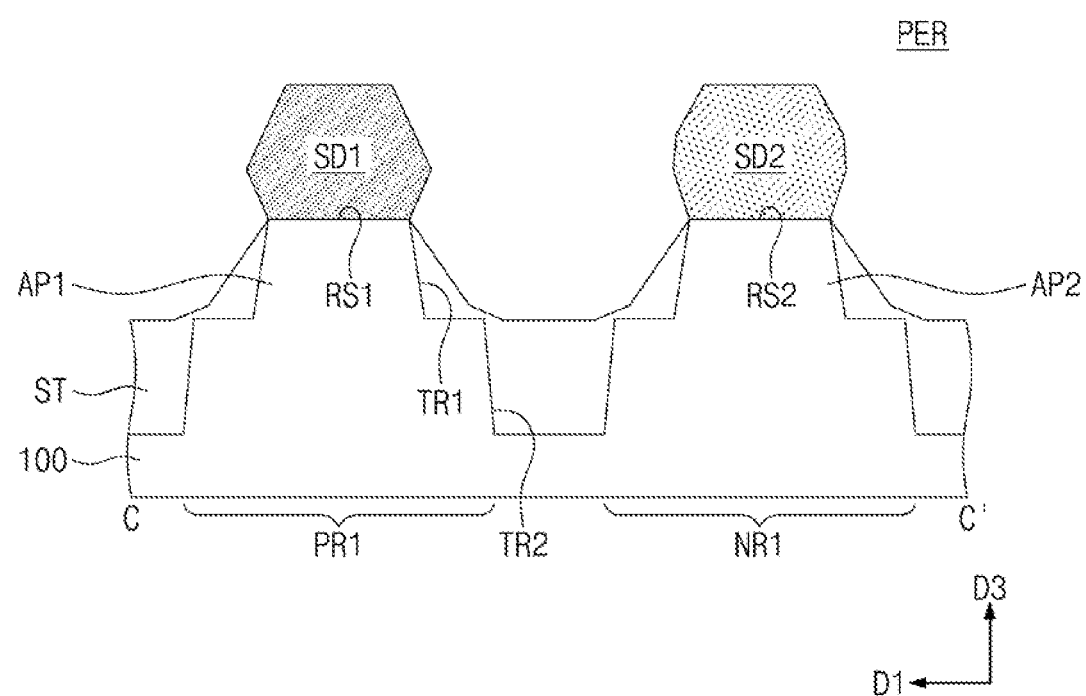
Figure 8D:
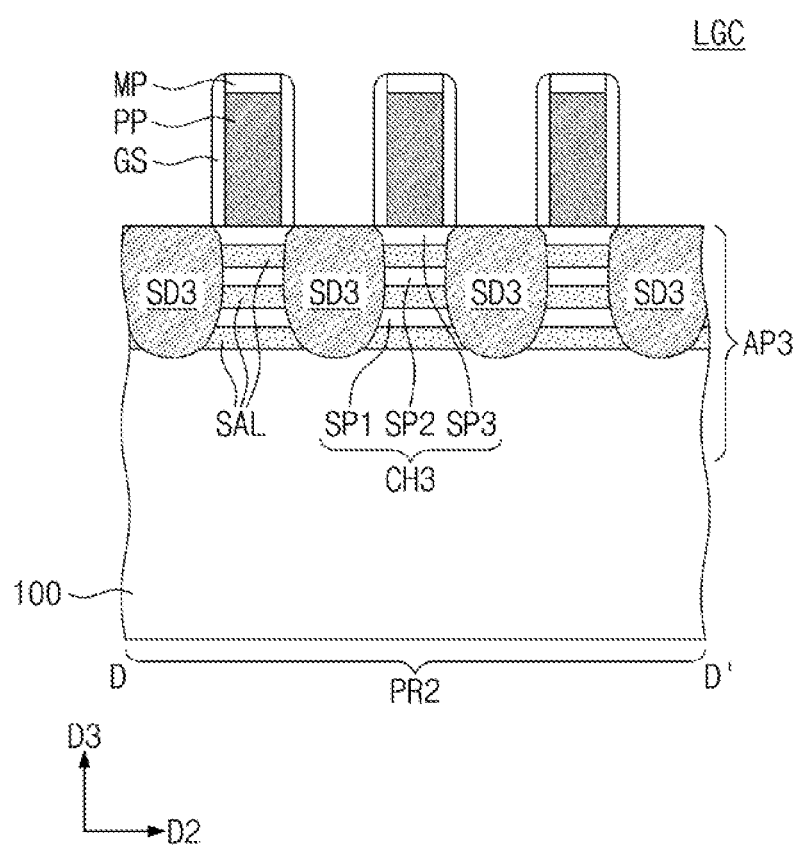
Figure 8E:
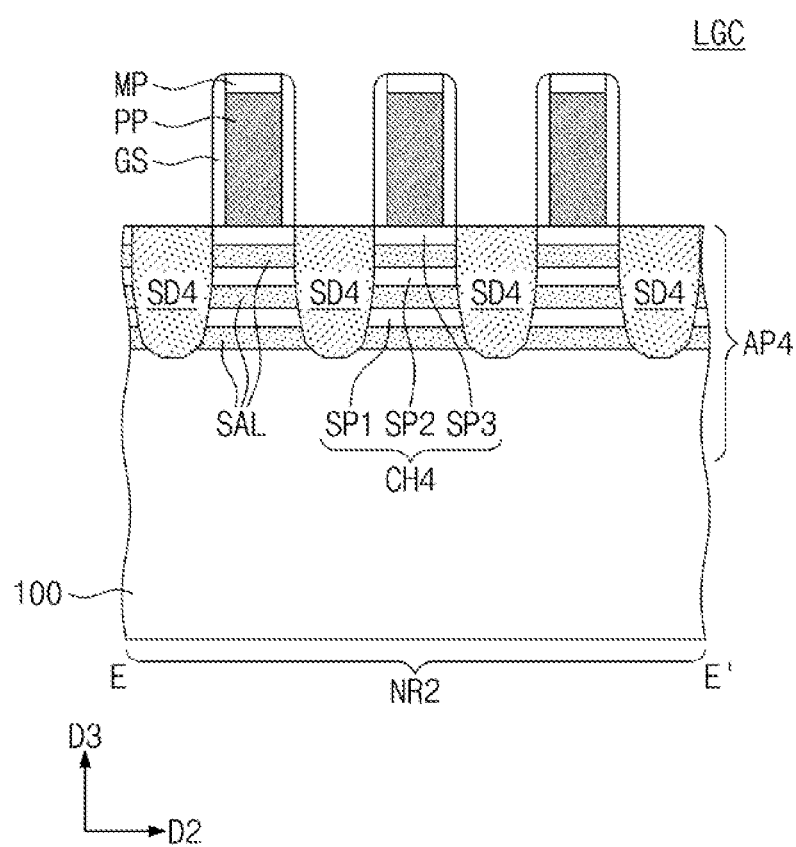
FIGS. 8E, 10E, 12E, and 14E are sectional views taken along lines E-E' of FIGS. 7, 9, 11, and 13, respectively.
Figure 8F:
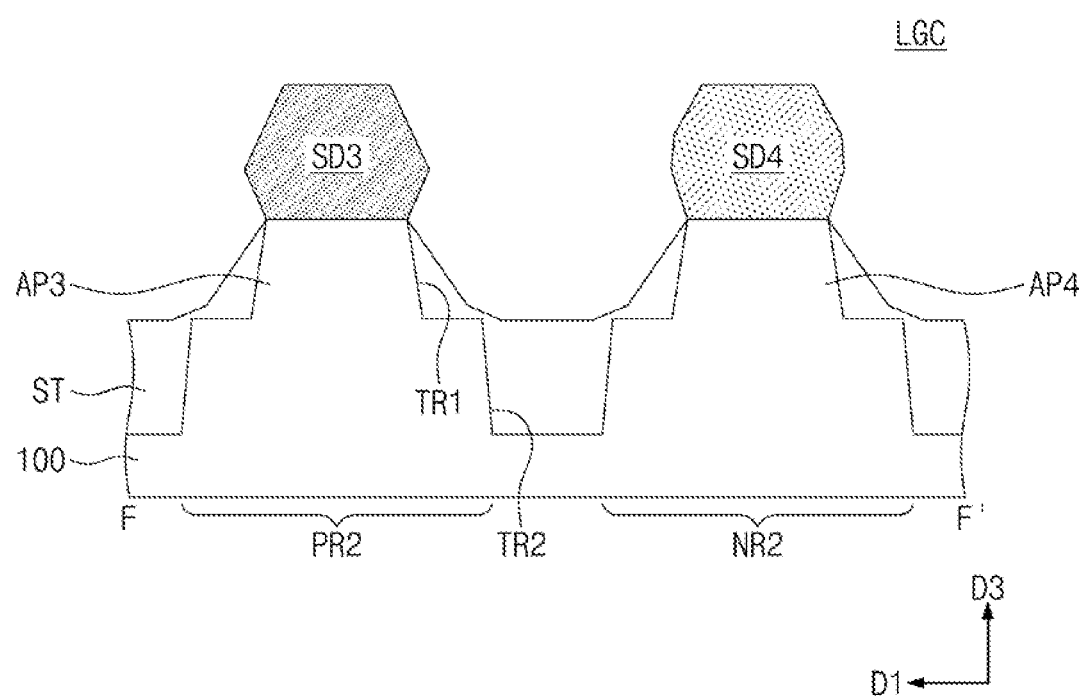
FIGS. 8F, 10F, and 12F are sectional views taken along lines F-F of FIGS. 7, 9, and 11, respectively.
Figure 9:
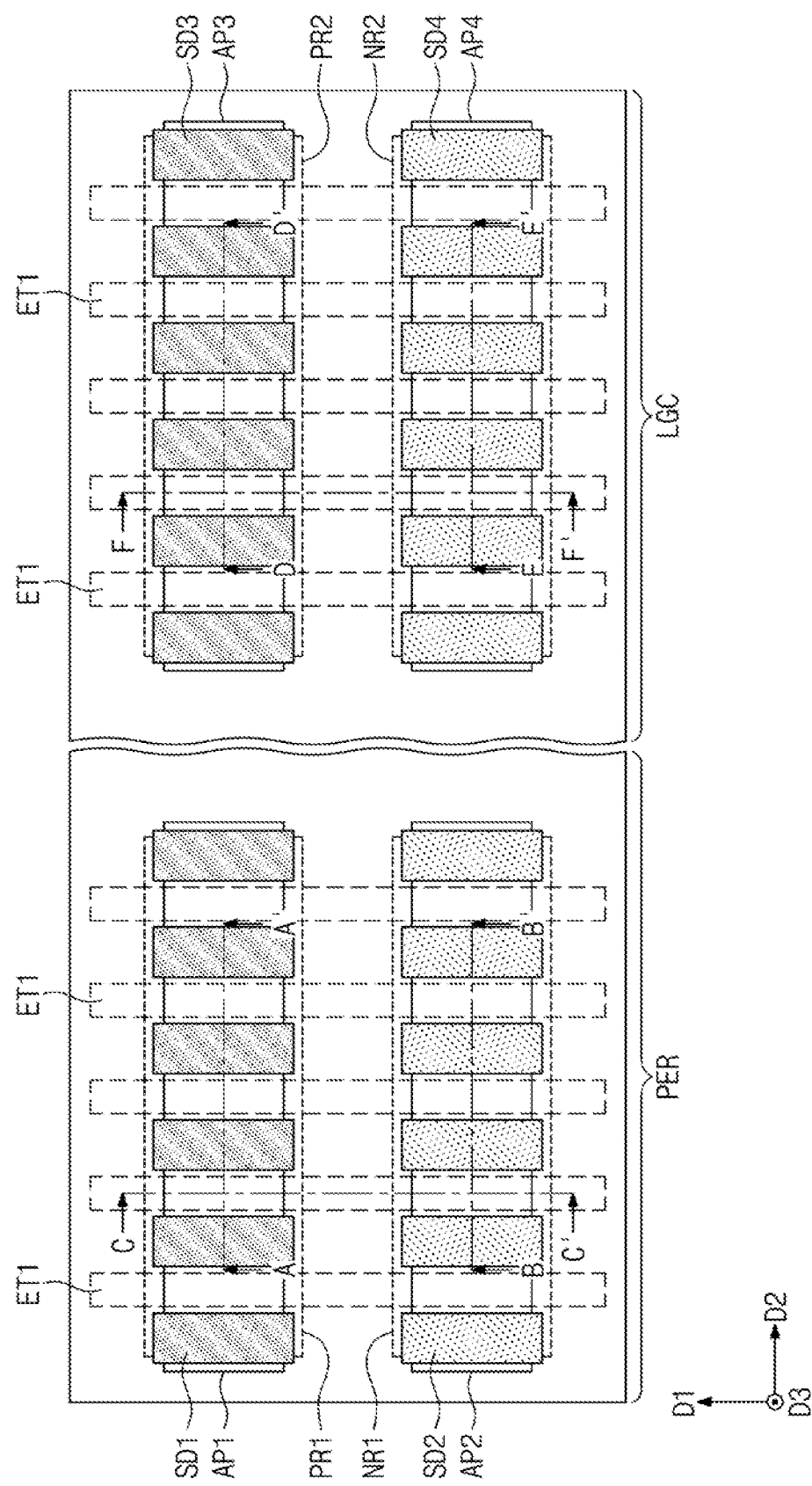
Figure 10A:
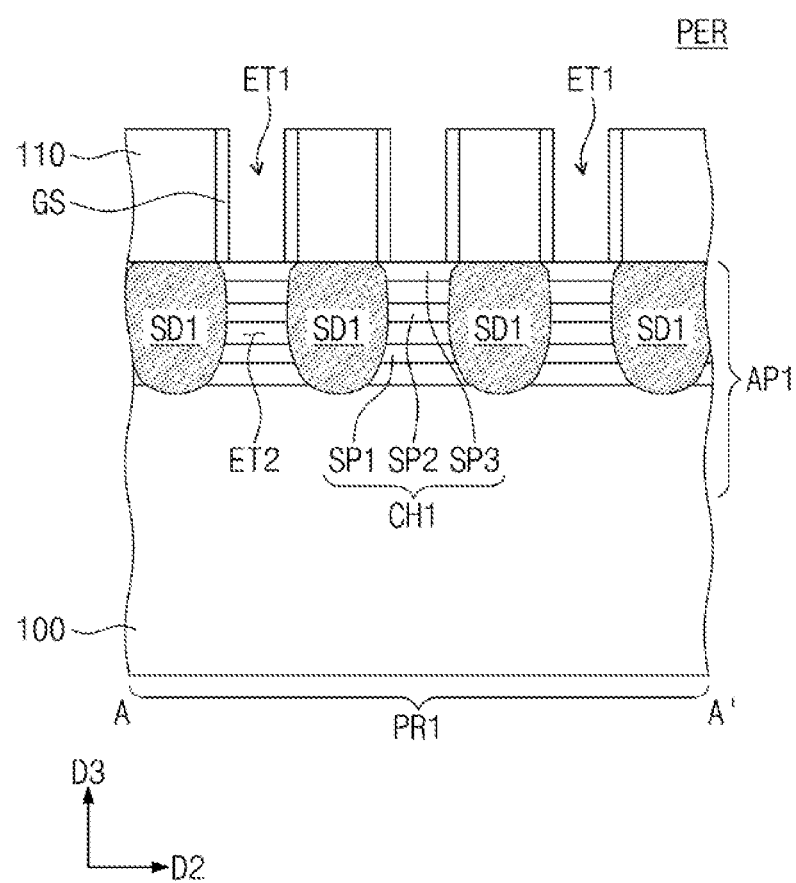
Figure 10B:
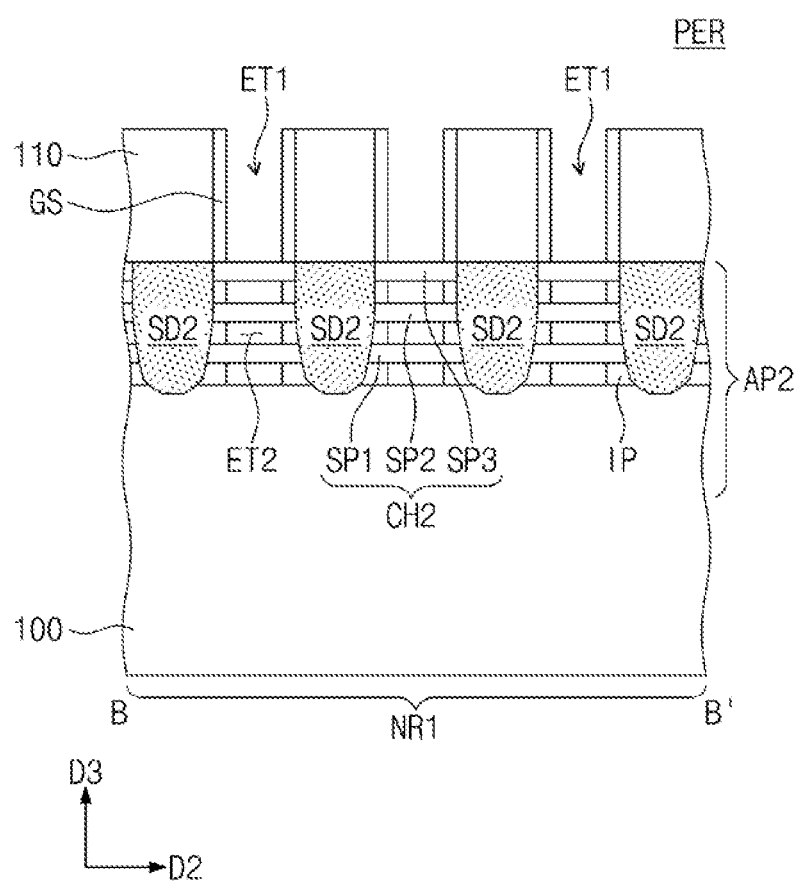
Figure 10C:
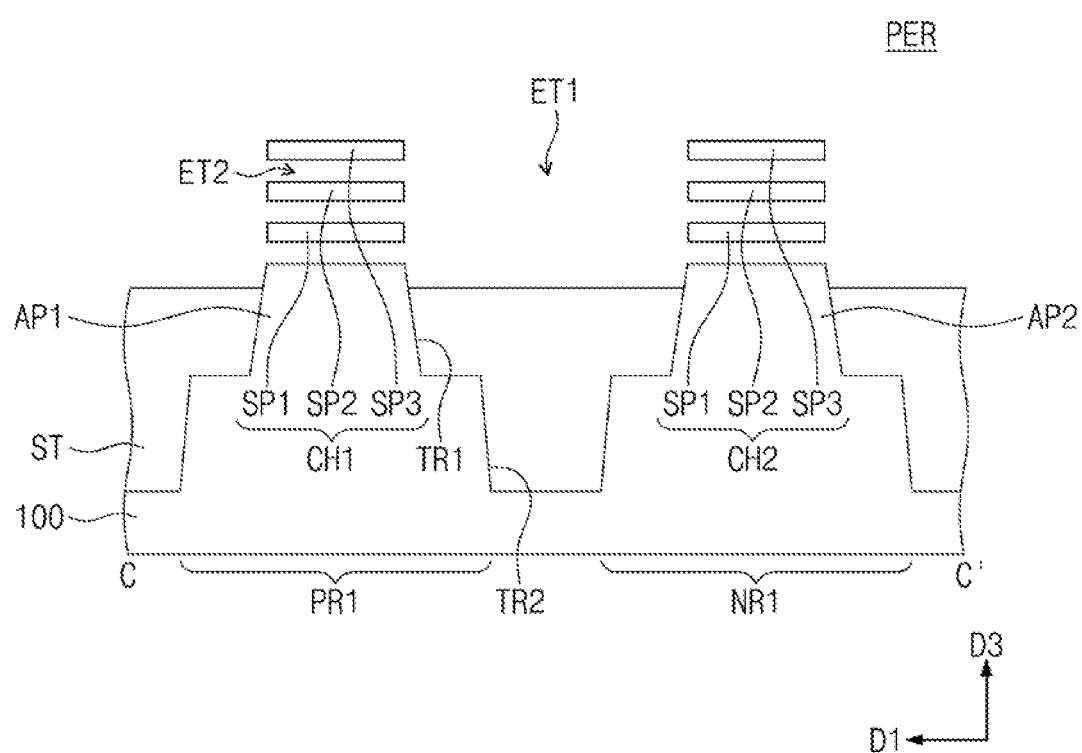
Figure 10D:
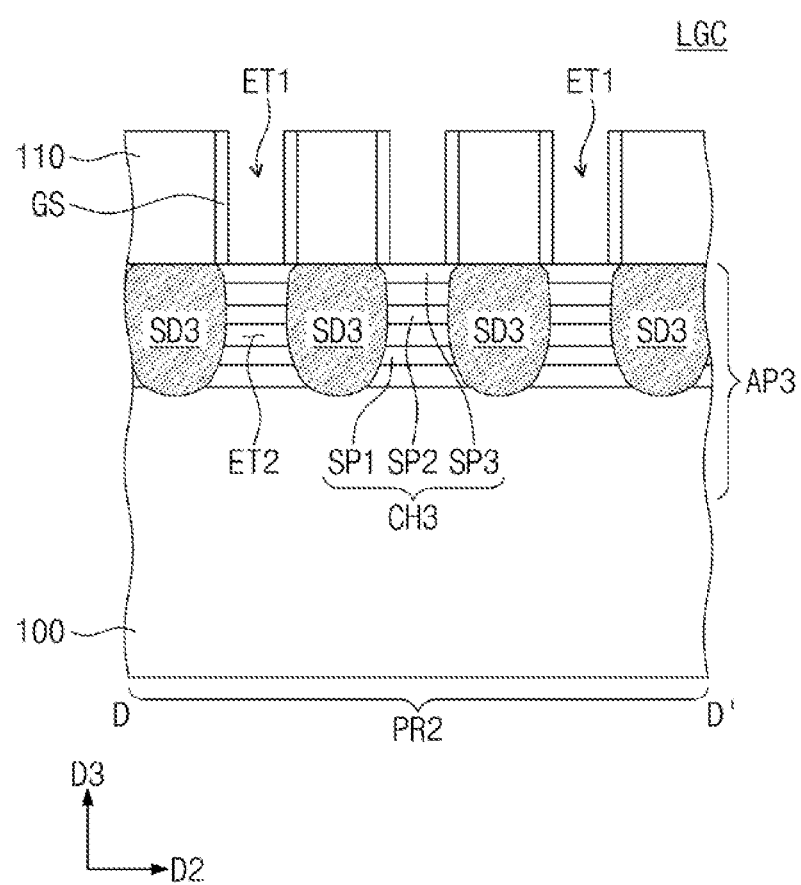
Figure 10E:
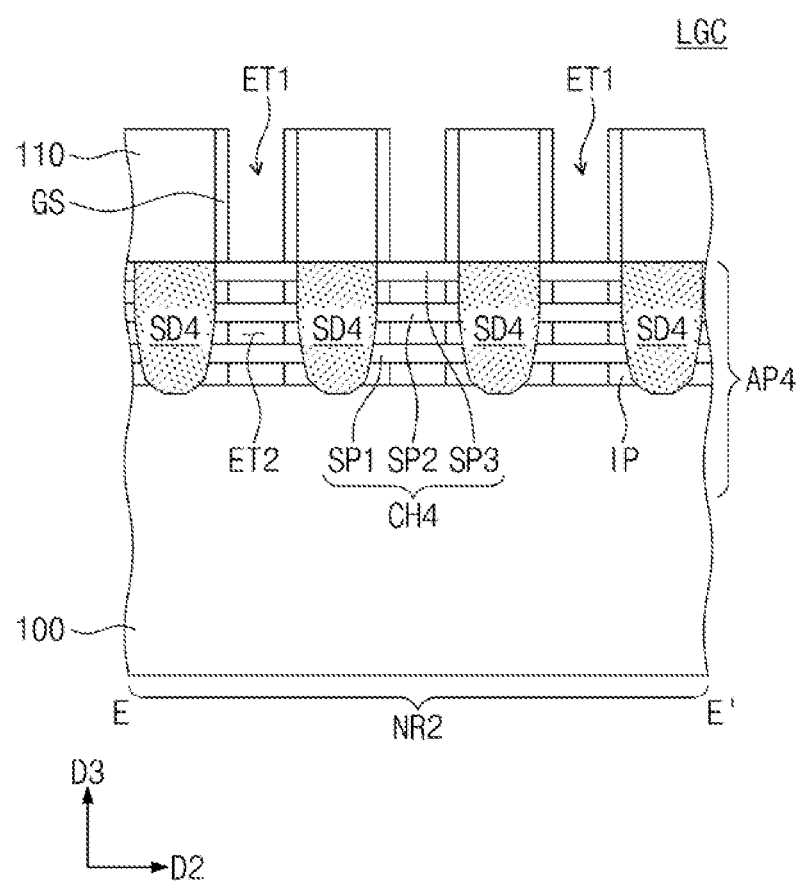
Figure 10F:
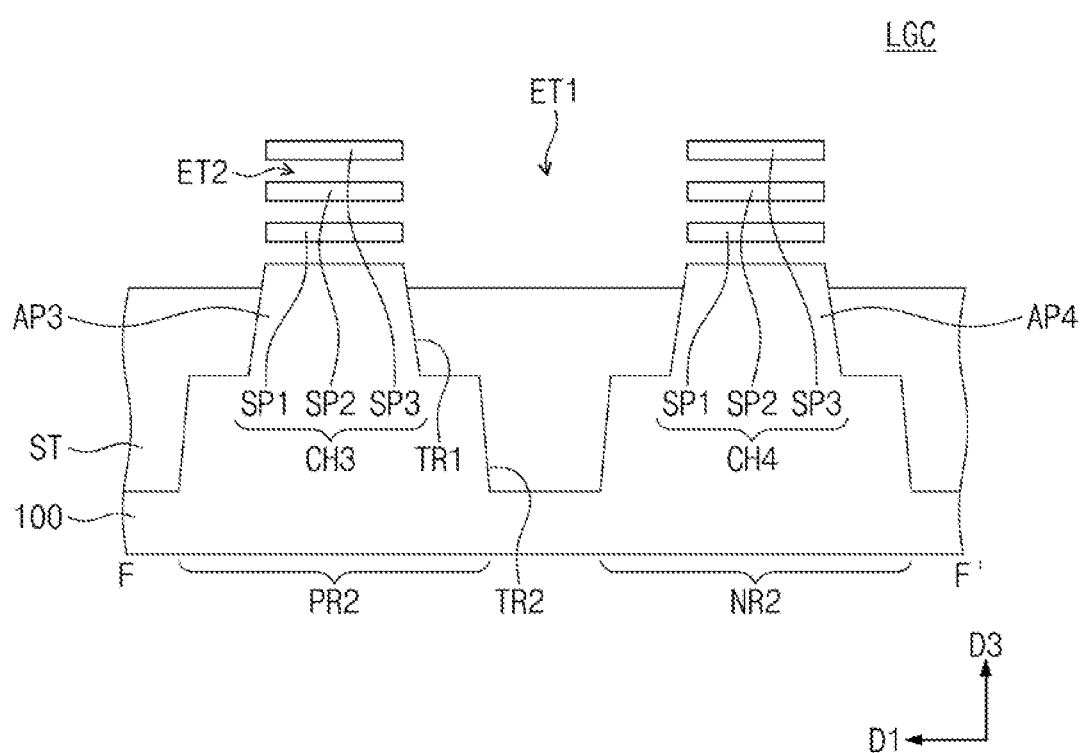
Figure 11:
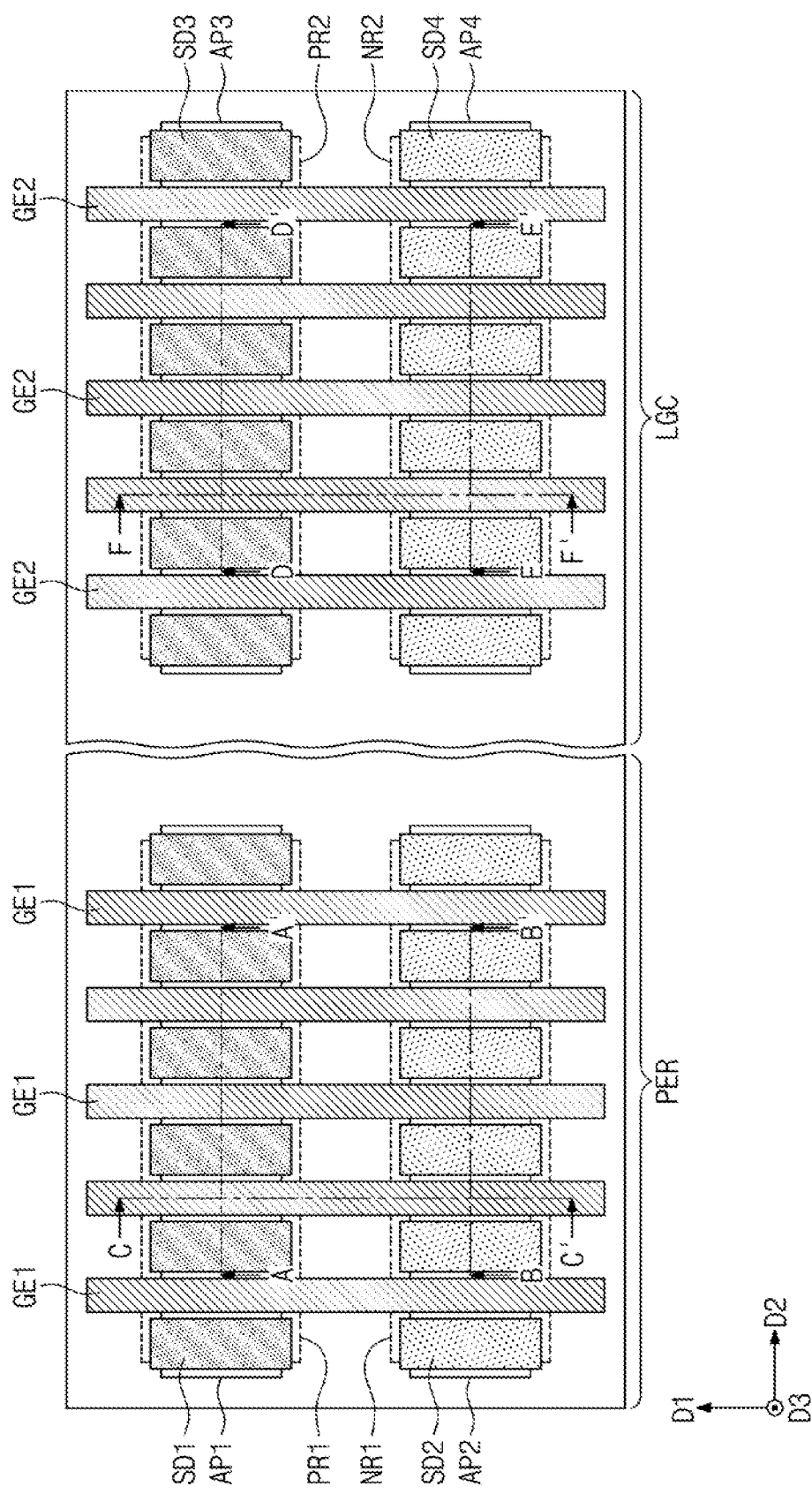
Figure 12A:
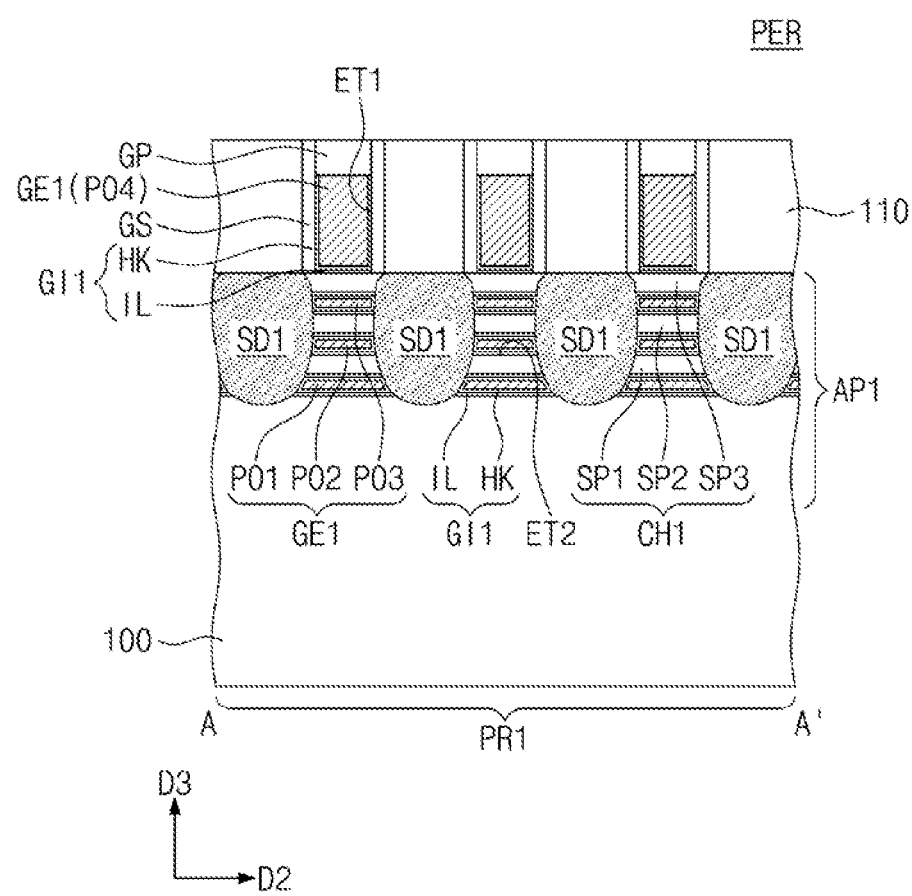
Figure 12B:
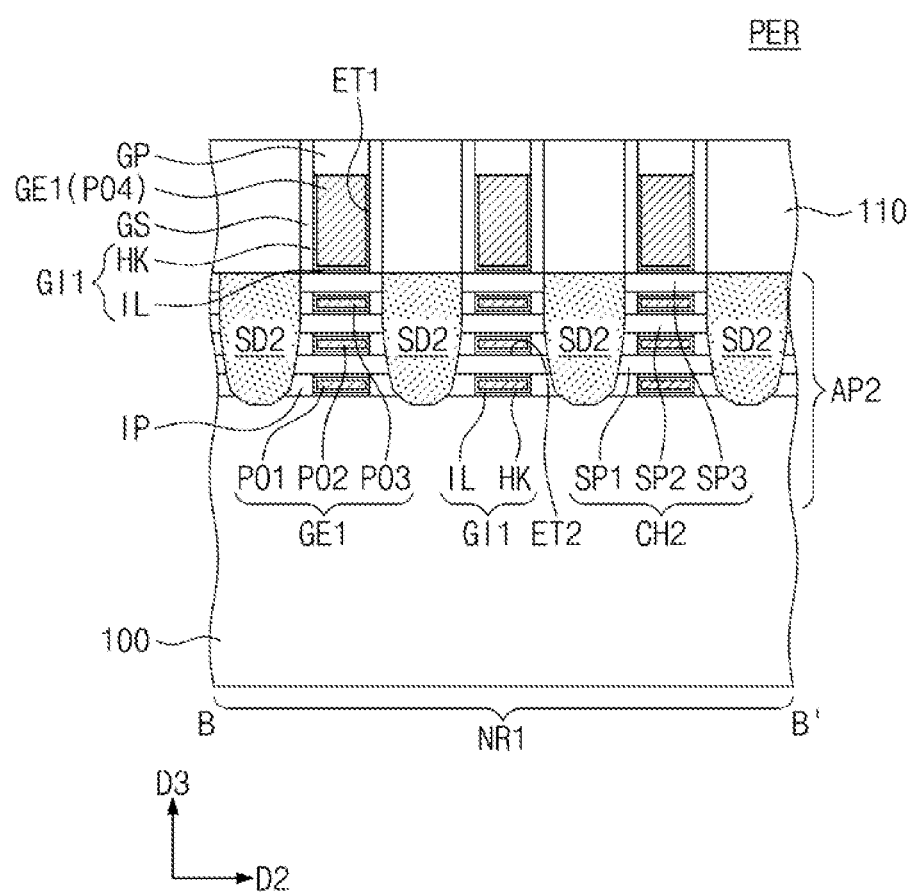
Figure 12C:
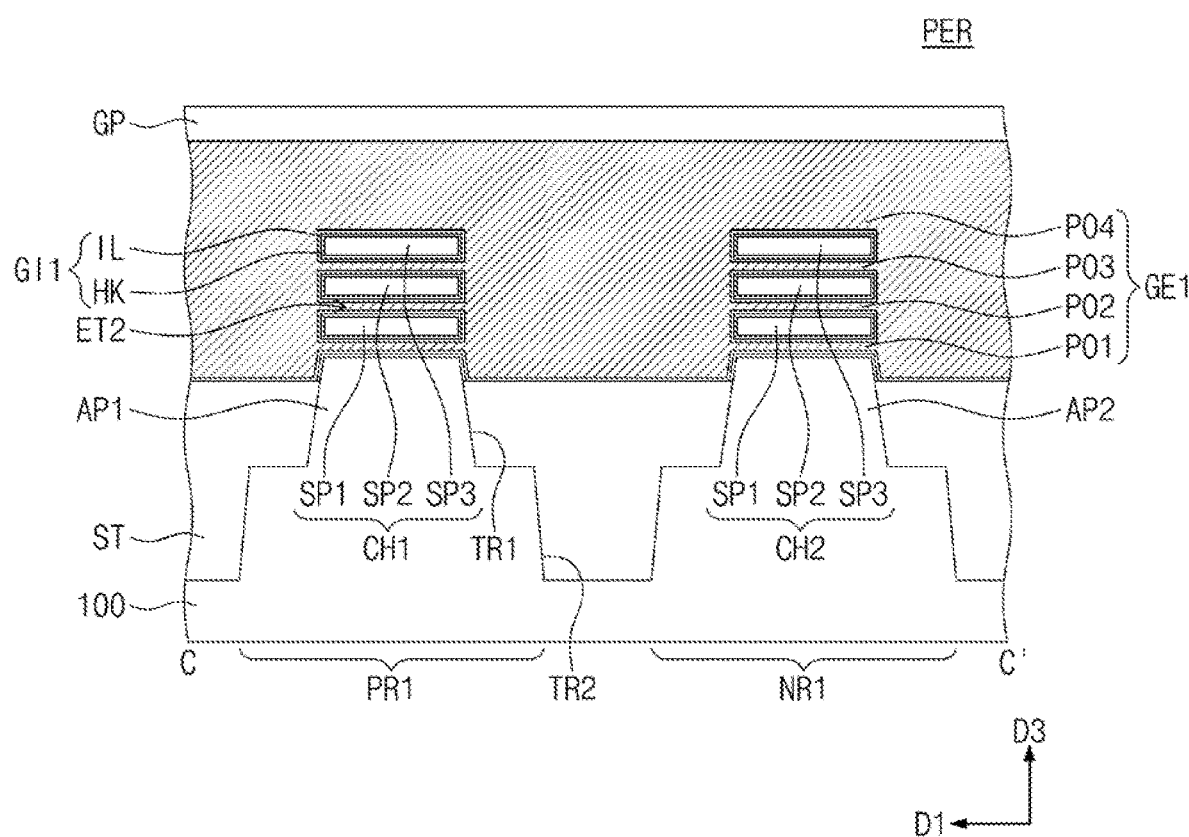
Figure 12D:
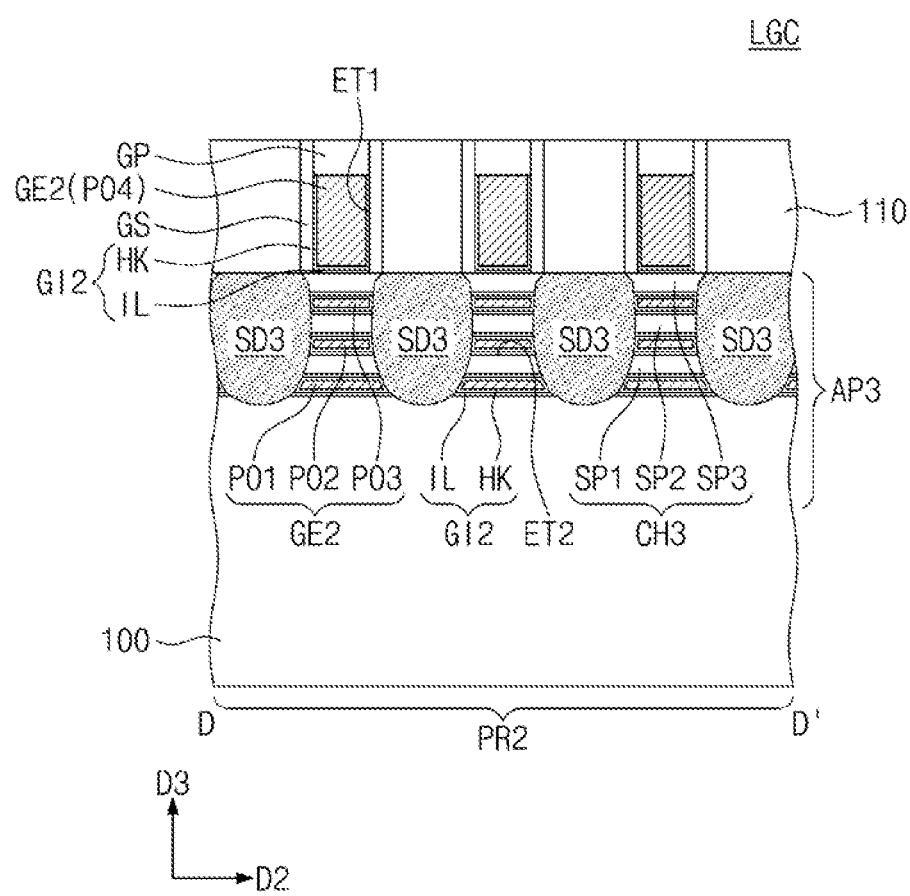
Figure 12E:
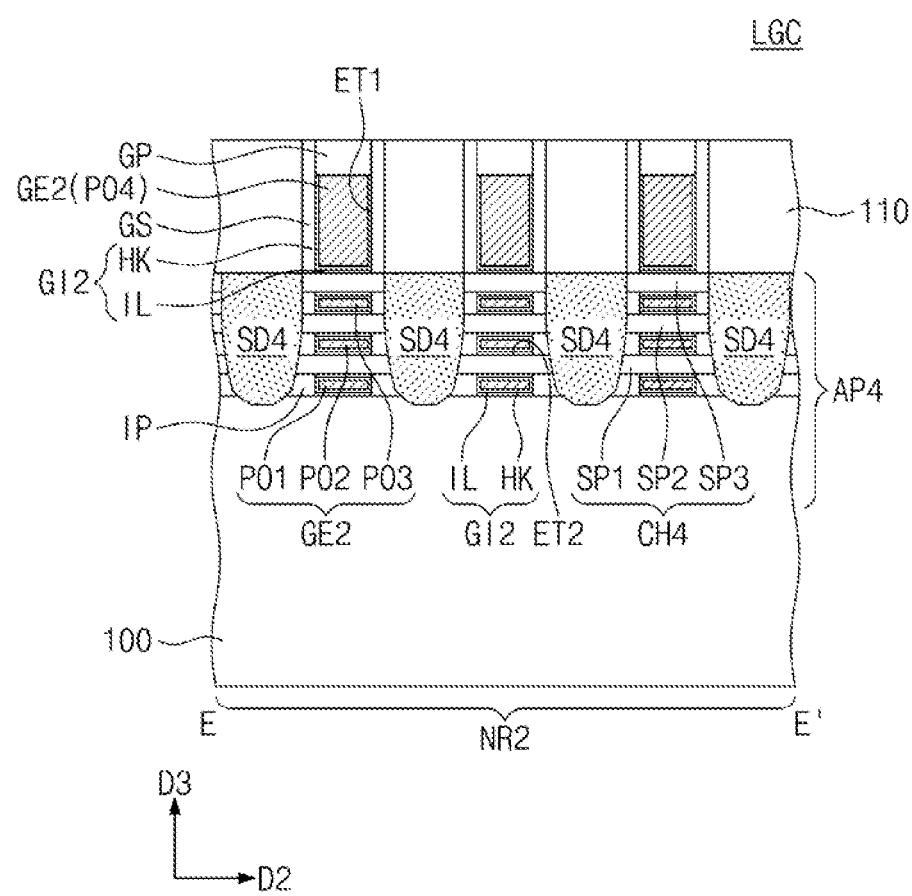
Figure 12F:
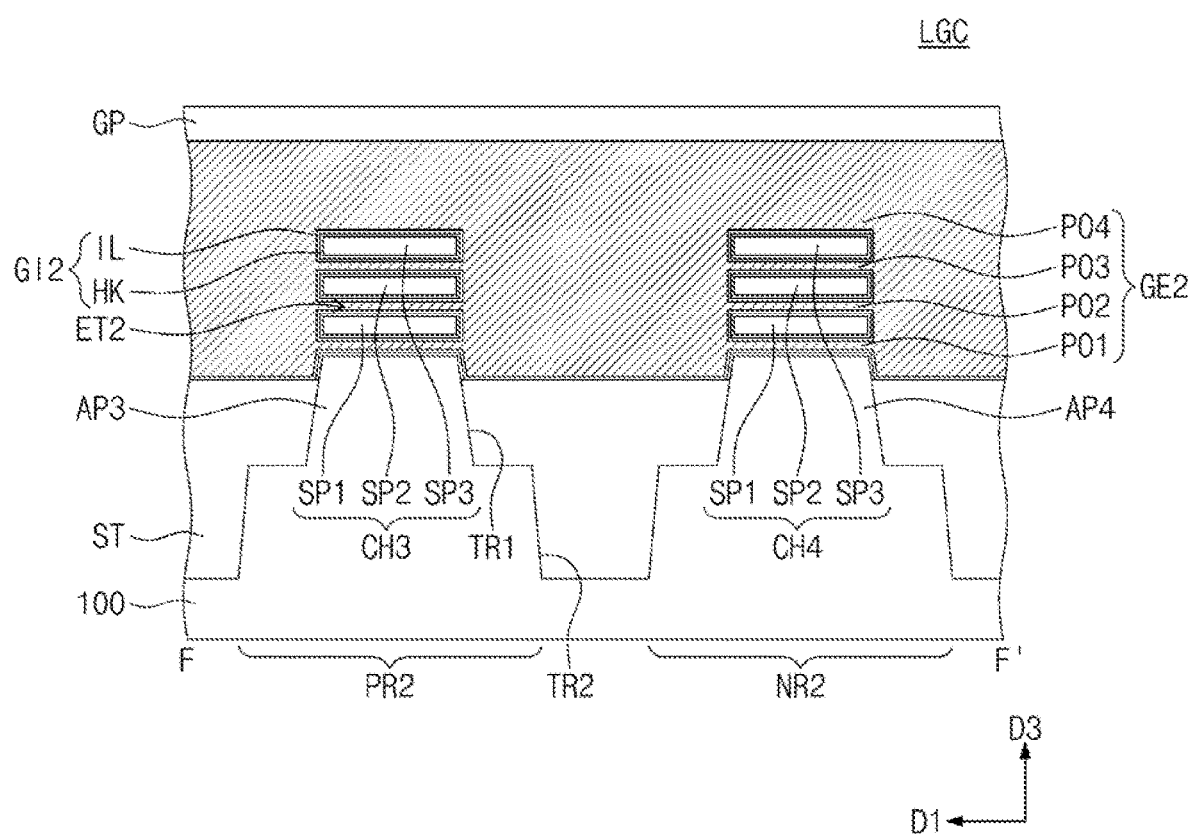
Figure 13:
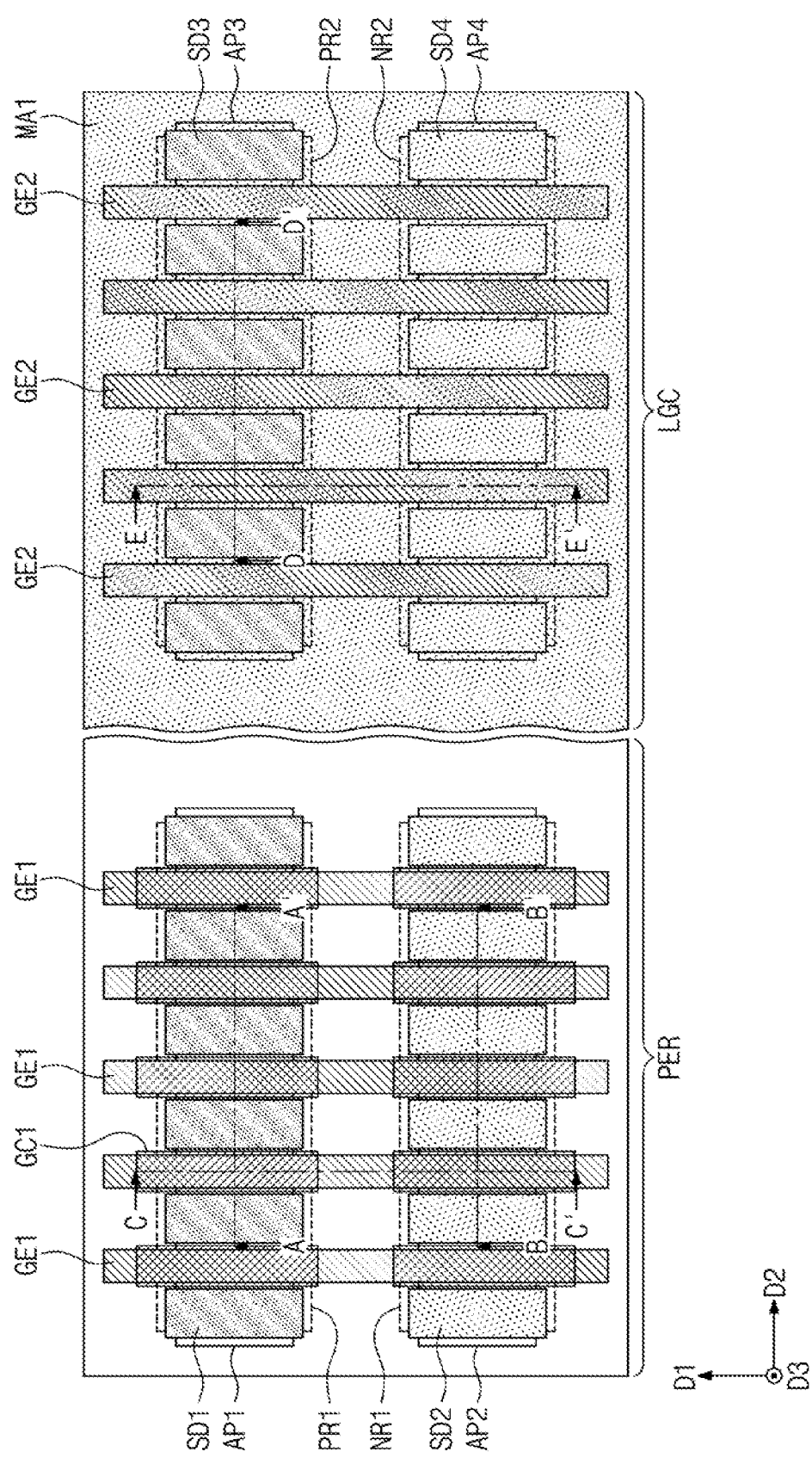
Figure 14A:
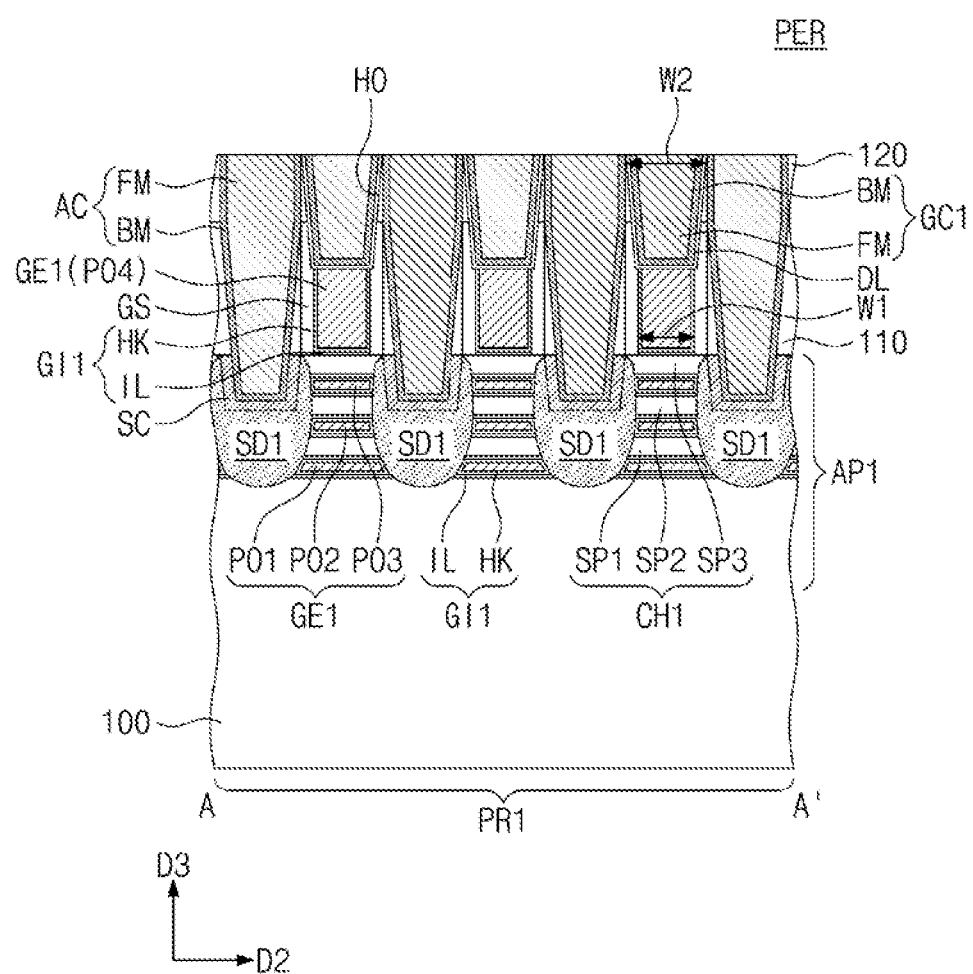
Figure 14B:
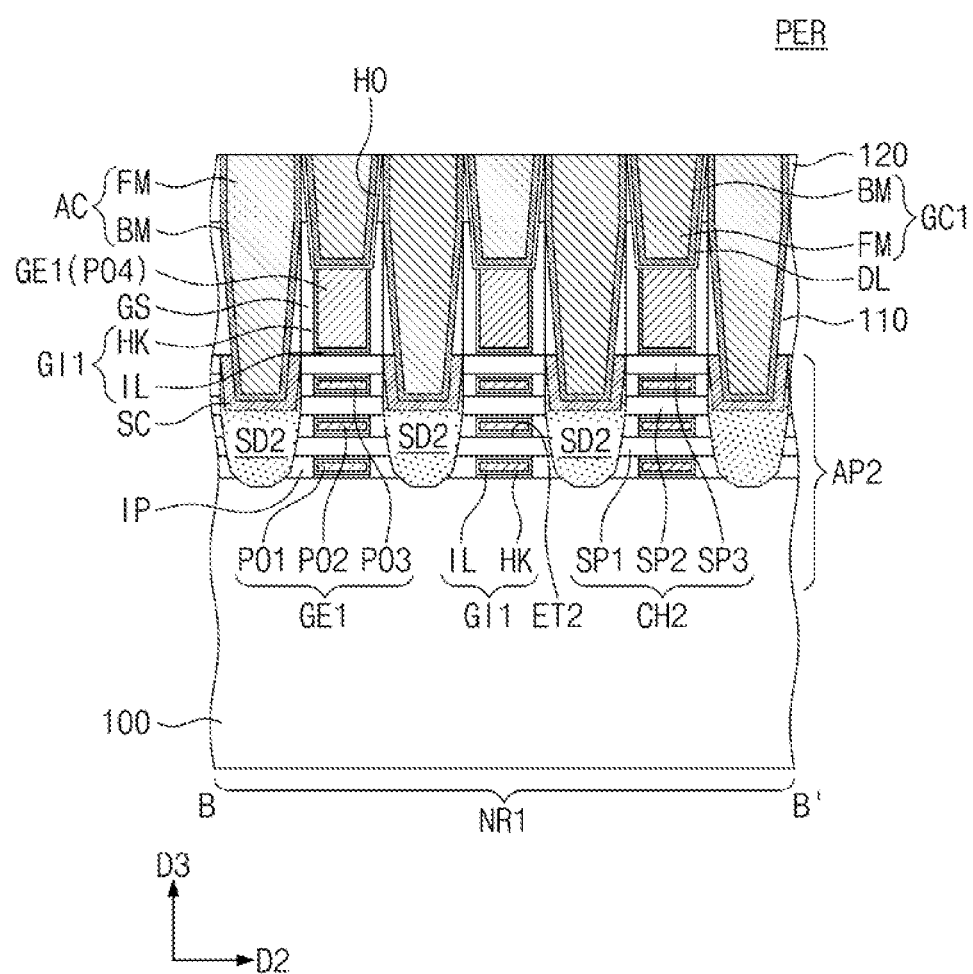
Figure 14C:
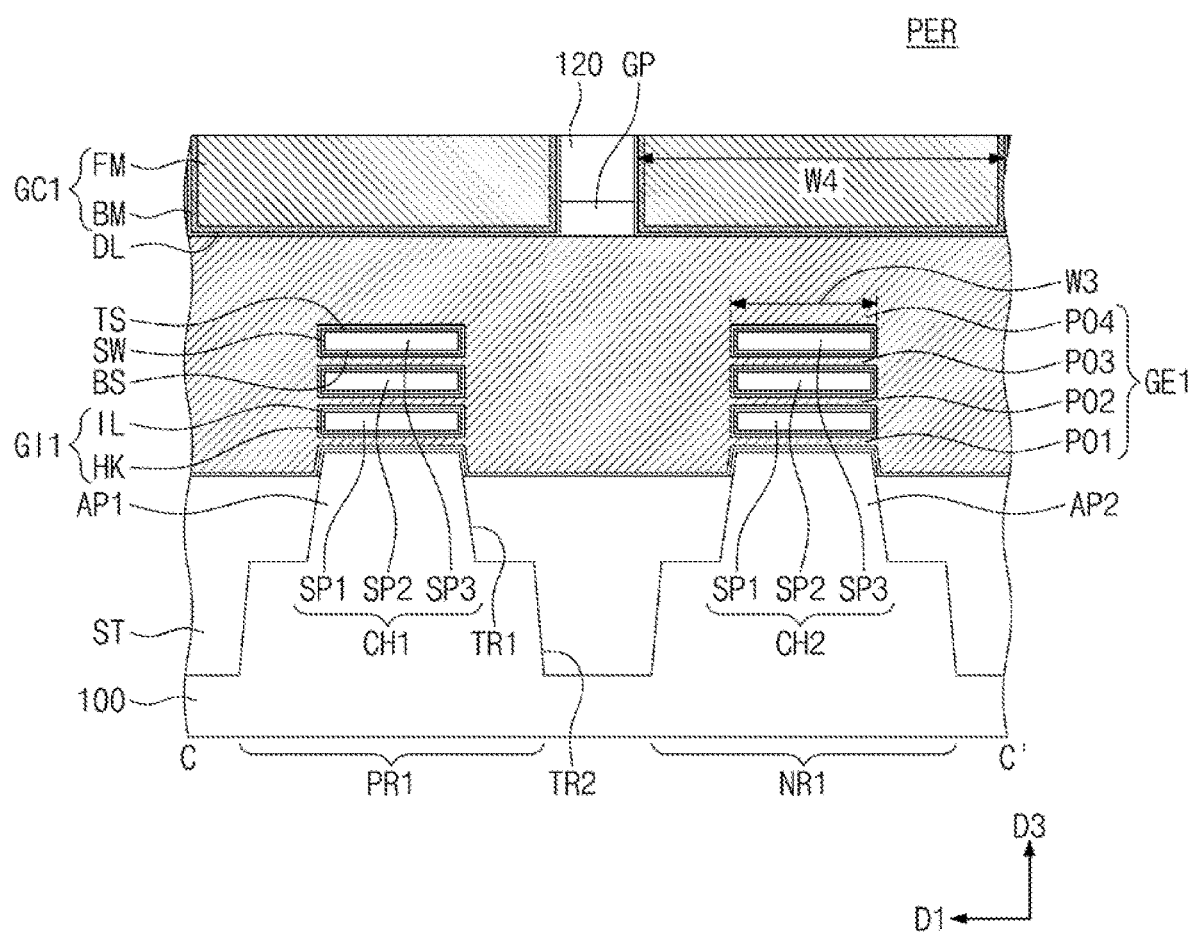
Figure 14D:
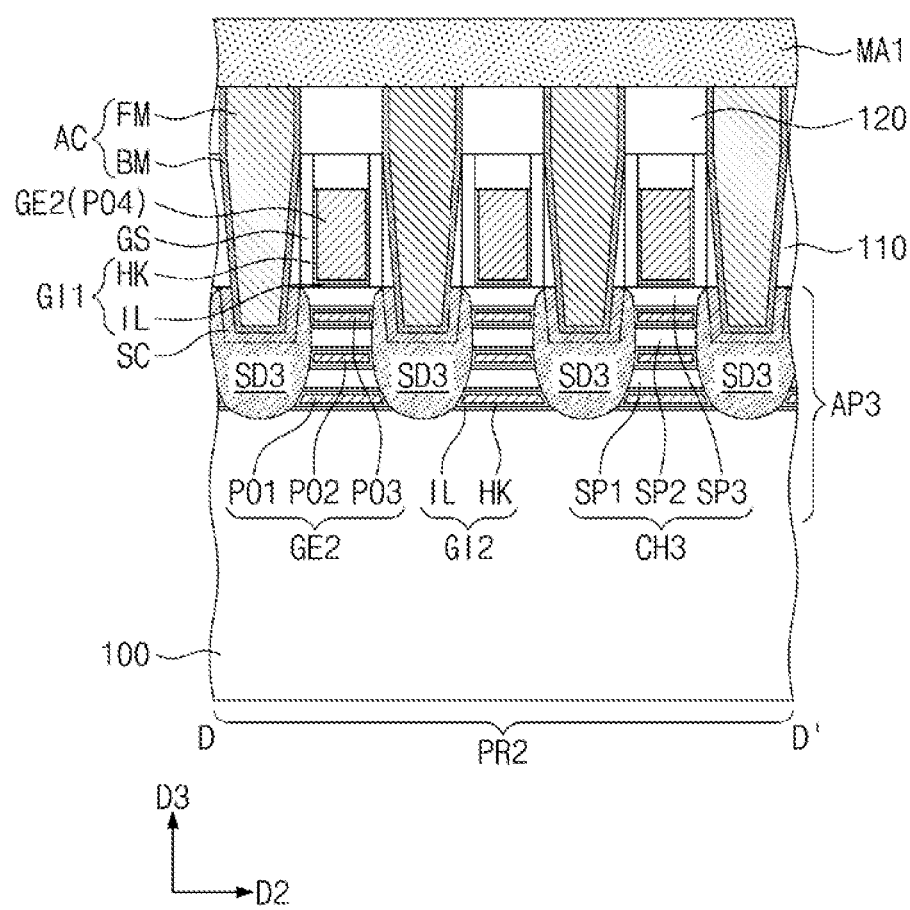
Figure 14E:
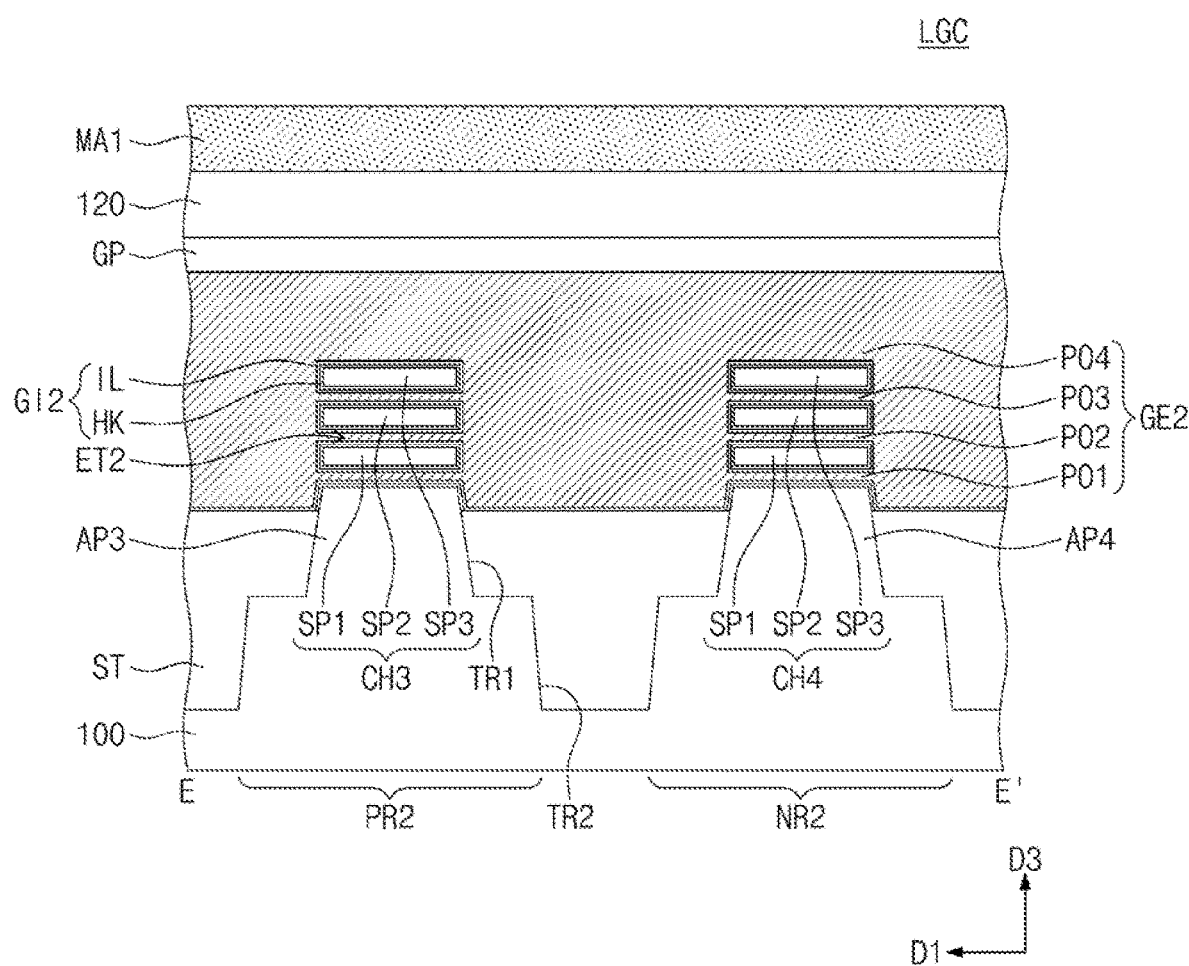

FIGS. 3, 5, 7, 9, 11, and 13 are plan views that illustrate a method of fabricating a semiconductor device, according to an embodiment of the inventive concept. FIGS. 4A, 6A, 8A, 10A, 12A, and 14A are sectional views taken along lines A-A' of FIGS. 3, 5, 7, 9, 11, and 13, respectively. FIGS. 4B, 6B, 8B, 10B, 12B, and 14B are sectional views taken along lines B-B' of FIGS. 3, 5, 7, 9, 11, and 13, respectively. FIGS. 4C, 8C, 10C, 12C, and 14C are sectional views taken along lines C-C' of FIGS. 3, 7, 9, 11, and 13, respectively. FIGS. 4D, 8D, 10D, 12D, and 14D are sectional views taken along lines D-D' of FIGS. 3, 7, 9, 11, and 13, respectively. FIGS. 8E, 10E, 12E, and 14E are sectional views taken along lines E-E' of FIGS. 7, 9, 11, and 13, respectively. FIGS. 8F, 10F, and 12F are sectional views taken along lines F-F' of FIGS. 7, 9, and 11, respectively.

Referring to FIGS. 3 and 4A to 4D, in an embodiment, the substrate 100 is provided that includes the peripheral region PER and the logic cell region LGC. Semiconductor layers ACL and sacrificial layers SAL are formed and alternately stacked on the substrate 100. The semiconductor layers ACL are formed of or include one of silicon (Si), germanium (Ge), or silicon germanium (SiGe), and the sacrificial layers SAL are formed of or include another one of silicon (Si), germanium (Ge), or silicon germanium (SiGe). For example, the semiconductor layers ACL are formed of or include silicon (Si), and the sacrificial layers SAL are formed of or include silicon germanium (SiGe).

In an embodiment, a first patterning process is performed on the substrate 100 to form the first trench TR1 that separates first to fourth active patterns AP1 to AP4. The semiconductor layers ACL and the sacrificial layers SAL are patterned during the first patterning process. In other words, each of the first to fourth active patterns AP1-AP4 includes the semiconductor and sacrificial layers ACL and SAL.

In an embodiment, a second patterning process is performed on the substrate 100 to form the second trench TR2 that separates the first PMOSFET region PR1, the first NMOSFET region NR1, the second PMOSFET region PR2, and the second NMOSFET region NR2. The second trench TR2 is narrower and deeper than the first trench TR1. However, in an embodiment, the second patterning process that forms the second trench TR2 is omitted.

In an embodiment, the first PMOSFET region PR1 and the first NMOSFET region NR1 are disposed in the peripheral region PER. The first and second active patterns AP1 and AP2 are formed on the first PMOSFET region PR1 and the first NMOSFET region NR1, respectively. The second PMOSFET region PR2 and the second NMOSFET region NR2 are disposed in the logic cell region LGC. The third and fourth active patterns AP3 and AP4 are formed on the second PMOSFET region PR2 and the second NMOSFET region NR2, respectively.

In an embodiment, the device isolation layer ST is formed on the substrate 100 and fills the first and second trenches TR1 and TR2. The device isolation layer ST is formed of or includes at least one insulating material, such as silicon oxide. The device isolation layer ST is recessed to expose upper portions of the first to fourth active patterns AP1 to AP4. For example, the upper portions of the first and second active patterns AP1 and AP2 vertically protrude above the device isolation layer ST.

Figure 6A:
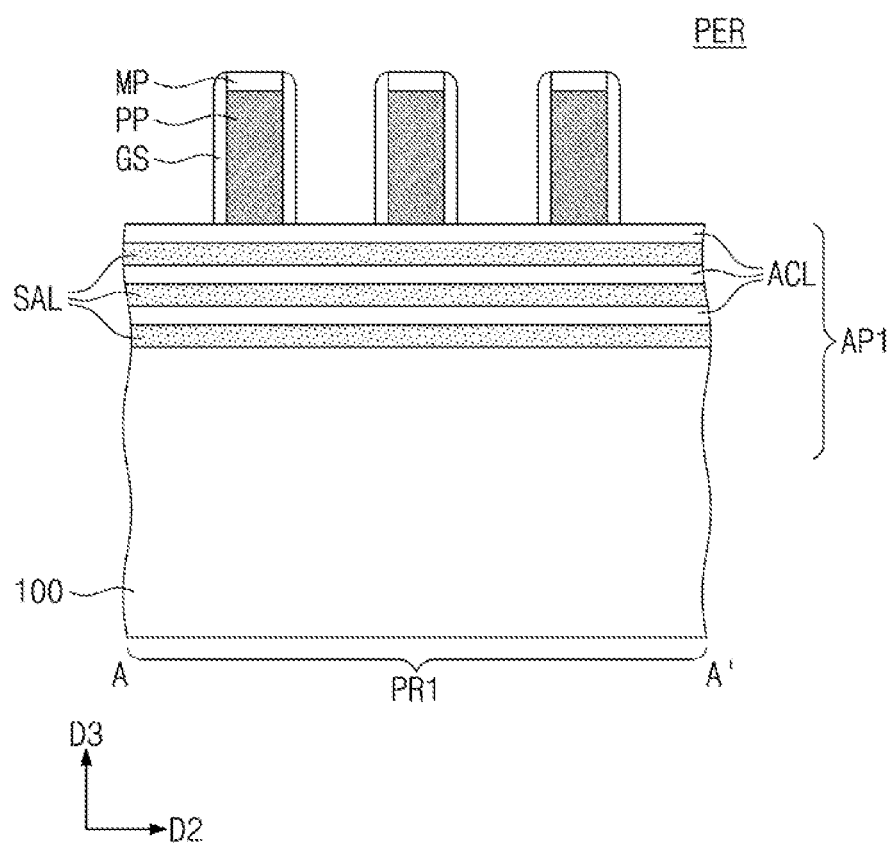
Figure 6B:
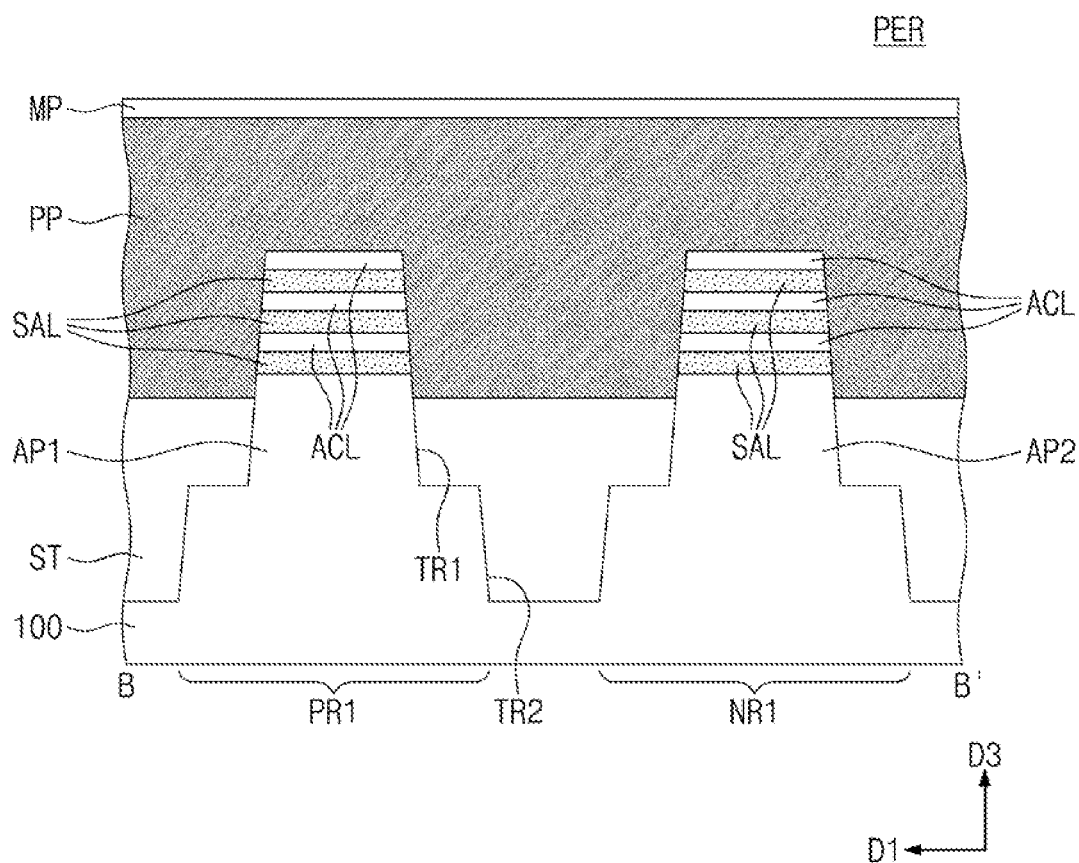
Figure 7:
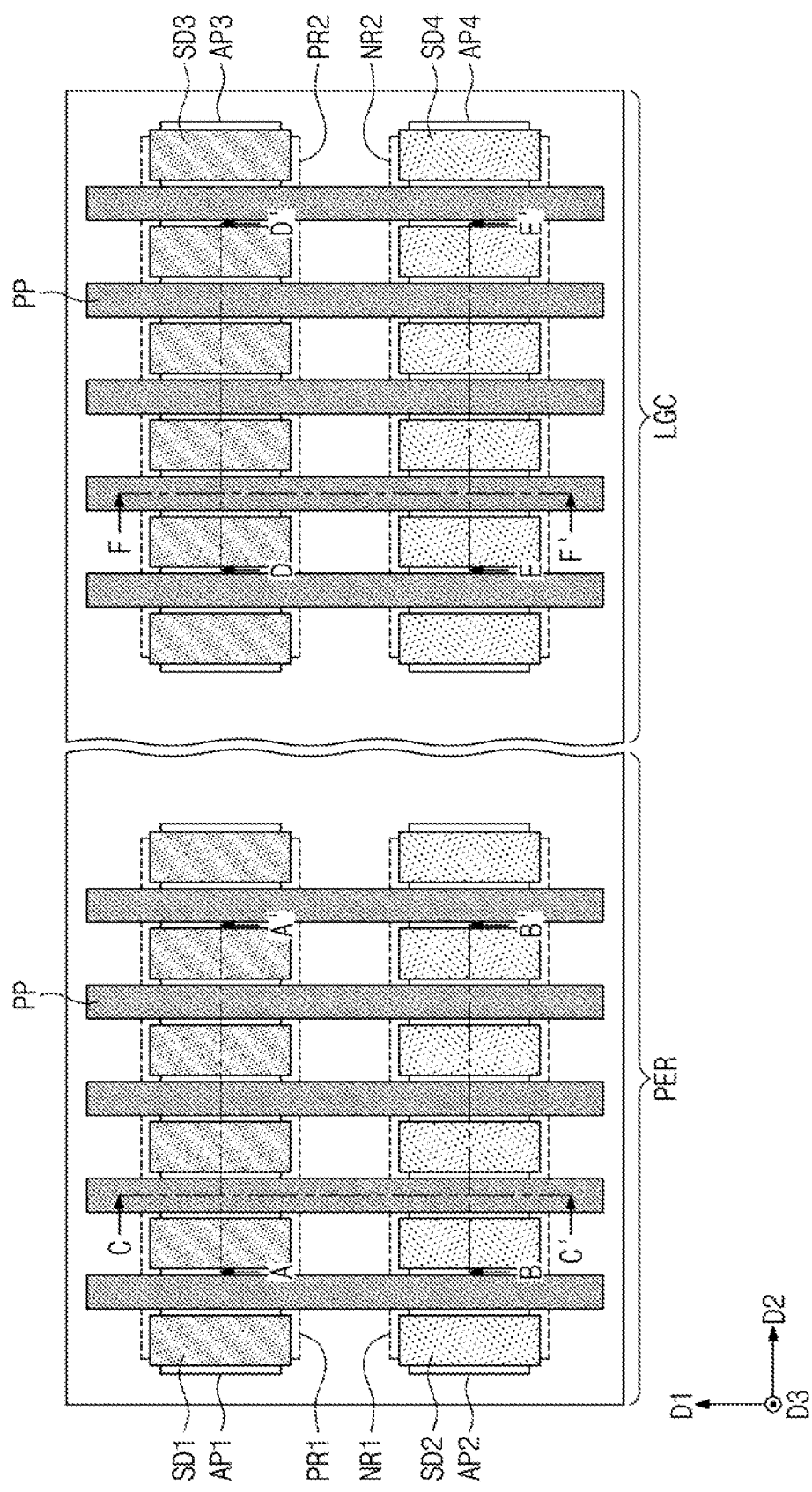

Referring to FIGS. 5, 6A, and 6B, in an embodiment, a sacrificial pattern PP is formed on the peripheral region PER and crosses the first and second active patterns AP1 and AP2. The sacrificial pattern PP is formed on the logic cell region LGC and crosses the third and fourth active patterns AP3 and AP4. Each of the sacrificial patterns PP has a line or bar shape that extends in the first direction D1.

In detail, in an embodiment, the formation of the sacrificial patterns PP includes forming a sacrificial layer on the substrate 100, forming hard mask patterns MP on the sacrificial layer, and patterning the sacrificial layer using the hard mask patterns MP as an etch mask. The sacrificial layer is formed of or includes polysilicon.

According to an embodiment of the inventive concept, a patterning process that forms the sacrificial patterns PP includes a lithography process that uses extreme ultraviolet (EUV) light. In an embodiment, the EUV light has a wavelength that ranges from 4 nm to 124 nm and, in particular, from 4 nm to 20 nm, and may be, for example, an ultraviolet light that has a wavelength of 13.5 nm. The EUV light has an energy of 6.21 eV to 124 eV, and, in particular, from 90 eV to 95 eV.

In an embodiment, the lithography process that uses EUV light includes performing an exposing process of irradiating EUV light onto a photoresist layer and performing a developing process. For example, the photoresist layer is an organic photoresist layer that contains an organic polymer, such as polyhydroxystyrene. The organic photoresist layer further includes a photosensitive compound that can react with EUV light. The organic photoresist layer further contains a material that absorbs EUV, such as an organometallic material, an iodine-containing material, or a fluorine-containing material. For another example, the photoresist layer is an inorganic photoresist layer that contains an inorganic material, such as tin oxide.

In an embodiment, the photoresist layer is relatively thin. Photoresist patterns are formed by developing a photoresist layer that has been exposed to the EUV light. When viewed in a plan view, a photoresist pattern may have a linear shape that extends in a specific direction, an island shape, a zigzag shape, a honeycomb shape, or a circular shape, but embodiments of the inventive concept are not limited to these examples.

In an embodiment, the hard mask patterns MP are formed by patterning at least one mask layer that is disposed below the photoresist patterns, using the photoresist patterns as an etch mask. Thereafter, a desired pattern, i.e., the sacrificial patterns PP, is formed on a wafer by patterning a target layer, i.e., the sacrificial film, using the hard mask patterns MP as an etch mask.

In a comparative example, a multi-patterning technology (MPT) that uses two or more photomasks is required to form fine-pitch patterns on a wafer. By contrast, in a case where a EUV lithography process according to an embodiment of the inventive concept is performed, the sacrificial patterns PP are formed to have a fine pitch using just one photomask.

For example, when the sacrificial patterns PP are formed by a EUV lithography process according to a present embodiment, the minimum pitch between the sacrificial patterns PP is less than 45 nm. In other words, since a EUV lithography process is performed to form the sacrificial patterns PP, the sacrificial patterns PP can be precisely and finely formed, without using a multi-patterning technology.

In an embodiment, an EUV lithography process is used in a patterning process that forms not only the sacrificial patterns PP but also the first to fourth active patterns AP1 to AP4 described above, but embodiments of the inventive concept are not limited to this example.

In an embodiment, a pair of the gate spacers GS are respectively formed on opposite side surfaces of each of the sacrificial patterns PP. The formation of the gate spacers GS includes conformally forming a gate spacer layer on the substrate 100 and anisotropically etching the gate spacer layer. The gate spacer layer is formed of or includes at least one of SiCN, SiCON, or SiN. Alternatively, in an embodiment, the gate spacer layer is a multi-layered structure that includes at least two of SiCN, SiCON, or SiN.

Referring to FIGS. 7 and 8A to 8F, in an embodiment, first to fourth source/drain patterns SD1-SD4 are formed on the first to fourth active patterns AP1-AP4, respectively. For example, the first source/drain patterns SD1 are formed in an upper portion of the first active pattern AP1. A pair of the first source/drain patterns SD1 are respectively formed at both sides of the sacrificial pattern PP. In detail, first recess regions RS1 are formed by etching the upper portion of the first active pattern AP1 using the hard mask patterns MP and the gate spacers GS as an etch mask. The device isolation layer ST between the first active patterns AP1 is partially recessed during the etching of the upper portion of the first active pattern AP1 (see, e.g., FIG. 8C).

In an embodiment, the first source/drain pattern SD1 are formed by performing a selective epitaxial growth process using an inner surface of the first recess region RS1 of the first active pattern AP1 as a seed layer. As a result of forming the first source/drain patterns SD1, the first channel pattern CH1 that includes the first to third semiconductor patterns SP1, SP2, and SP3 is formed between each pair of the first source/drain patterns SD1. The selective epitaxial growth process includes, for example, a chemical vapor deposition (CVD) process or a molecular beam epitaxy (MBE) process. The first source/drain patterns SD1 include a semiconductor material, such as SiGe, that have a lattice constant greater than that of the substrate 100. Each of the first source/drain patterns SD1 is a multi-layered structure that includes a plurality of semiconductor layers.

For example, in an embodiment, the first source/drain patterns SD1 are doped in situ during the selective epitaxial growth process. In another embodiment, impurities are injected into the first source/drain patterns SD1, after the first source/drain patterns SD1 are formed. The first source/drain patterns SD1 are doped to have a first conductivity type, such as a p-type.

In an embodiment, the second source/drain patterns SD2 are formed in an upper portion of the second active pattern AP2. A pair of the second source/drain patterns SD2 are respectively formed at both sides of the sacrificial pattern PP. As a result of forming the second source/drain patterns SD2, the second channel pattern CH2 that includes the first to third semiconductor patterns SP1, SP2, and SP3 is formed between the pair of second source/drain patterns SD2.

In detail, in an embodiment, second recess regions RS2 is formed by etching the upper portion of the second active pattern AP2 using the hard mask patterns MP and the gate spacers GS as an etch mask. Thereafter, the second source/drain pattern SD2 is formed in the second recess region RS2 by performing a selective epitaxial growth process, in which an inner surface of the second recess region RS2 is used as a seed layer. In an embodiment, the second source/drain patterns SD2 are formed of or include the same semiconductor material, such as Si, as the substrate 100. The second source/drain patterns SD2 are doped to have a second conductivity type, such as an n-type.

In an embodiment, the third source/drain patterns SD3 are formed in an upper portion of the third active pattern AP3, and the process of forming the third source/drain patterns SD3 is substantially the same as the afore-described process of forming the first source/drain patterns SD1. In an embodiment, the first source/drain patterns SD1 and the third source/drain patterns SD3 are formed at the same time. As a result of forming the third source/drain patterns SD3, the third channel pattern CH3 that includes the first to third semiconductor patterns SP1, SP2, and SP3 is formed between a pair of the third source/drain patterns SD3.

In an embodiment, the fourth source/drain patterns SD4 are formed in an upper portion of the fourth active pattern AP4, and the process of forming the fourth source/drain patterns SD4 is substantially the same as the afore-described process of forming the second source/drain patterns SD2. In an embodiment, the second source/drain patterns SD2 and the fourth source/drain patterns SD4 are formed at the same time. As a result of forming the fourth source/drain patterns SD4, the fourth channel pattern CH4 that includes the first to third semiconductor patterns SP1, SP2, and SP3 is formed between a pair of the fourth source/drain patterns SD4.

Referring to FIGS. 9 and 10A to 10F, in an embodiment, the first interlayer insulating layer 110 is formed that covers the first to fourth source/drain patterns SD1-SD4, the hard mask patterns MP and the gate spacers GS. In an embodiment, the first interlayer insulating layer 110 is formed of or includes silicon oxide.

In an embodiment, the first interlayered insulating layer 110 is planarized to expose top surfaces of the sacrificial patterns PP. Planarizing the first interlayered insulating layer 110 is performed using an etch-back or chemical mechanical polishing (CMP) process. During the planarization process, all of the hard mask patterns MP are removed. As a result, the first interlayer insulating layer 110 has a top surface that is substantially coplanar the top surfaces of the sacrificial patterns PP and the top surfaces of the gate spacers GS.

In an embodiment, the sacrificial patterns PP are selectively removed. Since the sacrificial patterns PP are removed, a first empty space ET1 is formed that exposes the first to fourth active patterns AP1-AP4 (see, e.g., FIGS. 10C and 10F).

In an embodiment, the sacrificial layers SAL that are disposed on the peripheral region PER and are exposed through the first empty space ET1 are selectively removed. In detail, referring back to FIG. 10C, the sacrificial layers SAL are selectively removed by an etching process. The first to third semiconductor patterns SP1, SP2, and SP3 are not removed by this etching process. As a result of removing the sacrificial layers SAL, second empty spaces ET2 are formed. The second empty spaces ET2 are respectively formed between adjacent patterns of the first to third semiconductor patterns SP1, SP2, and SP3.

In an embodiment, the sacrificial layers SAL that are disposed on the logic cell region LGC and are exposed through the first empty space ET1 are selectively removed. In detail, referring back to FIG. 10F, the sacrificial layers SAL are selectively removed by an etching process. The first to third semiconductor patterns SP1, SP2, and SP3 are not removed by this etching process. As a result of removing the sacrificial layers SAL, the second empty spaces ET2 are formed. The second empty spaces ET2 are respectively formed between adjacent patterns of the first to third semiconductor patterns SP1, SP2, and SP3.

Referring back to FIGS. 10B and 10E, in an embodiment, the inner spacers IP are formed in the second empty space ET2 on the first NMOSFET region NR1 and the second empty space ET2 on the second NMOSFET region NR2. The inner spacer IP partially fill the second empty space ET2. The inner spacers IP are in contact with the second source/drain pattern SD2 and fourth source/drain pattern SD4.

Referring to FIGS. 11 and 12A to 12F, in an embodiment, the first gate insulating layer GI1 is formed in the first and second empty spaces ET1 and ET2 on the peripheral region PER. The second gate insulating layer GI2 is formed in the first and second empty spaces ET1 and ET2 on the logic cell region LGC. Each of the first and second gate insulating layers GI1 and GI2 surrounds the first to third semiconductor patterns SP1, SP2, and SP3.

In detail, in an embodiment, the insulating layer IL is formed in the first and second empty spaces ET1 and ET2. Thereafter, the high-k dielectric layer HK is formed in the first and second empty spaces ET1 and ET2. The high-k dielectric layer HK is conformally formed. The high-k dielectric layer HK covers the insulating layer IL. The insulating layer IL and the high-k dielectric layer HK on the peripheral region PER constitute the first gate insulating layer GI1. The insulating layer IL and the high-k dielectric layer HK on the logic cell region LGC constitute the second gate insulating layer GI2.

In an embodiment, the first gate electrode GE1 is formed in the first and second empty spaces ET1 and ET2 on the peripheral region PER. The second gate electrode GE2 is formed in the first and second empty spaces ET1 and ET2 on the logic cell region LGC. The first gate electrode GE1 includes the first to third portions PO1, PO2, and PO3 that fill the second empty space ET2 and the fourth portion PO4 that fills the first empty space ET1. The second gate electrode GE2 includes the first to third portions PO1, PO2, and PO3 that fill the second empty space ET2 and the fourth portion PO4 that fills the first empty space ET1. The gate capping pattern GP is formed on each of the first and second gate electrodes GE1 and GE2.

Referring to FIGS. 13 and 14A to 14E, in an embodiment, the second interlayer insulating layer 120 is formed on the first interlayer insulating layer 110. The second interlayer insulating layer 120 is formed of or includes silicon oxide. The active contacts AC are formed that penetrate the second interlayer insulating layer 120 and the first interlayer insulating layer 110 and are electrically connected to the first to fourth source/drain patterns SD1-SD4. The silicide pattern SC is formed between the active contacts AC and each of the first to fourth source/drain patterns SD1-SD4.

In an embodiment, a first mask layer MA1 is formed on the logic cell region LGC. The first mask layer MA1 covers the logic cell region LGC but exposes the peripheral region PER.

In an embodiment, a contact hole HO is formed on the peripheral region PER that penetrates the second interlayer insulating layer 120 and the gate capping pattern GP. The dielectric layer DL is formed in the contact hole HO. The dielectric layer DL is conformally formed. The dielectric layer DL extends along a bottom surface and an inner side surface of the contact hole HO. In an embodiment, the dielectric layer DL is formed using one of an atomic layer deposition (ALD) process or a physical vapor deposition (PVD) process. Thereafter, the first gate contact GC1 is formed that fills the remaining space of the contact hole HO.

Referring back to FIGS. 1 and 2A to 2H, in an embodiment, the first mask layer MA1 is removed, and then, a second mask layer is formed on the peripheral region PER. The second mask layer covers the peripheral region PER but exposes the logic cell region LGC.

In an embodiment, the second gate contact GC2 is formed on the logic cell region LGC and penetrates the second interlayer insulating layer 120 and the gate capping pattern GP.

In an embodiment, the second mask layer is removed, and then, the third interlayer insulating layer 130 is formed on the second interlayer insulating layer 120. The first metal layer M1 is formed in the third interlayer insulating layer 130. Forming the first metal layer M1 includes forming the first interconnection lines IL1 and the first vias VI1. The fourth interlayer insulating layer 140 is formed on the first metal layer M1. The second metal layer M2 is formed in the fourth interlayer insulating layer 140. Forming the second metal layer M2 includes forming the second interconnection lines IL2 and the second vias VI2.

According to an embodiment of the inventive concept, at least one of the interconnection lines IL1 and IL2 in the first and second metal layers M1 and M2 is formed by an EUV lithography process. The EUV lithography process used to form the interconnection lines, i.e., a BEOL process, is substantially the same as that used to form the sacrificial patterns PP. For example, when the first interconnection lines IL1 are formed by an EUV lithography process according to a present embodiment, the minimum pitch between the first interconnection lines IL1 can be less than 45 nm.

Figure 15A:
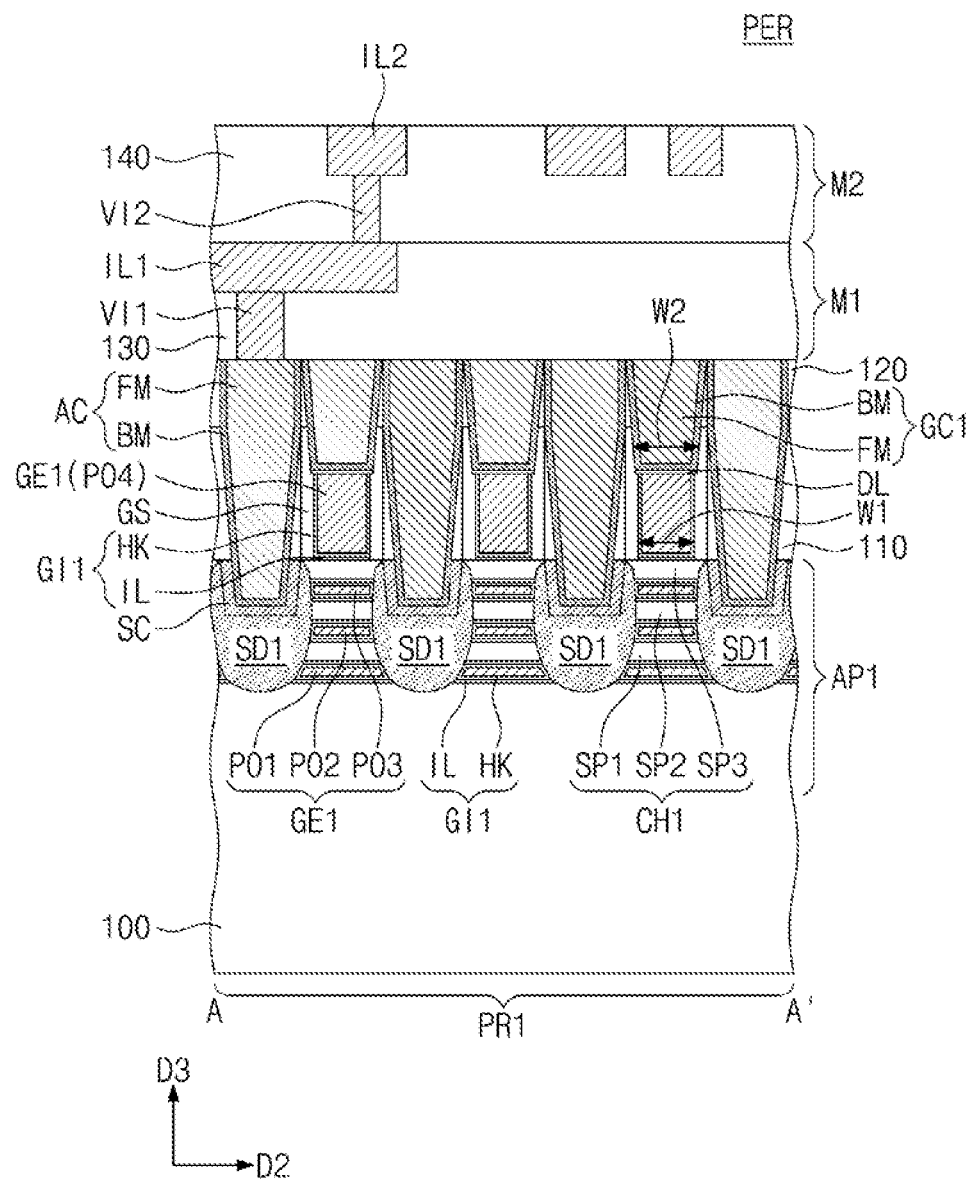
FIGS. 15A, 15B, and 15C are sectional views respectively taken along the lines A-A', B-B', and C-C' of FIG. 1 to illustrate a semiconductor device according to an embodiment of the inventive concept.
Figure 15B:
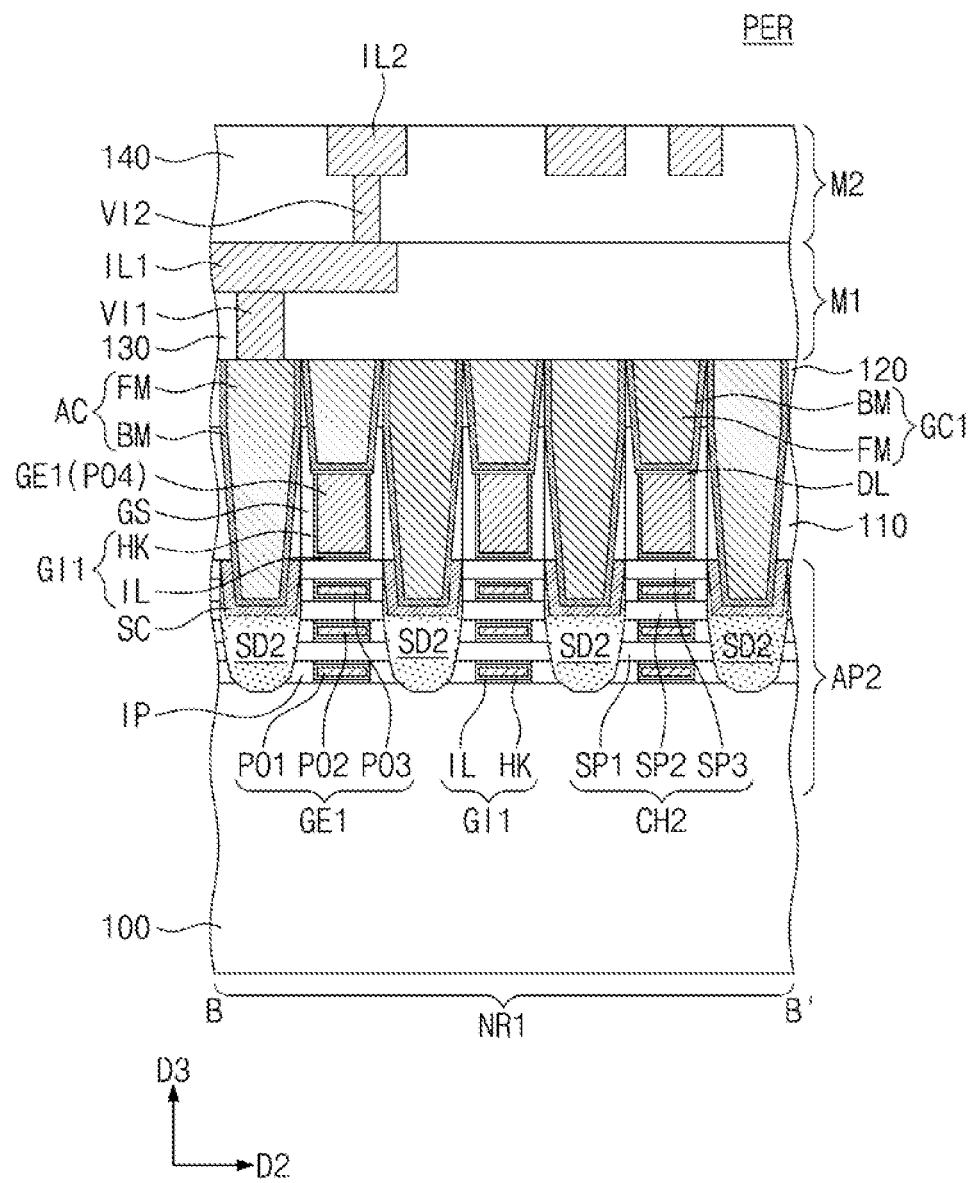
Figure 15C:
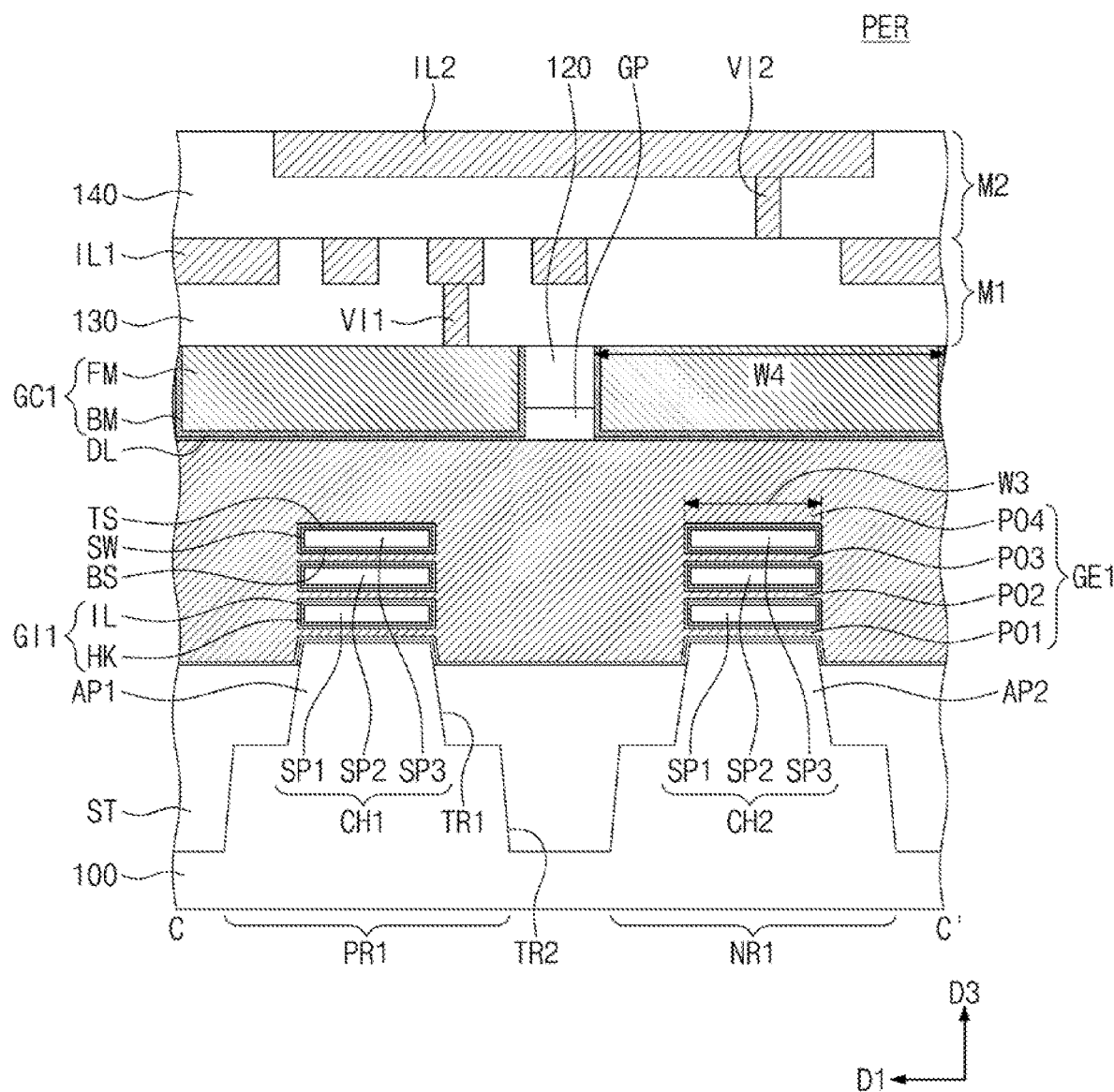

FIGS. 15A, 15B, and 15C are sectional views that are respectively taken along the lines A-A', B-B', and C-C' of FIG. 1 to illustrate a semiconductor device according to an embodiment of the inventive concept. In the following description, an element previously described with reference to FIGS. 1 and 2A to 2H may be identified by the same reference number without repeating an overlapping description thereof.

Referring to FIGS. 15A, 15B, and 15C, in an embodiment, the dielectric layer DL is disposed between the bottom surface of the first gate contact GC1 and the top surface of the first gate electrode GE1, and extends in the first direction D1. The dielectric layer DL does not cover the side surface of the first gate contact GC1. The side surface of the first gate contact GC1 is exposed by the dielectric layer DL. That is, the dielectric layer DL does not extend on the side surface of the first gate contact GC1. The side surface of the first gate contact GC1 is in contact with the second interlayer insulating layer 120, the gate capping pattern GP, and the gate spacer GS.

Figure 16A:
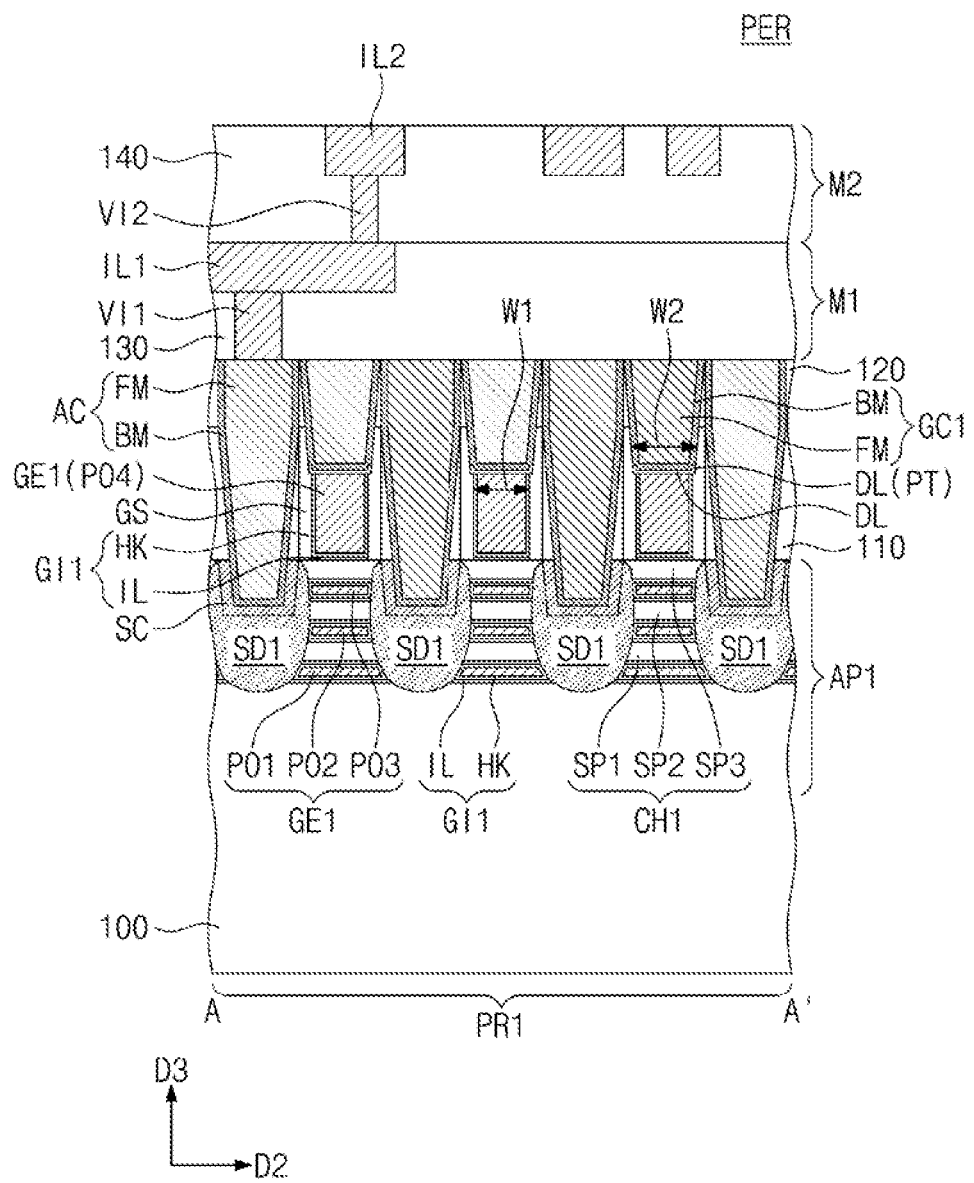
FIGS. 16A, 16B, and 16C are sectional views respectively taken along the lines A-A', B-B', and C-C' of FIG. 1 to illustrate a semiconductor device according to an embodiment of the inventive concept.
Figure 16B:
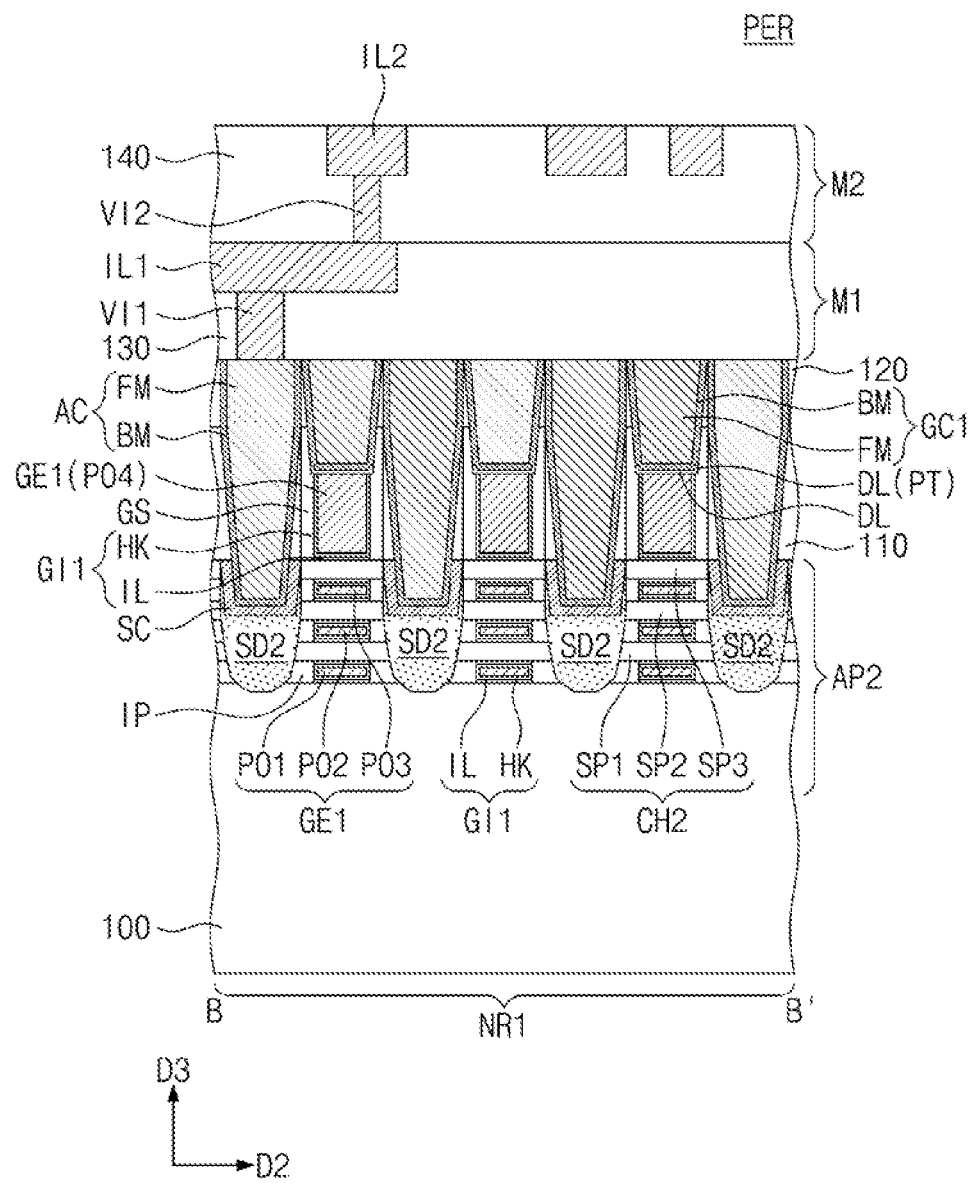
Figure 16C:
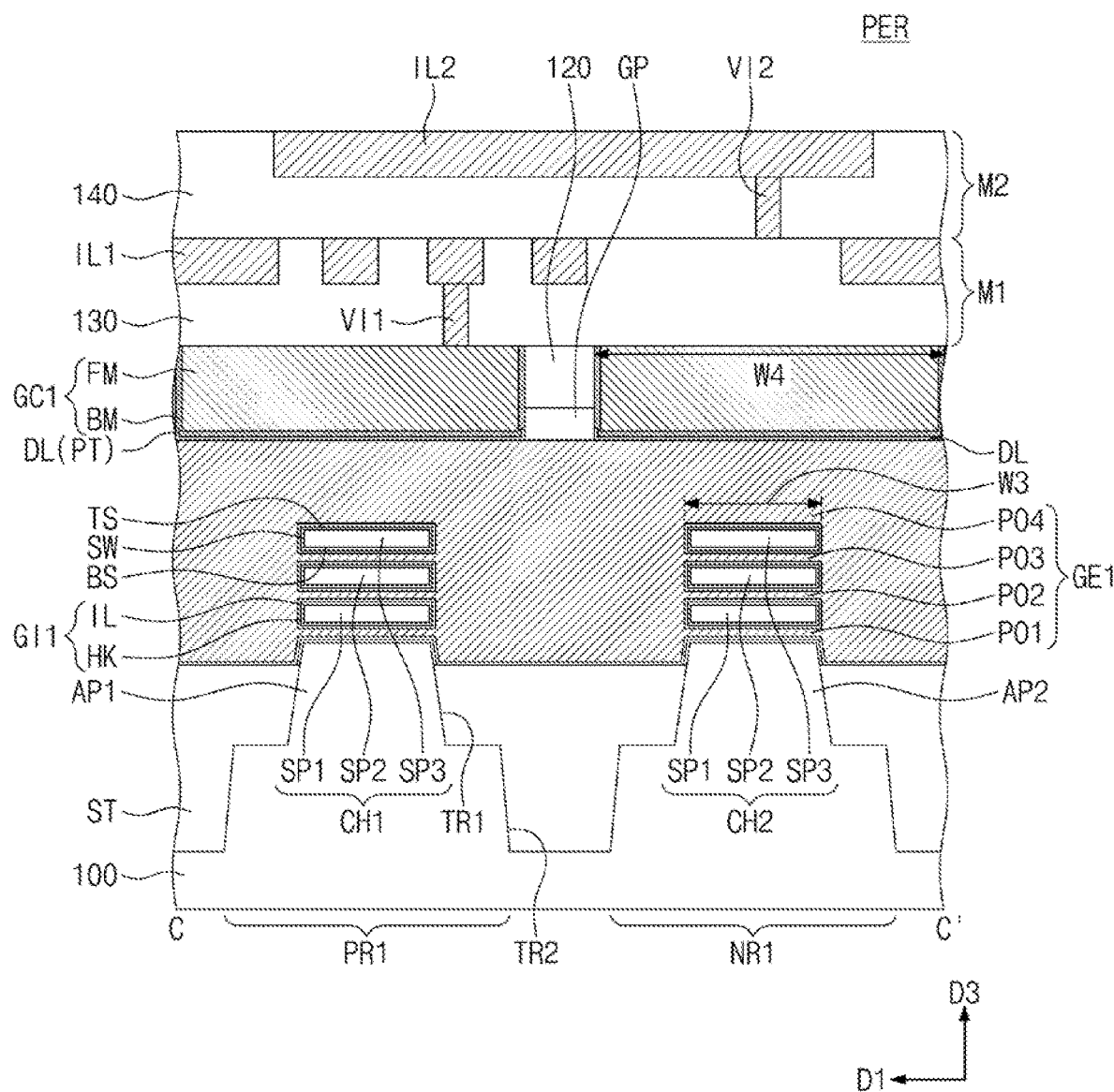

FIGS. 16A, 16B, and 16C are sectional views that are respectively taken along the lines A-A', B-B', and C-C' of FIG. 1 to illustrate a semiconductor device according to an embodiment of the inventive concept. In the following description, an element previously described with reference to FIGS. 1 and 2A to 2H may be identified by the same reference number without repeating an overlapping description thereof.

Referring to FIGS. 16A, 16B, and 16C, in an embodiment, the dielectric layer DL is disposed between the bottom surface of the first gate contact GC1 and the top surface of the first gate electrode GE1 and extends in the first direction D1. The dielectric layer DL includes a protruding portion PT. The protruding portion PT is a portion of the dielectric layer DL that protrudes in a direction normal to the top surface of the substrate 100, i.e., in the third direction D3. The protruding portion PT extends along a portion of the side surface of the first gate contact GC1. The protruding portion PT exposes at least a portion of the side surface of the first gate contact GC1. Thus, the exposed portion of the side surface of the first gate contact GC1 is in contact with the second interlayer insulating layer 120, the gate capping pattern GP, and the gate spacer GS.

Figure 17:
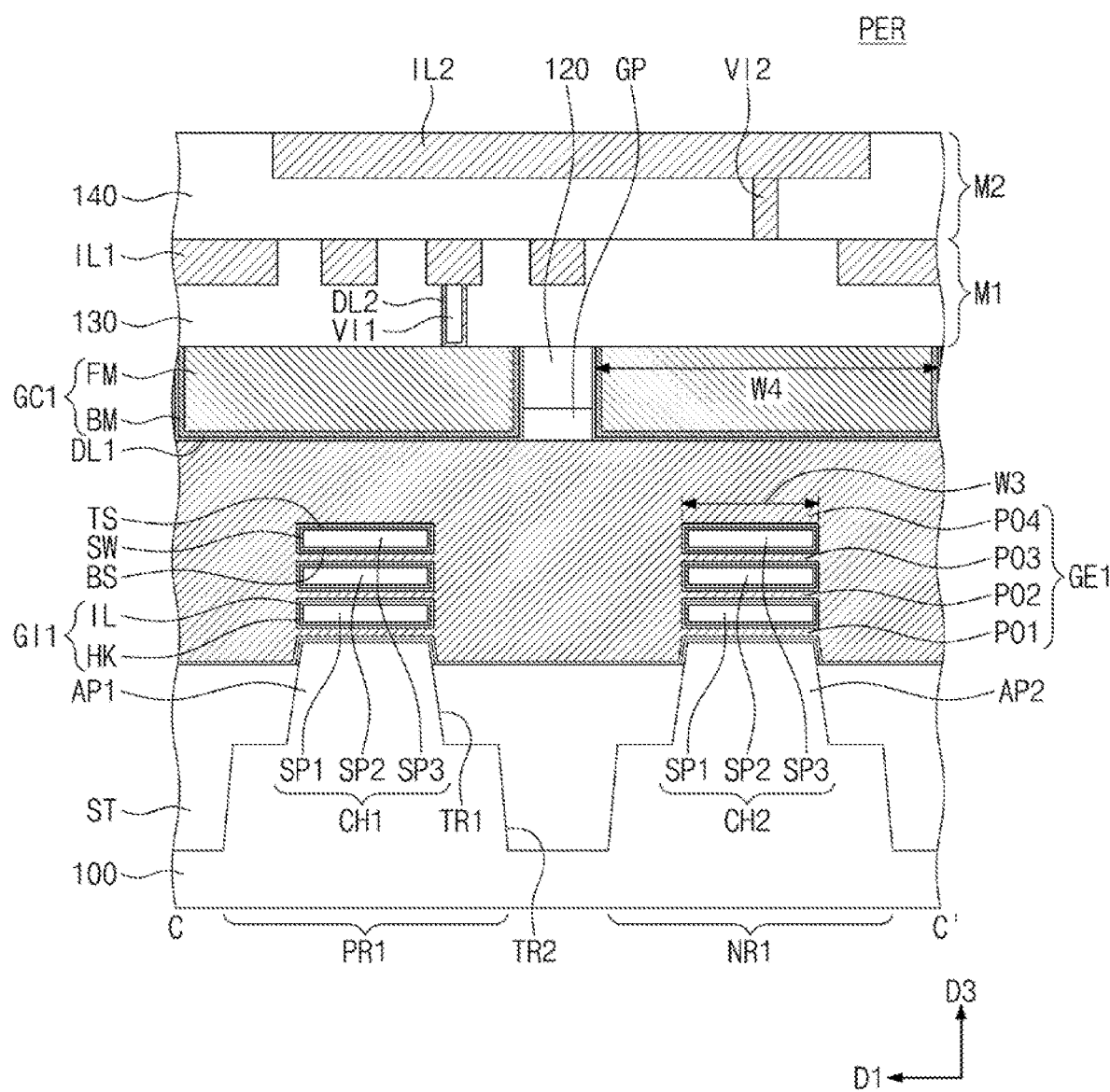
FIG. 17 is a sectional view taken along a line C-C' of FIG. 1 to illustrate a semiconductor device according to an embodiment of the inventive concept.

FIG. 17 is a sectional view which is taken along a line C-C' of FIG. 1 that illustrates a semiconductor device according to an embodiment of the inventive concept. In the following description, an element previously described with reference to FIGS. 1 and 2A to 2H may be identified by the same reference number without repeating an overlapping description thereof.

Referring to FIG. 17, in an embodiment, a first dielectric layer DL1 is interposed between the first gate contact GC1 and the first gate electrode GE1. The first dielectric layer DL1 is interposed between the bottom surface of the first gate contact GC1 and the top surface of the first gate electrode GE1 and extends in the first direction D1. The first dielectric layer DL1 has substantially the same features as the dielectric layer DL described with reference to FIGS. 1 and 2A to 2H.

In an embodiment, a second dielectric layer DL2 is interposed between the first via VI1 and the first gate contact GC1. The first gate contact GC1 is spaced apart from the first via VI1 by the second dielectric layer DL2. In an embodiment, the second dielectric layer DL2 covers bottom and side surfaces of the first via VI1. In another embodiment, the second dielectric layer DL2 does not extend to the side surface of the first via VI1, as described with reference to FIGS. 15A, 15B, and 15C. Alternatively, in another embodiment, the second dielectric layer DL2 includes the protruding portion PT described with reference to FIGS. 16A, 16B, and 16C.

In an embodiment, the second dielectric layer DL2 is formed of or includes a high-k dielectric material whose dielectric constant is higher than that of silicon oxide. For example, the second dielectric layer DL2 is formed of or includes the same material as the first dielectric layer DL1.

In an embodiment, since the second dielectric layer DL2 is disposed between the first via VI1 and the first gate contact GC1, a voltage applied between the first gate electrode GE1 and the substrate 100 can be reduced. Accordingly, reliability issues can be prevented from occurring in a high-power transistor formed on the peripheral region PER. As a result, the electrical and reliability characteristics of the semiconductor device can be improved.

Figure 18:
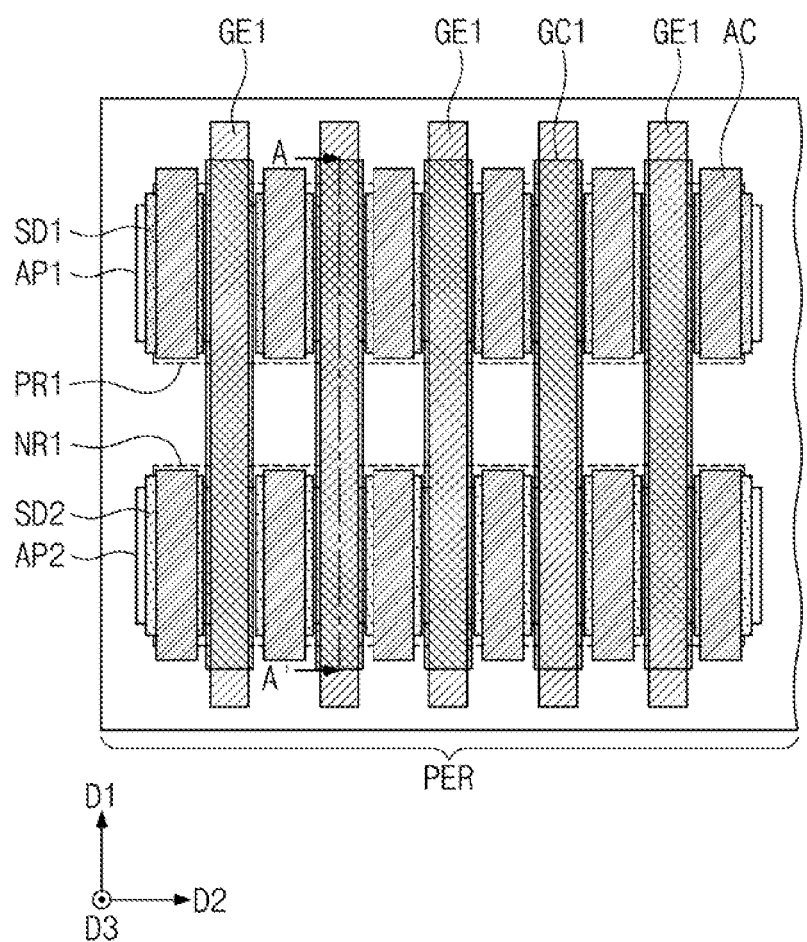
FIG. 18 is a plan view of a semiconductor device according to an embodiment of the inventive concept.
Figure 19:
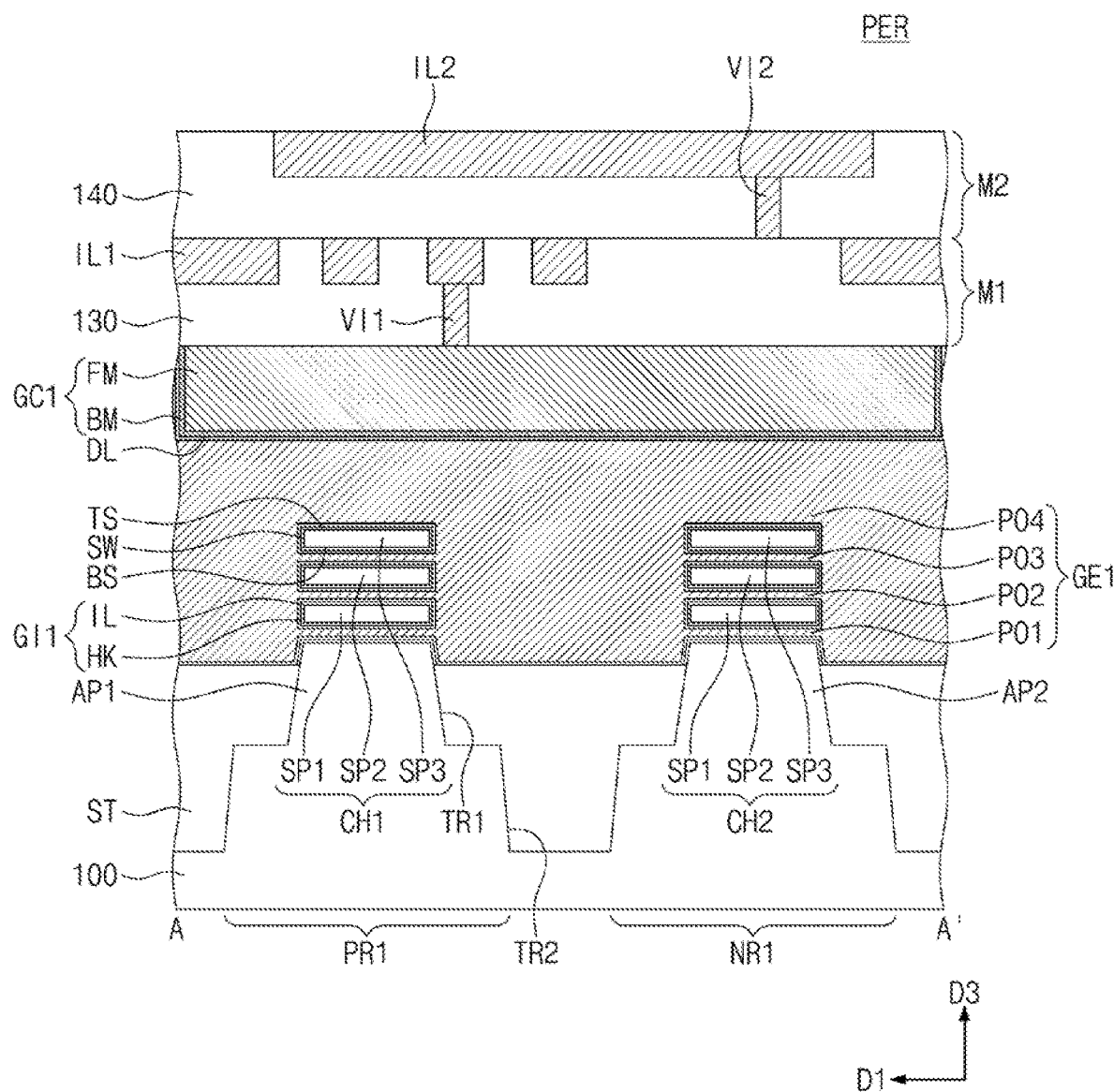
FIG. 19 is a sectional view taken along a line A-A' of FIG. 18.

FIG. 18 is a plan view of a semiconductor device according to an embodiment of the inventive concept. FIG. 19 is a sectional view taken along a line A-A' of FIG. 18. In the following description, an element previously described with reference to FIGS. 1 and 2A to 2H may be identified by the same reference number without repeating an overlapping description thereof.

Referring to FIGS. 18 and 19, in an embodiment, the first gate contact GC1 extends from the first PMOSFET region PR1 to the first NMOSFET region NR1. The first gate contact GC1 crosses the device isolation layer ST between the first active pattern AP1 and the second active pattern AP2. The dielectric layer DL also extends from the first PMOSFET region PR1 to the first NMOSFET region NR1.

In an embodiment, widths of the first gate contact GC1 and the dielectric layer DL can be adjusted to reduce or maintain a voltage applied to a transistor.

Figure 20:
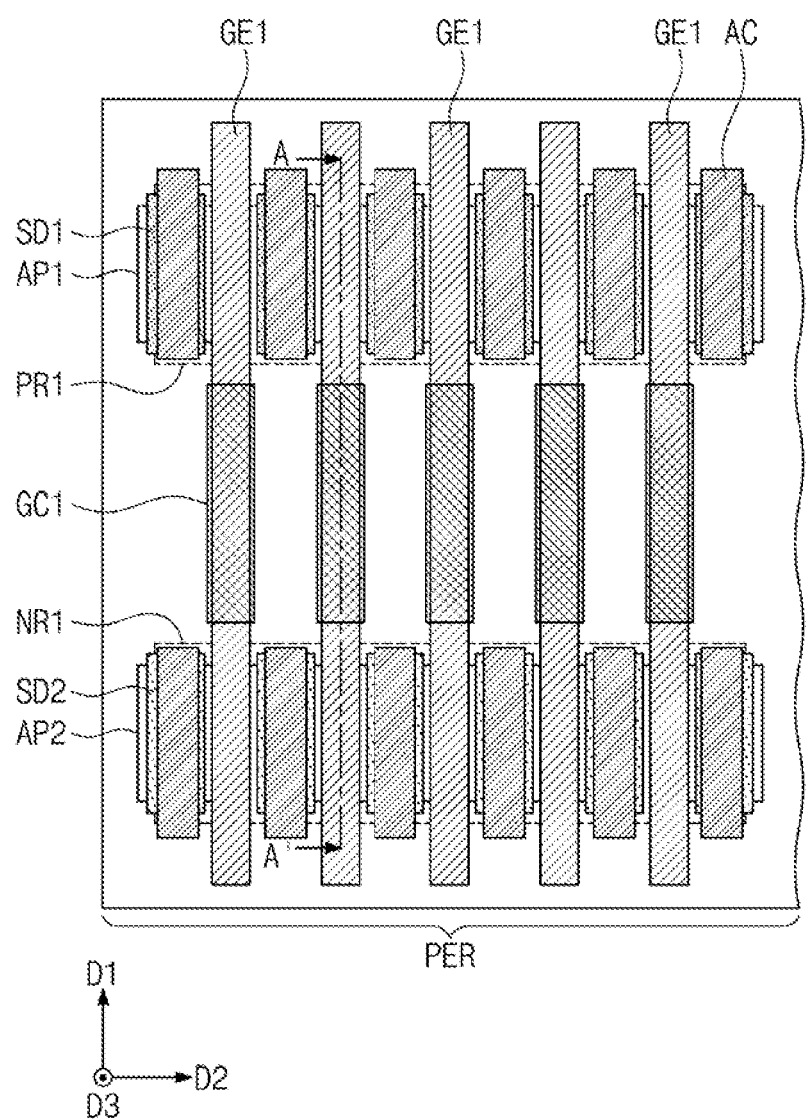
FIG. 20 is a plan view of a semiconductor device according to an embodiment of the inventive concept.
Figure 21:
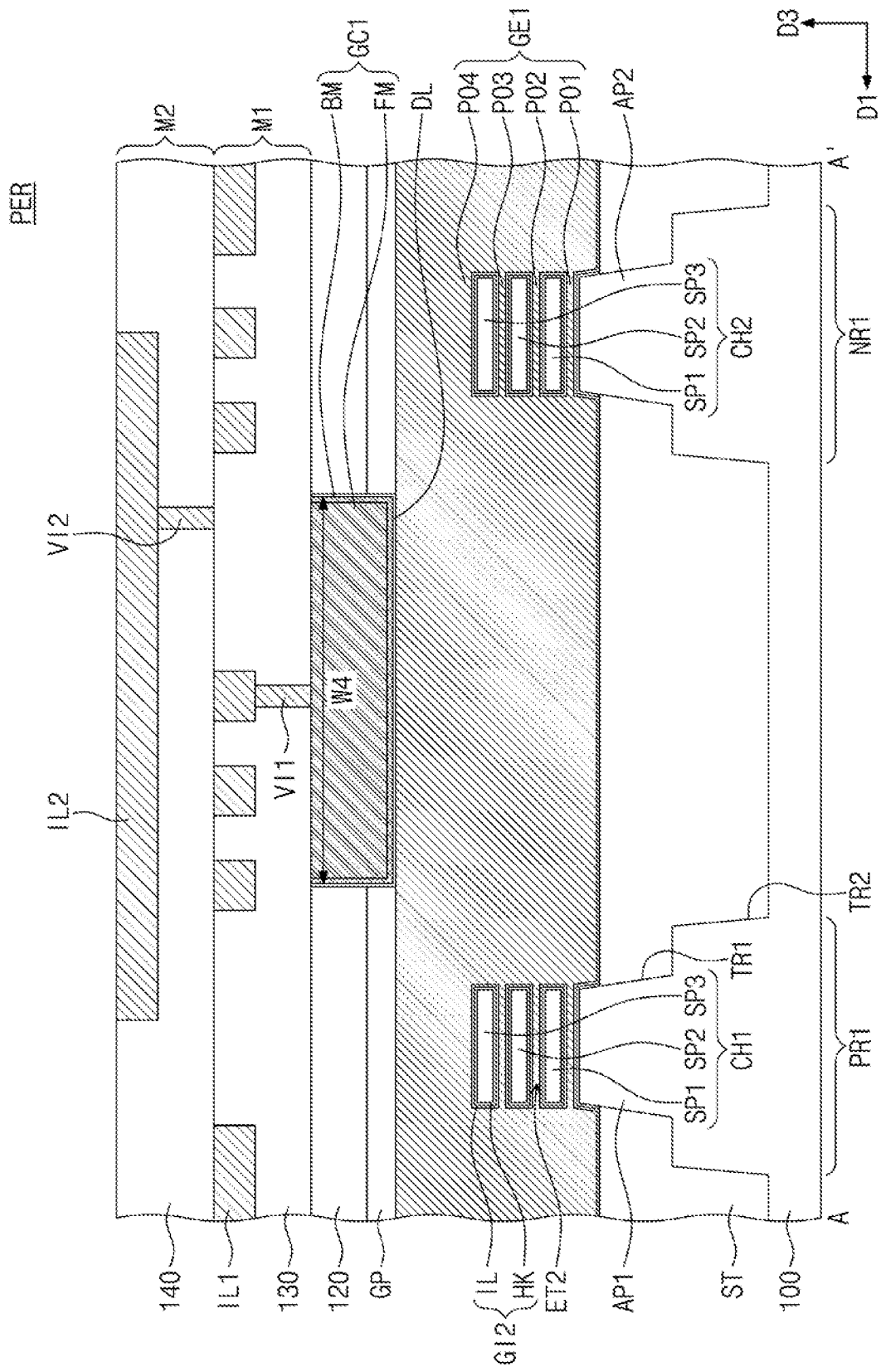
FIG. 21 is a sectional view taken along a line A-A' of FIG. 20.

FIG. 20 is a plan view of a semiconductor device according to an embodiment of the inventive concept. FIG. 21 is a sectional view taken along a line A-A' of FIG. 20. In the following description, an element previously described with reference to FIGS. 1 and 2A to 2H may be identified by the same reference number without repeating an overlapping description thereof.

Referring to FIGS. 20 and 21, in an embodiment, the first gate contact GC1 is disposed on the device isolation layer ST between the first active pattern AP1 and the second active pattern AP2. The first gate contact GC1 is horizontally offset in the first direction D1 from the first channel pattern CH1 and the second channel pattern CH2. Let the third width W3 (see, e.g., FIG. 2C) be a width of the channel pattern CH1 and/or CH2 in the first direction D1. Let the fourth width W4 be a width of the first gate contact GC1 in the first direction D1. In an embodiment, the fourth width W4 is greater than the third width W3.

According to an embodiment of the inventive concept, a semiconductor device includes a dielectric layer that is disposed on a peripheral region and is interposed between a gate electrode and a gate contact. Thus, for a three-dimensional field effect transistor, a thickness of a gate insulating layer may not be increased, but a voltage applied between the gate electrode and a substrate can be reduced. As a result, electrical and reliability characteristics of a semiconductor device can be improved.

While embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate that includes a peripheral region and a logic cell region;
a first active pattern disposed on the peripheral region;
a first source/drain pattern disposed on the first active pattern;
a first channel pattern formed on the first active pattern and connected to the first source/drain pattern, wherein the first channel pattern includes semiconductor patterns that are stacked and spaced apart from each other;
a first gate electrode that extends in a first direction and crosses the first channel pattern;
a gate insulating layer interposed between the first gate electrode and the first channel pattern;
a first gate contact disposed on the first gate electrode and that extends in the first direction;
a first dielectric layer interposed between the first gate electrode and the first gate contact such that the first gate electrode and the first gate contact are electrically insulated from each other by the first dielectric layer;
a third active pattern and a fourth active pattern that are disposed on the logic cell region and are spaced apart from each other in the first direction;
a third source/drain pattern and a fourth source/drain pattern disposed on the third and fourth active patterns, respectively;
a third channel pattern and a fourth channel pattern disposed on the third and fourth active patterns, respectively, and connected to the third and fourth source/drain patterns, respectively, wherein each of the third and fourth channel patterns includes semiconductor patterns that are stacked and spaced apart from each other,
a second gate electrode that extends in the first direction and crosses the third and fourth channel patterns; and
a second gate contact electrically connected to the second gate electrode,
wherein the first dielectric layer is interposed between a bottom surface of the first gate contact and a top surface of the first gate electrode and extends in the first direction.

2. The semiconductor device of claim 1, wherein a largest width of the first dielectric layer in a second direction that crosses the first direction is greater than a smallest width of the first gate electrode in the second direction.

3. The semiconductor device of claim 1, wherein the first dielectric layer covers bottom and side surfaces of the first gate contact.

4. The semiconductor device of claim 1, wherein the first dielectric layer comprises a protruding portion that protrudes in a direction perpendicular to a top surface of the substrate, and
the protruding portion extends along a portion of a side surface of the first gate contact.

5. The semiconductor device of claim 1, further comprising:
a first metal layer disposed on the first gate electrode, wherein the first metal layer includes an interconnection line and a via between the interconnection line and the first gate contact; and
a second dielectric layer interposed between the first gate contact and the via.

6. The semiconductor device of claim 1, wherein a width of the first gate contact in the first direction is greater than a width of the first channel pattern in the first direction.

7. The semiconductor device of claim 1, further comprising:
a second active pattern disposed on the peripheral region and spaced apart from the first active pattern in the first direction;
a second source/drain pattern disposed on the second active pattern; and
a second channel pattern formed on the second active pattern and connected to the second source/drain pattern,
wherein the second channel pattern includes semiconductor patterns that are stacked and spaced apart from each other, and
the first gate electrode extends across the second channel pattern.

8. The semiconductor device of claim 7, wherein the first gate contact extends across the first channel pattern and the second channel pattern.

9. The semiconductor device of claim 7, further comprising a device isolation layer that separates the first and second active patterns,
wherein the first gate contact is disposed on the device isolation layer between the first and second active patterns.

10. The semiconductor device of claim 1, wherein the first channel pattern vertically overlaps the first gate contact.

11. The semiconductor device of claim 1, further comprising:
a third active pattern disposed on the peripheral region and that is spaced apart from the first active pattern in the first direction;
a third source/drain pattern disposed on the third active pattern; and
a third channel pattern formed on the third active pattern and connected to the third source/drain pattern,
wherein the first gate electrode extends across the third channel pattern, and
the first gate contact extends across the first and third channel patterns.

12. A semiconductor device, comprising:
a substrate that includes a peripheral region and a logic cell region;
a first active pattern disposed on the peripheral region;
a first source/drain pattern disposed on the first active pattern;
a first channel pattern formed on the first active pattern and connected to the first source/drain pattern, wherein the first channel pattern includes semiconductor patterns that are stacked and spaced apart from each other;
a first gate electrode that extends in a first direction and crosses the first channel pattern;
a gate insulating layer interposed between the first gate electrode and the first channel pattern;
a first gate contact disposed on the first gate electrode and that extends in the first direction;
a first dielectric layer interposed between the first gate electrode and the first gate contact;
a third active pattern and a fourth active pattern that are disposed on the logic cell region and are spaced apart from each other in the first direction;
a third source/drain pattern and a fourth source/drain pattern disposed on the third and fourth active patterns, respectively;
a third channel pattern and a fourth channel pattern formed on the third and fourth active patterns, respectively, and are connected to the third and fourth source/drain patterns, respectively, wherein each of the third and fourth channel patterns includes semiconductor patterns that are stacked and spaced apart from each other;
a second gate electrode that extends in the first direction and crosses the third and fourth channel patterns; and
a second gate contact electrically connected to the second gate electrode,
wherein the first dielectric layer is interposed between a bottom surface of the first gate contact and a top surface of the first gate electrode and extends in the first direction.

13. The semiconductor device of claim 12, wherein a largest width of the first dielectric layer in a second direction that crosses the first direction is greater than a smallest width of the first gate electrode in the second direction.

14. The semiconductor device of claim 12, wherein the first dielectric layer covers bottom and side surfaces of the first gate contact.

15. The semiconductor device of claim 12, wherein the first dielectric layer comprises a protruding portion that protrudes in a direction perpendicular to a top surface of the substrate, and
the protruding portion extends along a portion of a side surface of the first gate contact.

16. The semiconductor device of claim 12, further comprising:
a first metal layer disposed on the first gate electrode, wherein the first metal layer includes an interconnection line and a via between the interconnection line and the first gate contact; and
a second dielectric layer interposed between the first gate contact and the via.

17. The semiconductor device of claim 12, wherein a width of the first gate contact in the first direction is greater than a width of the first channel pattern in the first direction.

18. The semiconductor device of claim 12, further comprising:
a second active pattern disposed on the peripheral region and spaced apart from the first active pattern in the first direction;
a second source/drain pattern disposed on the second active pattern; and
a second channel pattern formed on the second active pattern and connected to the second source/drain pattern,
wherein the second channel pattern includes semiconductor patterns that are stacked and spaced apart from each other, and
the first gate electrode extends across the second channel pattern.

19. The semiconductor device of claim 18, wherein the first gate contact extends across the first channel pattern and the second channel pattern.

20. The semiconductor device of claim 18, further comprising a device isolation layer that separates the first and second active patterns,
wherein the first gate contact is disposed on the device isolation layer between the first and second active patterns.

* * * * *